(12) United States Patent
Liebel et al.

(10) Patent No.: US 11,678,097 B2
(45) Date of Patent: Jun. 13, 2023

(54) SMART INTERCOM STATIONS FOR LEGACY INTERCOM SYSTEMS

(71) Applicant: Buzr Labs, Inc., New York, NY (US)

(72) Inventors: Hartmut A. Liebel, New York, NY (US); Jeremy D. Walker, New York, NY (US)

(73) Assignee: Buzr Labs, Inc., New York, NY (US)

( * ) Notice: Subject to any disclaimer, the term of this patent is extended or adjusted under 35 U.S.C. 154(b) by 0 days.

(21) Appl. No.: 17/749,008

(22) Filed: May 19, 2022

(65) Prior Publication Data

US 2022/0279260 A1 Sep. 1, 2022

Related U.S. Application Data

(63) Continuation of application No. PCT/US2022/011290, filed on Jan. 5, 2022.

(60) Provisional application No. 63/134,610, filed on Jan. 7, 2021.

(51) Int. Cl.
| | |
|---|---|
| H04M 1/60 | (2006.01) |
| H04M 9/00 | (2006.01) |
| H04R 1/08 | (2006.01) |
| G06F 3/16 | (2006.01) |
| H02H 9/04 | (2006.01) |
| H04R 1/02 | (2006.01) |
| H04R 3/00 | (2006.01) |
| H04R 3/04 | (2006.01) |
| H03F 3/45 | (2006.01) |

(52) U.S. Cl.
CPC ............... *H04R 1/08* (2013.01); *G06F 3/165* (2013.01); *H02H 9/046* (2013.01); *H04R 1/025* (2013.01); *H04R 3/007* (2013.01); *H04R 3/04* (2013.01); *H03F 3/45475* (2013.01); *H03F 2200/03* (2013.01)

(58) Field of Classification Search
CPC ........... H04R 1/08; H04R 1/025; G06F 3/165; H02H 9/046
See application file for complete search history.

(56) References Cited

U.S. PATENT DOCUMENTS

| | | | |
|---|---|---|---|
| 4,996,709 A | 2/1991 | Heep et al. | |
| 5,315,639 A | 5/1994 | Lassers | |
| 9,936,442 B1* | 4/2018 | Noonan | ................... C10G 2/34 |
| 11,304,123 B1* | 4/2022 | Noonan | ................ H04W 48/16 |

(Continued)

*Primary Examiner* — Simon King
(74) *Attorney, Agent, or Firm* — American Patent Agency PC; Daniar Hussain; Stephen M. Hou

(57) ABSTRACT

Smart buzzer systems for apartment buildings, where an intercom station in an apartment unit notifies the user of a request from a guest to unlock the building's door, sends the user's approval of the request to the door, and enables the user and the guest to talk to each other, are disclosed. The smart buzzer systems are enhanced with connectivity with mobile devices and mobile applications as well as automation. The intercom station includes an audio input-output circuit configured to process audio signals, which includes a line input buffer configured to process audio signals from a legacy base microphone through a wiring interface for a legacy intercom system to a processor and a line output driver configured to process audio signals from the processor to the legacy base speaker through the wiring interface for the legacy intercom system.

20 Claims, 44 Drawing Sheets

(56) References Cited

U.S. PATENT DOCUMENTS

| | | | |
|---|---|---|---|
| 2005/0125083 A1* | 6/2005 | Kiko | H04L 12/282 700/20 |
| 2006/0045063 A1* | 3/2006 | Stanford | H04B 7/2643 370/345 |
| 2012/0161947 A1 | 6/2012 | Lee et al. | |
| 2017/0214968 A1 | 7/2017 | Braithwaite et al. | |
| 2019/0387104 A1* | 12/2019 | Yssa | G07C 9/00309 |

* cited by examiner ns of the plurality of windings of the second transformer is greater than a resistance of a legacy station speaker.

In some embodiments, the second transformer supports a signal range of 200 Hz to 4,000 Hz.

In some embodiments, the line input buffer further includes a voltage-limiting subcircuit coupled to the first voltage buffer, and the voltage-limiting subcircuit limits an input to the first voltage buffer to within a predefined threshold.

In some embodiments, the voltage-limiting subcircuit includes a Schottky barrier diode.

In some embodiments, the intercom station apparatus is configured to interact with a base and a backend cloud-computing service (CCS).

In various embodiments, the intercom station apparatus connects to a legacy intercom system, and includes a station audio emission subsystem configured to emit a first audio signal; a station audio reception subsystem configured to receive a second audio signal; a talk feature configured to activate the station audio reception subsystem and a legacy base speaker; a listen feature configured to activate a legacy base microphone and the audio emission subsystem; a wiring interface for the legacy intercom system; a processor configured to interact with and control the station audio emission subsystem and the station audio reception subsystem; and an audio input-output circuit configured to process audio signals, including: a line input buffer configured to process audio signals from the legacy base microphone through the wiring interface for the legacy intercom system to the processor, including: a first galvanic isolator and voltage scaler subcircuit configured to receive a first input signal from the wiring interface for a legacy intercom system; and a first voltage buffer coupled to the first galvanic isolator and voltage scaler subcircuit, wherein the first voltage buffer is configured to transmit a first output signal to the processor; and a line output driver configured to process audio signals from the processor to the legacy base speaker through the wiring interface for the legacy intercom system, including: a second voltage buffer configured to receive a second input signal from the processor; a high-pass filter coupled to the second voltage buffer; and a second galvanic isolator and voltage scaler subcircuit coupled to the high-pass filter and configured to transmit a second output signal to the wiring interface for the legacy intercom system.

Other aspects and embodiments of the present invention include the methods and processes comprising the steps described herein, and also include the processes and modes of operation of the systems and devices described herein.

Yet other aspects and embodiments of the present invention will become apparent from the detailed description of the invention when read in conjunction with the attached drawings.

BRIEF DESCRIPTION OF THE DRAWINGS

Embodiments of the present invention described herein are exemplary, and not restrictive. Embodiments will now be described, by way of examples, with reference to the accompanying drawings, in which.

DETAILED DESCRIPTION OF THE INVENTION

With reference to the figures provided, embodiments of the present invention are now described in detail.

In the following description, for purposes of explanation, numerous specific details are set forth in order to provide a thorough understanding of the invention. It will be apparent, however, to one skilled in the art that the invention can be practiced without these specific details. In other instances, structures, devices, activities, and methods are shown using schematics, use cases, and/or flow diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Overall Intercom System and Integration with Legacy Functionality

Figure 1A:
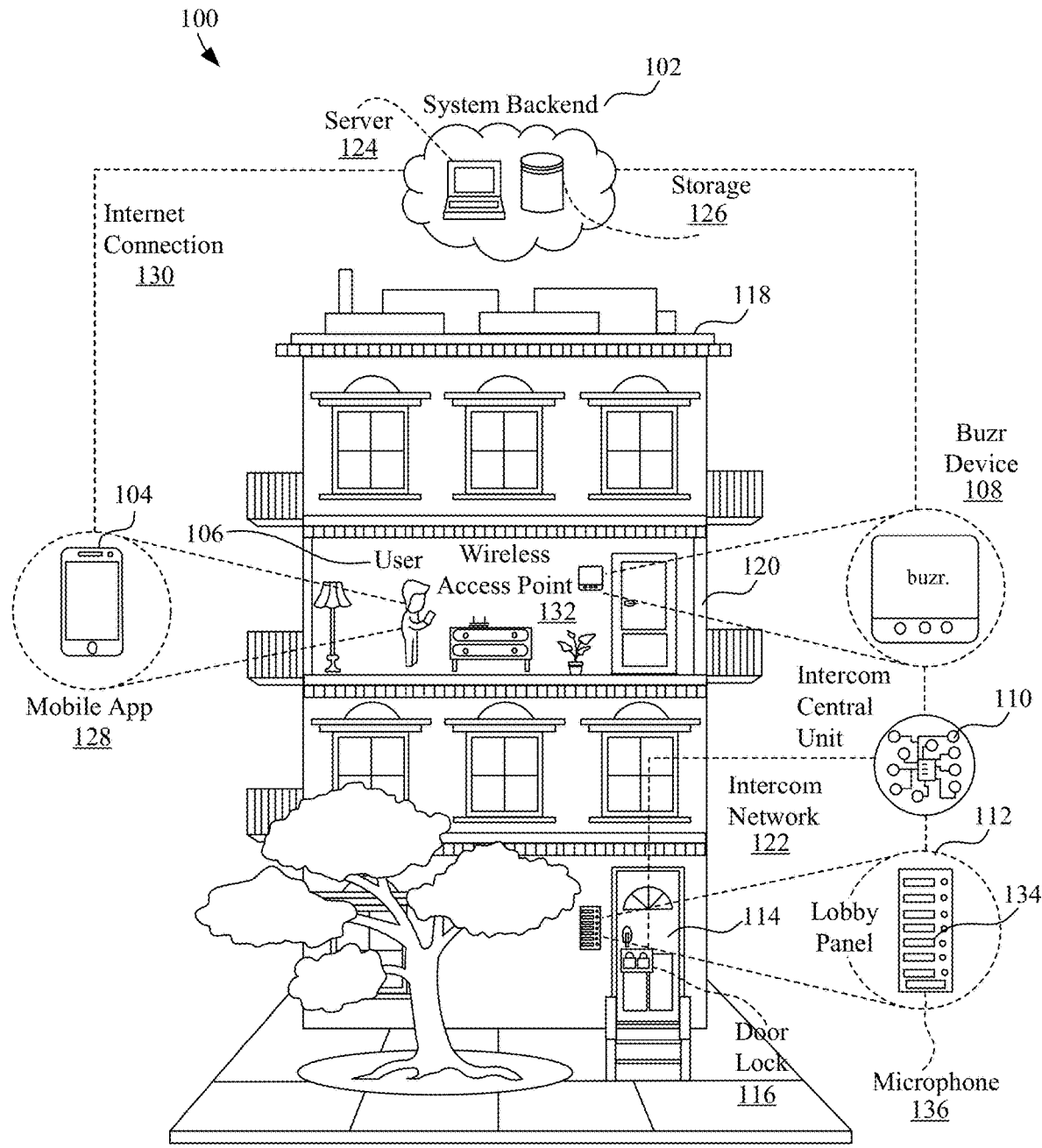
FIG. 1A shows an overall view of an exemplary intercom station within an exemplary legacy intercom system, in accordance with some embodiments of the invention.

FIG. 1A shows an overall view of an exemplary intercom station 108 within an exemplary legacy intercom system 100, in accordance with some embodiments of the invention. The legacy intercom system 100 controls the unlocking of a door 114 (e.g., the lobby door) or a gate of a building 118 that comprises one or more units. In some embodiments, these one or more units are apartment units. In some embodiments, the building includes both a gate and a door, multiple doors, a combination of gates and doors, where an outside guest must pass through several such barriers to gain entry into the building. The intercom station 108 (e.g., a "Buzr device") is located in a user's apartment unit 120. The intercom station 108 as disclosed replaces, modifies, or supplements a conventional apartment unit intercom station and is compatible with existing legacy hardware and wiring. In some embodiments, the intercom station 108 is battery-powered so that its operation does not depend on an external power source.

An intercom central unit (ICU) 110 acts as a central processing unit for the intercom system 100; it is connected via an intercom network 122 to the intercom station 108, a lobby panel 112, and a door lock 116. The lobby panel 112 is near the door, accessible to a person (e.g., a guest) seeking entry via the door 114. The door lock 116 is an electromechanical device (e.g., a solenoid bolt) that locks or unlocks the door 114 in response to a signal from the ICU 110. In some embodiments, the intercom network 122 is wired. In other embodiments, one or more connections within the intercom network 122 is wireless (e.g., Wi-Fi, Bluetooth). In some embodiments, the intercom system 100 further comprises a system backend 102, which comprises a server 124 and a data storage medium 126. The system backend 102 enables the intercom station 108 to interact with a mobile device 104 running a mobile application 128 ("mobile app" or simply "app") directed to the intercom station 108. In some embodiments, the mobile app 128 is accessible by a user 106 who manages the intercom station 108 or a guest seeking entry into the building 118. In some embodiments, the system backend 102 connects to the intercom station 108 and to the mobile device 104 via the Internet 130. In some embodiments, the intercom station 108 connects to the Internet 130 via a wireless access point 132 in the building 118 or in the user's apartment unit 120 specifically. In other embodiments, the intercom station 108 connects to the Internet 130 via a wired connection (e.g., an Ethernet cable). In some embodiments, instead of or in addition to a system backend 102, the intercom system 100 further comprises a local server or a local device. In such embodiments, the local server or a local device may perform similar features as described herein regarding the system backend 102.

The lobby panel 112 performs several functions for interfacing with a guest seeking entry into the building 118 via the door 114. In some embodiments, the lobby panel 112 comprises a set of doorbells 134, with each doorbell corresponding to an apartment unit in the building. In some embodiments, the lobby panel 112 comprises a microphone 136 configured to receive a guest's voice and an audio speaker configured to generate sound to be heard by the guest. In some embodiments, the microphone 136 and the audio speaker are the same electronic device. The intercom station 108 performs several functions for interfacing with a user 106, the system backend 102, and the mobile app 128. In some embodiments, the intercom station 108 comprises a "door" (or "unlock") button. In some embodiments, the intercom station 108 further comprises a station audio emission subsystem configured to emit a first audio signal and a station audio reception subsystem configured to receive a second audio signal. In some embodiments, the station audio emission subsystem is an audio speaker, the first audio signal is a sound (e.g., a sound to be heard by the user), the station audio reception subsystem is a microphone, and the second audio signal is a second (e.g., the user's voice). In other embodiments, the station audio emission subsystem and the station audio reception subsystem are electronic systems that relay audio information to and from a system backend, a local service, or a local device. In such embodiments, the first audio signal and the second audio signal are digital signals.

In some embodiments, the intercom station 108 further comprises a "listen" feature configured to activate the microphone of the lobby panel and to activate the speaker of the intercom station 108, and a "talk" feature configured to activate the microphone of the intercom station 108 and to activate the speaker of the lobby panel 134. In some embodiments, intercom station 108 does not include a microphone configured to receive a user's voice nor an audio speaker configured to generate sound to be heard by the user, in which case all audio communication is relayed between the lobby panel and a system backend, a local service, or a local device. In such embodiments, the "talk" feature may not activate a microphone of the intercom station 108, but may instead initiate communication with a guest via other means (e.g., the user speaks into a mobile device, the backend sends a pre-recorded message); and the "listen" feature may not activate a speaker of the intercom station 108, but may instead initiate storing or relaying the audio signal from the speaker of the lobby panel 134.

In some embodiments, the "listen" feature is a "listen" button, and the "talk" feature is a "talk" button. In some embodiments, the "talk" feature and the "listen" feature are implemented as a single button that turns on (or off) the two-way audio system. In some embodiments, the "talk" feature and the "listen" feature are implemented as a handset at one or both ends, which, after being picked up, allows the user 106 and the guest to speak to one another as if speaking over a telephone. For convenience, the legacy intercom station and/or the intercom station may be described herein with reference to a "listen" button and a "talk" button, but alternative embodiments that include implementing the "listen" feature and the "talk" feature in other ways would be apparent to those skilled in the art.

In some embodiments, the lobby panel 112 includes a video camera or a still camera, which permits a user to see the guest on a video screen on or near the intercom station 108. In some embodiments, the video camera is always on. In some embodiments, the video camera may be activated by nearby motion or other stimuli. In some embodiments, the video camera may be activated by a "watch" feature on the intercom station 108. In other embodiments, the video camera may be activated whenever the "listen" or "talk" features are activated, e.g., buttons are pressed or held down.

In some embodiments, the door 114 may be manually unlocked via a physical key. In some embodiments, the door 114 is by default locked whenever the door 114 is closed. The intercom station 108 enables a guest to unlock the door 114 without a physical key for the door 114 nor another person personally opening the door 114 from the other side. When a guest outside the door 114 requests unlocking the door 114, he or she activates ("rings") a doorbell 134 on the lobby panel 112 that corresponds to the guest's target apartment unit. When the doorbell 134 is activated, the lobby panel 112 sends the unlocking request as a signal to the ICU 110, which relays it to the intercom station 108 in the target apartment unit. In some embodiments, the intercom station 108 notifies the user 106 that an unlock request has been sent. The notification may be, for example, a doorbell ring that is audible throughout the apartment unit 120 to alert the user 106. In other embodiments, the notification is a visual cue (e.g., flashing light), which may be helpful for users with auditory disabilities. The user 106 may approve of the unlocking request by activating the "door" button on the intercom station 108, which sends the unlocking approval as a signal to the ICU 110, which sends a request to the door lock 116 to unlock the door 114. As typical door locks generate a buzzing sound when the door 114 is unlocked, this process is colloquially referred to as "buzzing" a person into a building. In some embodiments, the "door" button supports the unlocking of the door 114 without an unlock request sent by a guest.

In some embodiments, the intercom system 108 enables the user 106 and the guest to speak to each other via audio conferencing. In some embodiments, the user 106 and the guest interaction is further enhanced with video conferencing. These features are useful for the user to confirm the identity of the guest before buzzing the guest into the building 118, for example. When the intercom station 108 notifies the user 106 that an unlock request has been sent, the user 106 has the option of activating the microphone of the intercom station 108 and the speaker of the lobby panel 112, but not the speaker of the intercom station 108 nor the microphone of the lobby panel 112, by pressing and holding down the "talk" button. Once these devices are activated, the user 106 may speak to the guest at the lobby. When the user 106 releases the "talk" button, the microphone of the intercom station 108 and the speaker of the lobby panel 112 are deactivated, and the user 106 may no longer speak to the guest. In some embodiments, the intercom system 108 enables the user 106 to passively listen to sounds in the lobby, including the guest's voice, by pressing and holding down the "listen" button, which activates the microphone of the lobby panel 112 and the speaker of the intercom station 108, but not the speaker of the lobby panel 112 nor the microphone of the intercom station 108. Once these devices are activated, the guest in the lobby may speak to the user 106. When the user 106 releases the "listen" button, the microphone 136 of the lobby panel 112 and the speaker of the intercom station 108 are deactivated, and guest user may no longer speak to the user 106. In some embodiments, multiple apartment units may simultaneously activate the "listen" function without interference. By alternately pressing the "talk" and the "listen" buttons, the user 106 may conduct a conversation with a guest at the lobby.

In alternative embodiments, the intercom system 108 enables the user 106 and the guest to speak to each other via audio conferencing without the need of "talk" or "listen" buttons by including a handset at one or both ends, which, after being picked up, allows the user 106 and the guest to speak to one another as if speaking over a telephone.

In some embodiments, whenever the "talk" or "listen" buttons are pressed, held, or released, a signal encapsulating the request is sent from the intercom station 108 to the ICU 110, which routes the signal to the lobby panel 112 to activate or deactivate the appropriate devices. Whenever audio signal is transmitted (e.g., the user holds down the "talk" button while speaking into the intercom station microphone, the user 106 holds down the "listen" button while the guest is speaking into the lobby panel microphone 136), the signal is routed between the intercom station 108 and the lobby panel 112 via the ICU 110.

In some embodiments, the intercom station 108 further enables the user 106 to perform the doorbell ring notification, buzz, talk, and listen functions remotely through the mobile app 128. In some embodiments, the intercom system 100 includes features such as the use of a guest mobile app, virtual keys for guests to enable the unlocking of the door 114 when the user 106 is not present, geofencing, the automatic unlocking of the door 114 upon request, and the unlocking of the door 114 via the intercom station 108 or the mobile app 128 without an unlock request sent by a guest. Details of these features are provided in this disclosure.

The intercom system 100 comprises a preexisting extra-unit intercom system, which is the set of components outside the apartment unit that typical legacy intercom systems have. For example, the preexisting extra-unit intercom system comprises a lobby panel (e.g., front door doorbell panel), a plurality of intercom station interfaces, and a set of wiring corresponding to the plurality of intercom station interfaces. In some embodiments, such as when interfacing with analog intercom systems, the extra-unit intercom further comprises an intercom amplifier. In some embodiments, such as when interfacing with digital intercom systems, the extra-unit intercom further comprises a control unit. At each apartment unit, the set of wiring is accessible via one or more holes in the apartment unit's wall. The set of wiring enables an installed intercom station to interact with the preexisting extra-unit intercom system. In some embodiments, a mount plate with organized wires provides a mechanically robust and electrically stable means for installing the intercom station (e.g., "physical device", "Buzr", "Buzr Device", or "Buzr Pro Device") into the apartment unit by connecting the intercom station 108 to the set of wiring via the mount plate. In some embodiments, the intercom station disclosed herein is installed alongside a pre-existing intercom station without replacing it.

Figure 1B:
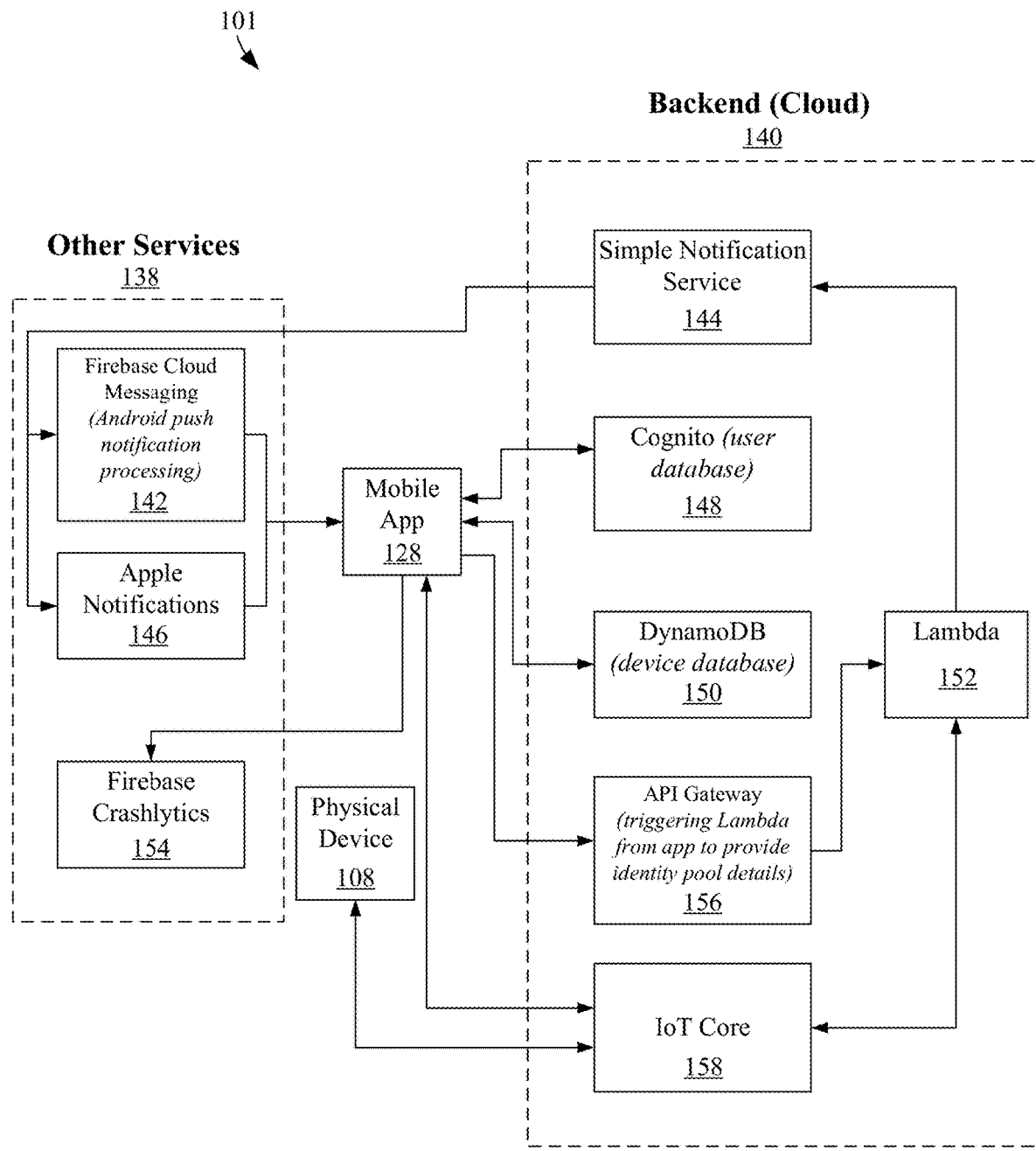
FIG. 1B shows a schematic of an exemplary intercom station interacting with a backend, a mobile application, and other services, in accordance with some embodiments of the invention.

FIG. 1B shows a schematic 101 of an exemplary intercom station 108 interacting with a backend 140, a mobile application 128, and other services 138, in accordance with some embodiments of the invention. A backend cloud-computing service (CCS) 140, such as Amazon Web Services (AWS), interfaces with the intercom station 108 and the mobile app 128, as described earlier with reference to FIG. 1A. In some embodiments, the AWS backend cloud-computing service 140 includes a simple notification service 144, an IoT core 158, one or more Lambda functions 152, DynamoDB 150 (device database, history database, virtual keys database), one or more API functions 156, and/or Cognito 148 (a user database). Features and operations of these components are readily apparent to those skilled in the art. The backend CCS interacts with several other services. In some embodiments, such interactions include the simple notification service 144 interfacing with Firebase Cloud Messaging 142 to enable Android push notification processing and with Apple Notifications 146 to enable iOS push notification processing, and the mobile app 128 interfacing with Firebase Crashlytics 154.

In some embodiments, the backend cloud-computing service 140 maintains a time-stamped record of its input and output, such as unlock requests by guests, unlock approvals granted by users, conversations between users and guests, sounds from the lobby, and so on. This record is retrievable by the user via the mobile app 128 or a website.

In some embodiments, the intercom station 108 and/or backend cloud-computing service 140 may integrate with third-party services, including home hosting services (e.g., Airbnb), delivery providers (e.g., DoorDash), smart home systems (e.g., Amazon Alexa, Google Home). This may be implemented by providing the third-party service's representative with a virtual key, by maintaining a direct integration with the third-party service's backend, or through conversing with a call center agent at the front door of the building.

Figure 2A:
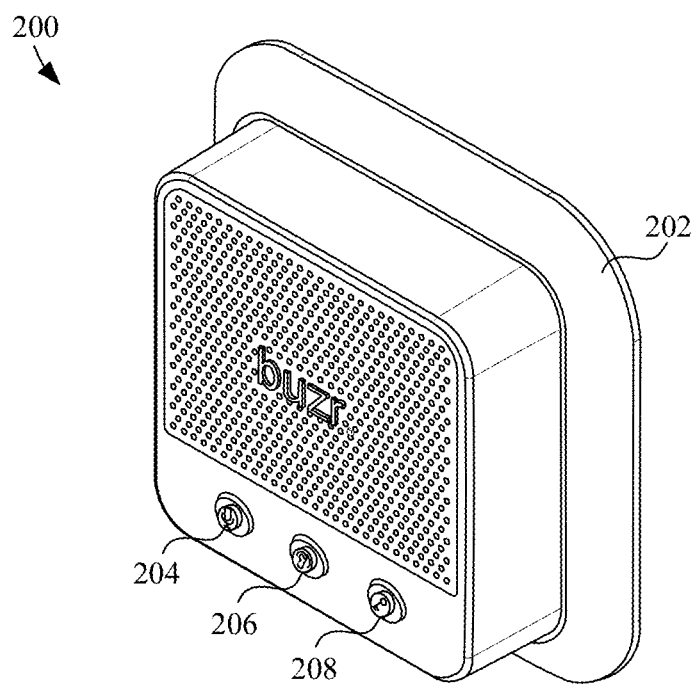
FIG. 2A shows an isometric view of an exemplary intercom station with a trim plate, in accordance with one embodiment of the invention.

FIG. 2A shows an isometric view of an exemplary intercom station 200 with a trim plate 202, in accordance with one embodiment of the invention. The example shown has three buttons on the front face: a talk button 204, a listen button 206, and a door button 208.

Figure 2B:
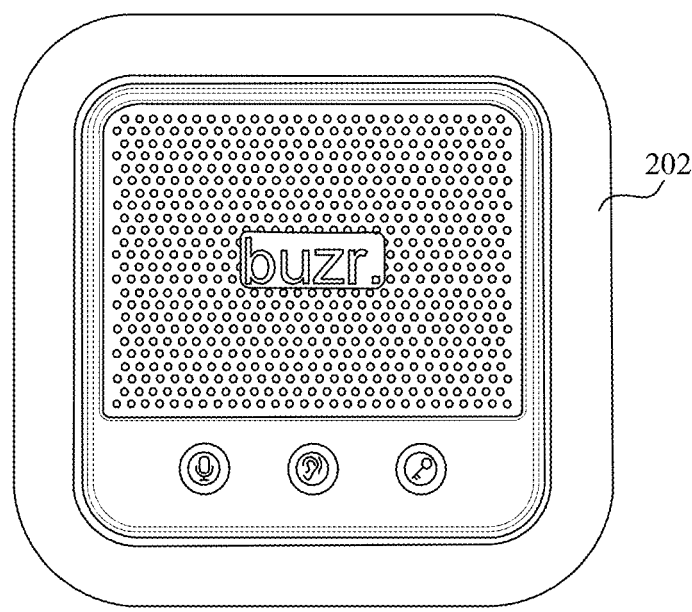
FIG. 2B shows a front view of an exemplary intercom station with a trim plate, in accordance with one embodiment of the invention.

FIG. 2B shows a front view of an exemplary intercom station 200 with a trim plate 202, in accordance with one embodiment of the invention.

Intercom Station Installation

FIGS. 3A, 3B, 3C, 3D, 3E, 3F, 3G, 3H, 3J, 3K, and 3L show various chronological stages of an old, pre-existing intercom station being replaced with a new intercom station ("device"). The device is adaptable to a wide range of legacy intercom systems, causes no harm nor impact to the legacy system during installation, maintains original in-home functionality without an internet connection or battery, and is insulated from the legacy system's varying voltages. The device is designed to be straightforward and safe to install for non-specialist consumers (e.g., less than 50 minutes for a typical user) through the use of a universal mounting plate to re-orient wiring from the existing system to match the device and align with existing mount screw holes. In some embodiments, the installation covers a legacy intercom system footprint through the use of an optional trim plate to hide any blemishes on the apartment wall. In some embodiments, the intercom station disclosed herein is installed alongside a pre-existing intercom station without replacing it.

Figure 3A:
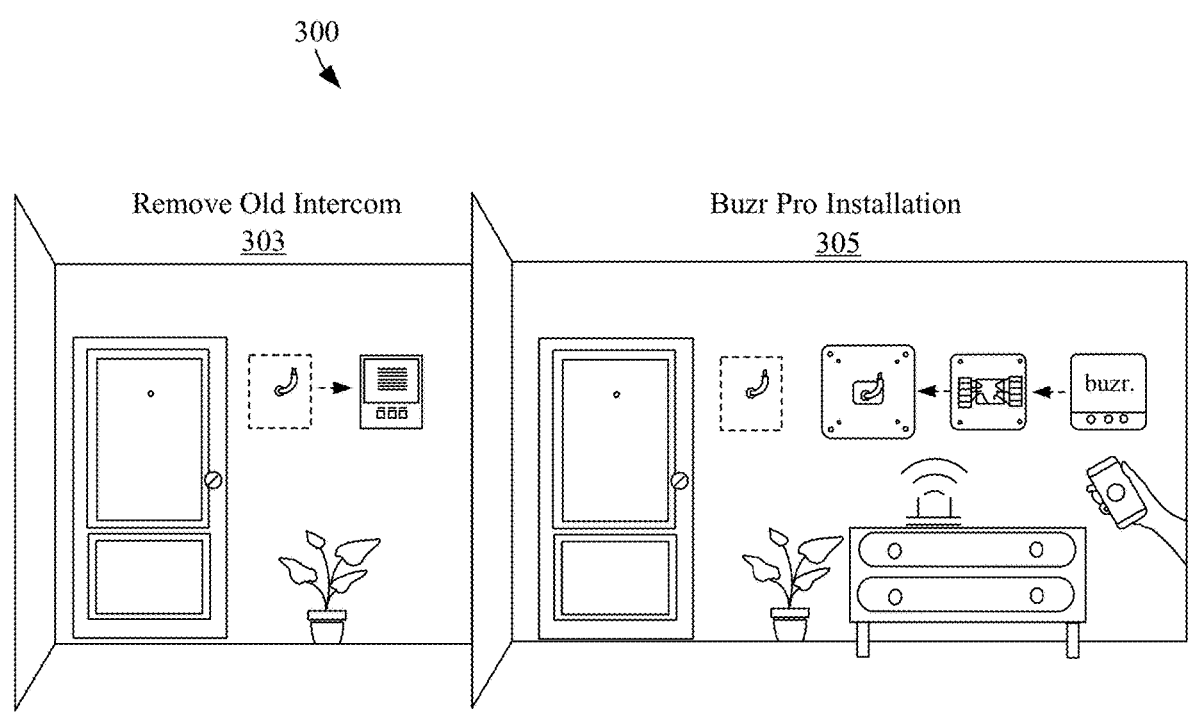
FIG. 3A shows views of an exemplary apartment unit before and after the installation an exemplary intercom station, in accordance with some embodiments of the invention.

FIG. 3A shows views of an exemplary apartment unit 300 before and after installing an exemplary intercom station, in accordance with some embodiments of the invention. Traditional intercom stations 303 typically do not require any Internet connection nor any connection to other device. In contrast, the intercom station 305 as disclosed herein may connect to the Internet via, for example, a wireless connection. It may also connect to a managed backend system, a local device, or a local server.

Figure 3B:
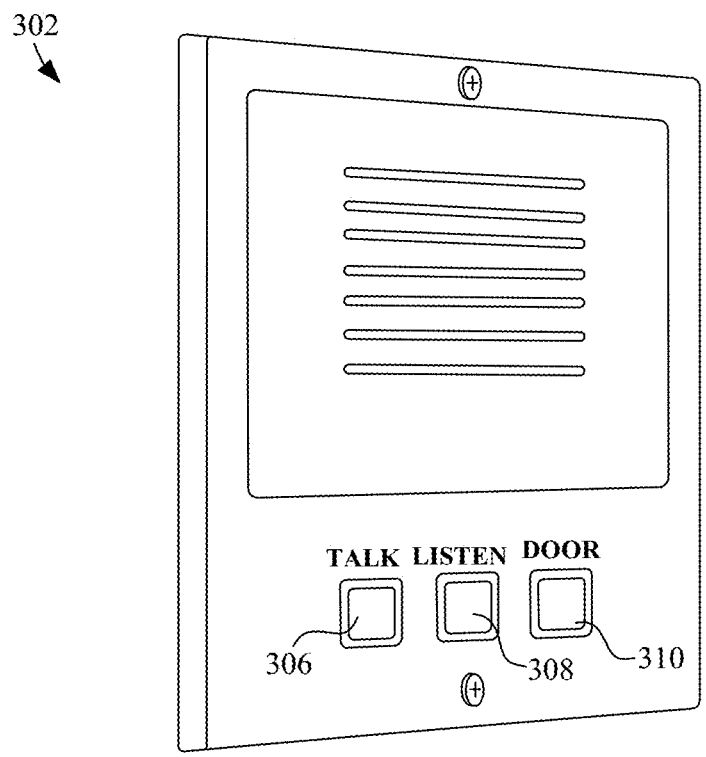
FIG. 3B shows an exemplary pre-existing intercom station installed in the wall of an apartment unit, in accordance with some embodiments of the invention.

FIG. 3B shows an exemplary pre-existing intercom station 302 installed in the wall of an apartment unit, in accordance with some embodiments of the invention. In some embodiments, the pre-existing intercom station 302 has a microphone, a speaker, a talk button 306, a listen button 308, and/or an unlock ("door") button 310. In some embodiments, the pre-existing intercom station 302 includes a handset, which allows a user to speak to a guest telephonically. In some embodiments, the handset is operated with the talk button and the listen button. In some embodiments, the handset is operated with an activate button that performs both the talk feature and the listen feature of the talk button and of the listen button, respectively. In other embodiments, the handset is operated without the talk button or the listen button. In some embodiments, the pre-existing intercom station 302 includes a video screen that may display the output from a video camera at or near the lobby panel.

Figure 3C:
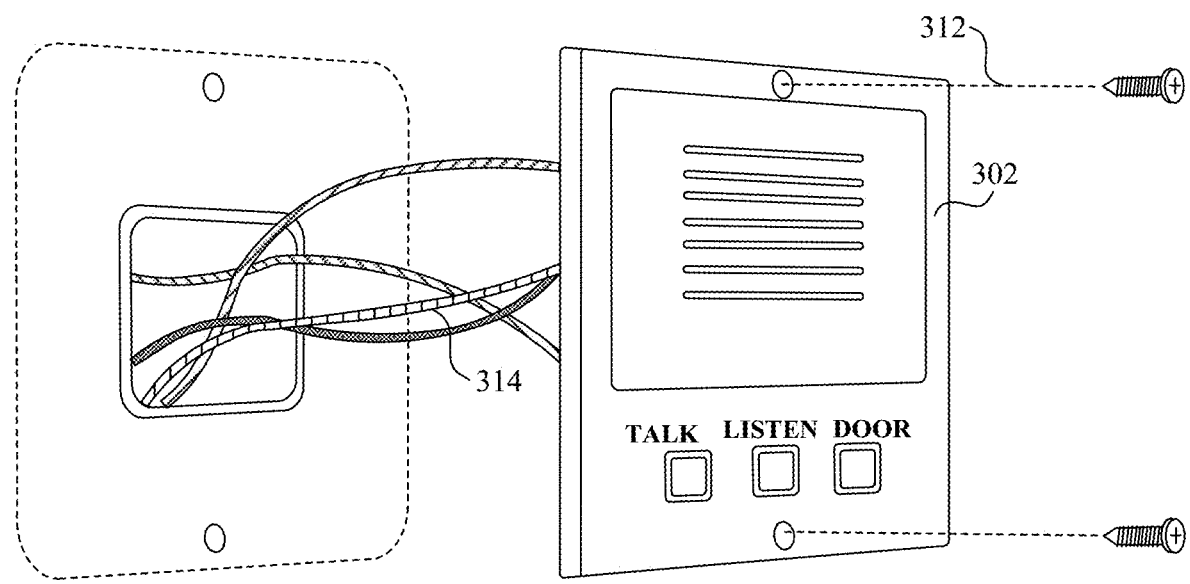
FIG. 3C shows an exemplary pre-existing intercom station being unscrewed from the wall of an apartment unit, in accordance with some embodiments of the invention.

FIG. 3C shows an exemplary pre-existing intercom station 302 being unscrewed 312 from the wall of an apartment unit, in accordance with some embodiments of the invention. As the pre-existing intercom station 302 is being removed, its wires 314 that connect it with the rest of the intercom system are exposed.

Figure 3D:
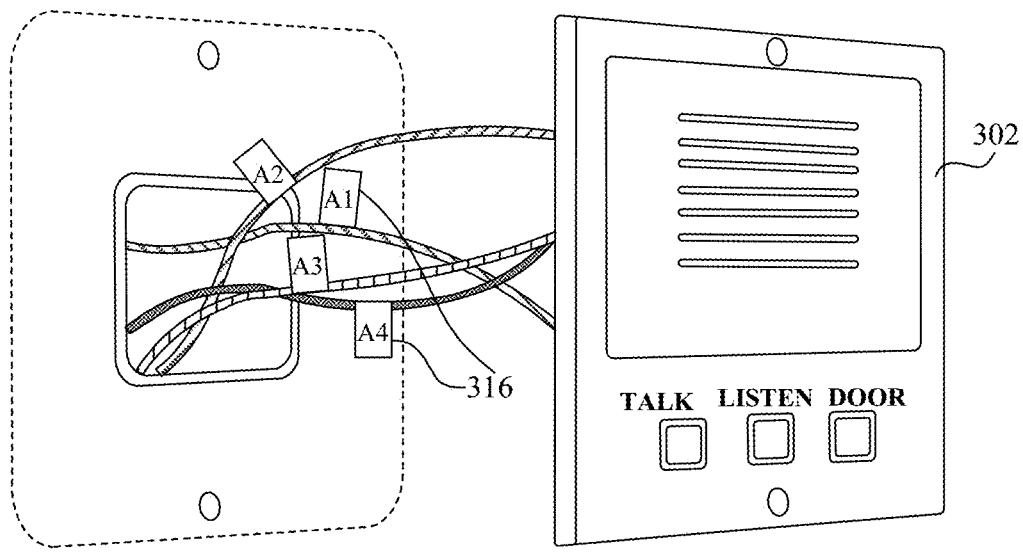
FIG. 3D shows an exemplary pre-existing intercom station with wires labelled, in accordance with some embodiments of the invention.

FIG. 3D shows an exemplary pre-existing intercom station 302 with wires labelled 316, in accordance with some embodiments of the invention. By labelling the wires 316 with their appropriate function, they may be later connected to the correct nodes of the new intercom station. In some embodiments, the labels are based on previous connectivity, and not necessarily based on functionality because there is no standard for wiring in legacy systems.

Figure 3E:
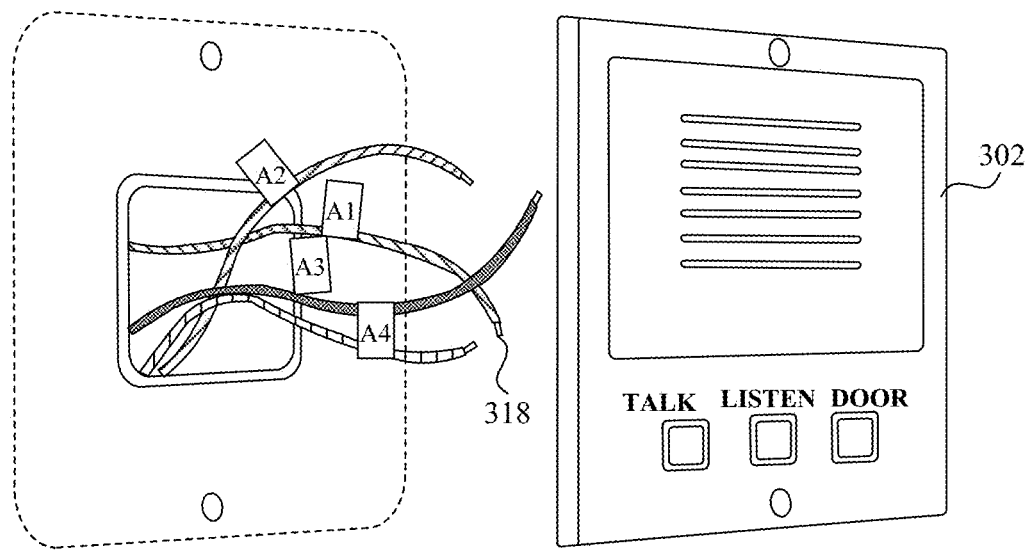
FIG. 3E shows an exemplary pre-existing intercom station with wires disconnected, in accordance with some embodiments of the invention.

FIG. 3E shows an exemplary pre-existing intercom station 302 with wires disconnected 318, in accordance with some embodiments of the invention. At this point, the pre-existing intercom station 302 is uninstalled and may be used for other purposes, such as being installed into another apartment unit or recycled.

Figure 3F:
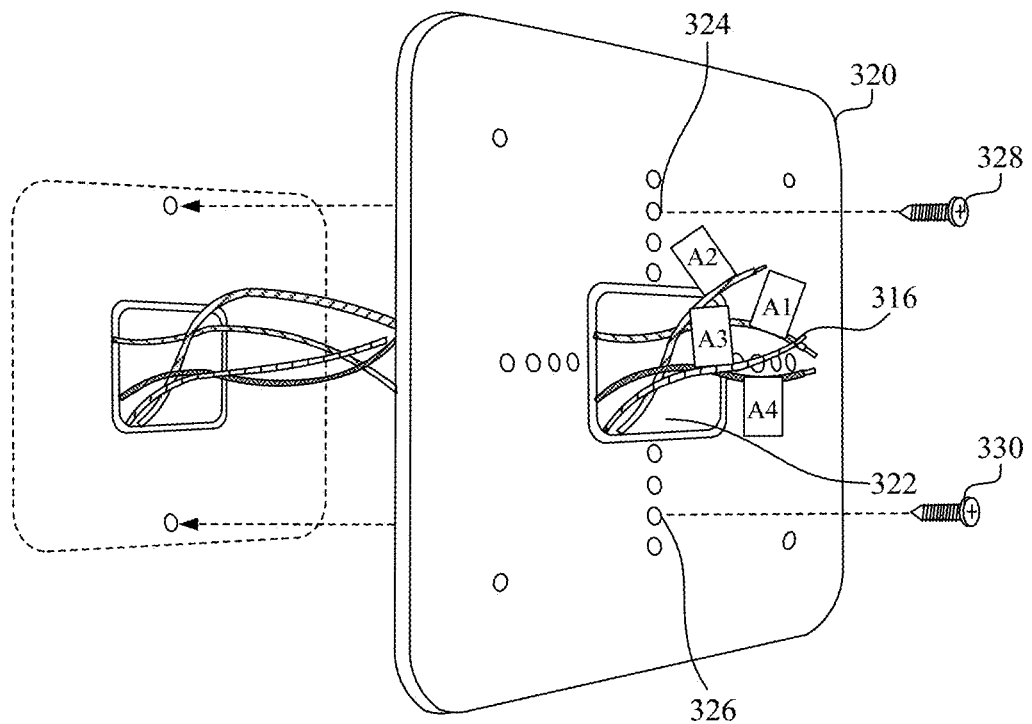
FIG. 3F shows a trim plate of an exemplary intercom station being aligned with the wall of an apartment unit, in accordance with some embodiments of the invention.

FIG. 3F shows a trim plate 320 of an exemplary intercom station being aligned with the wall of an apartment unit, in accordance with some embodiments of the invention. In some embodiments, the trim plate 320 comprises a hole 322 through which the wires 316 may be drawn. In some embodiments, the trim plate 320 comprises mounting holes 324, 326 through which screws or nails 328, 330 may be used to secure the trim plate 320 to the wall. In addition to securing the intercom station to the wall, another use of the trim plate 320 is to hide any blemishes on the apartment wall.

Figure 3G:
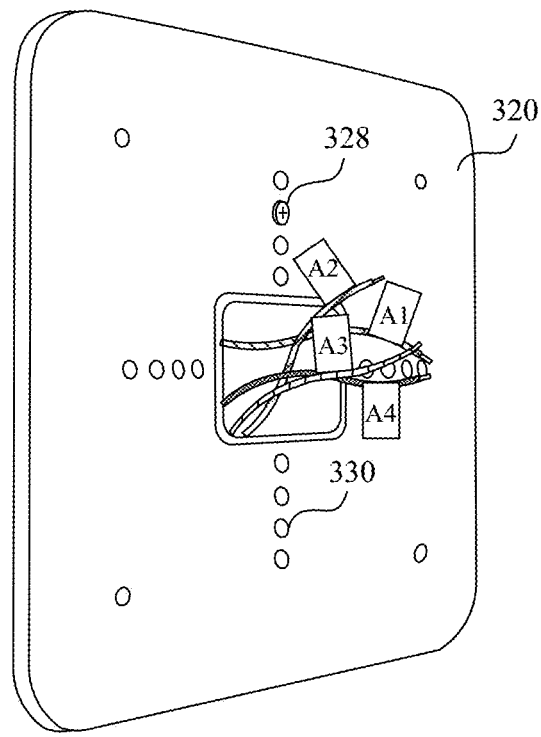
FIG. 3G shows a trim plate of an exemplary intercom station installed into the wall of an apartment unit, in accordance with some embodiments of the invention.

FIG. 3G shows a trim plate 320 of an exemplary intercom station installed into the wall of an apartment unit, in accordance with some embodiments of the invention. In the embodiment shown, two screws 328, 330 secure the trim plate 320 to the wall.

Figure 3H:
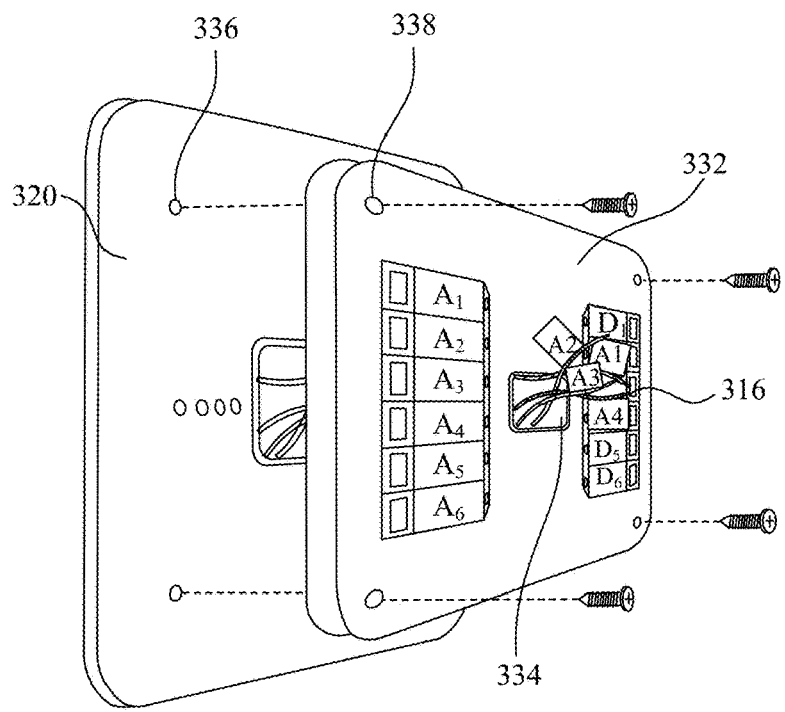
FIG. 3H shows a mounting plate of an exemplary intercom station being aligned with a trim plate mounted onto the wall of an apartment unit, in accordance with some embodiments of the invention.

FIG. 3H shows a mounting plate 332 of an exemplary intercom station being aligned with a trim plate 320 mounted onto the wall of an apartment unit, in accordance with some embodiments of the invention. In some embodiments, the mounting plate 332 of the intercom station comprises holes 338 that align with corresponding holes 336 in the trim plate 320. Screws or nails may be used to secure the mounting plate 332 of the intercom station to the trim plate 320 via the holes 338. In some embodiments, there is a hole 334 through which the wires as described in FIG. 3D are drawn and accessed.

Figure 3J:
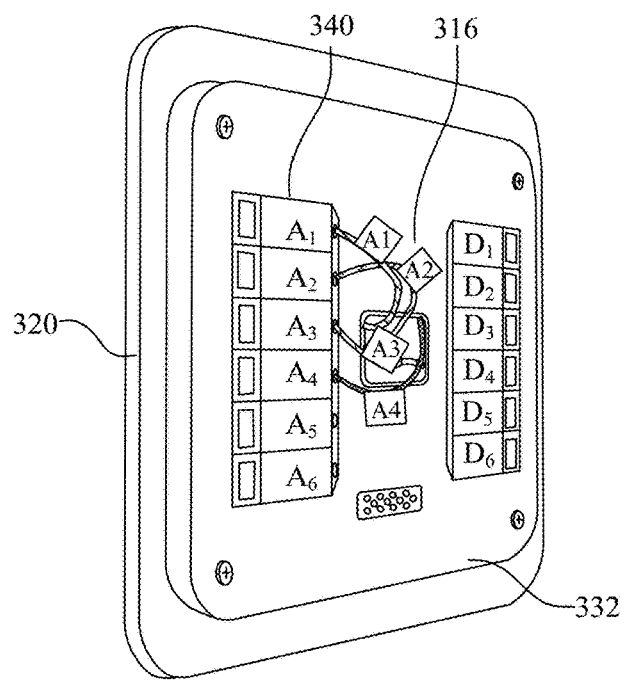
FIG. 3J shows a mounting plate of an exemplary intercom station installed into a trim plate mounted onto the wall of an apartment unit, in accordance with some embodiments of the invention.

FIG. 3J shows a mounting plate 332 of an exemplary intercom station installed into a trim plate 320 mounted onto the wall of an apartment unit, in accordance with some embodiments of the invention. In some embodiments, the mounting plate 332 is directly mounted onto the wall of the apartment unit without the use of an intermediate trim plate. The wires 316, which had been labelled by their appropriate functions, are then attached to their respective electrical nodes 340 in the mounting plate 332 of the intercom station so that the intercom station is connected to the building portion of the intercom system. Various electronic attachments are available to those skilled in the art. In some embodiments, the electrical nodes access a printed circuit board (PCB) embedded in the mounting plate 332.

Figure 3K:
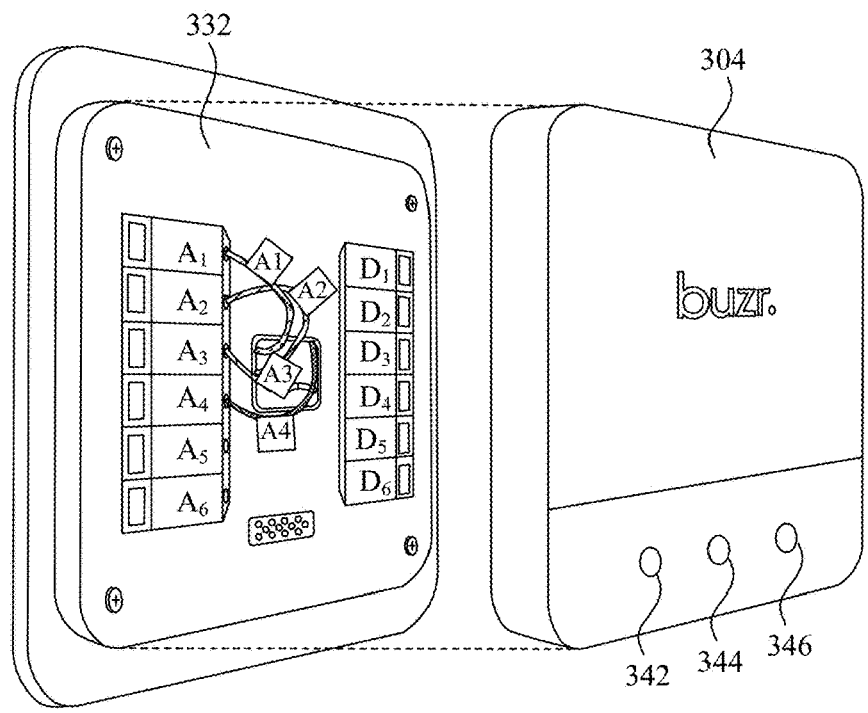
FIG. 3K shows an enclosure of an exemplary intercom station being aligned with a mounting plate, in accordance with some embodiments of the invention.

FIG. 3K shows an enclosure of an exemplary intercom station 304 being aligned with a mounting plate 332, in accordance with some embodiments of the invention. In some embodiments, the enclosure of the intercom station 304 comprises "talk" 342, "listen" 344, and "door" buttons 346 that enable the user to talk to a guest at the lobby, enable the user to listen to sounds in the lobby, and enable the user to unlock the lobby door, respectively. In some embodiments, the enclosure of the intercom station 304 comprises a microphone and a speaker to perform the sound sensing and the sound emitting features of the "talk" and "listen" functions. In some embodiments, electrical connections between the mounting plate 332 and the enclosure of the intercom station 304 connect the electronic components for the "talk" 342, "listen" 344, and "door" buttons 346, the microphone, and the speaker from the enclosure to the mounting plate 332, ultimately connecting those components to the rest of the intercom system. Various electronic attachments are available to those skilled in the art.

Figure 3L:
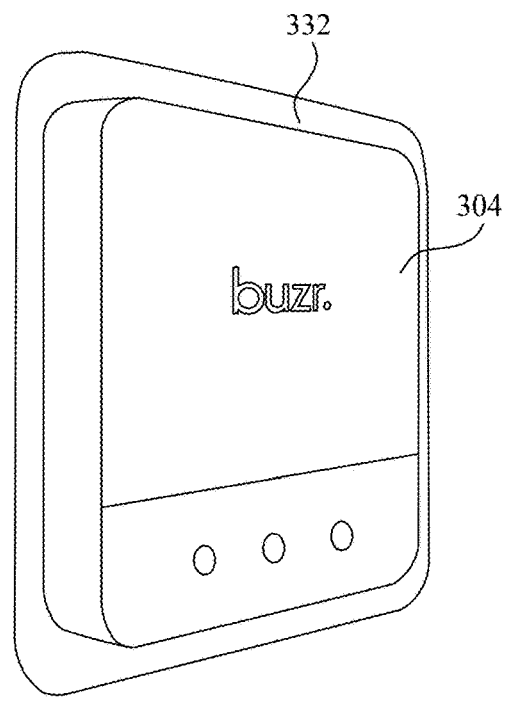
FIG. 3L shows an enclosure of an exemplary intercom station installed onto a mounting plate, in accordance with some embodiments of the invention.

FIG. 3L shows an enclosure of an exemplary intercom station 304 installed onto a mounting plate 332, in accordance with some embodiments of the invention. At this point, the installation of the intercom station 304 is complete, and it is ready to interface with the rest of the intercom system and the user.

Schematics and Electronics

Figure 4A:
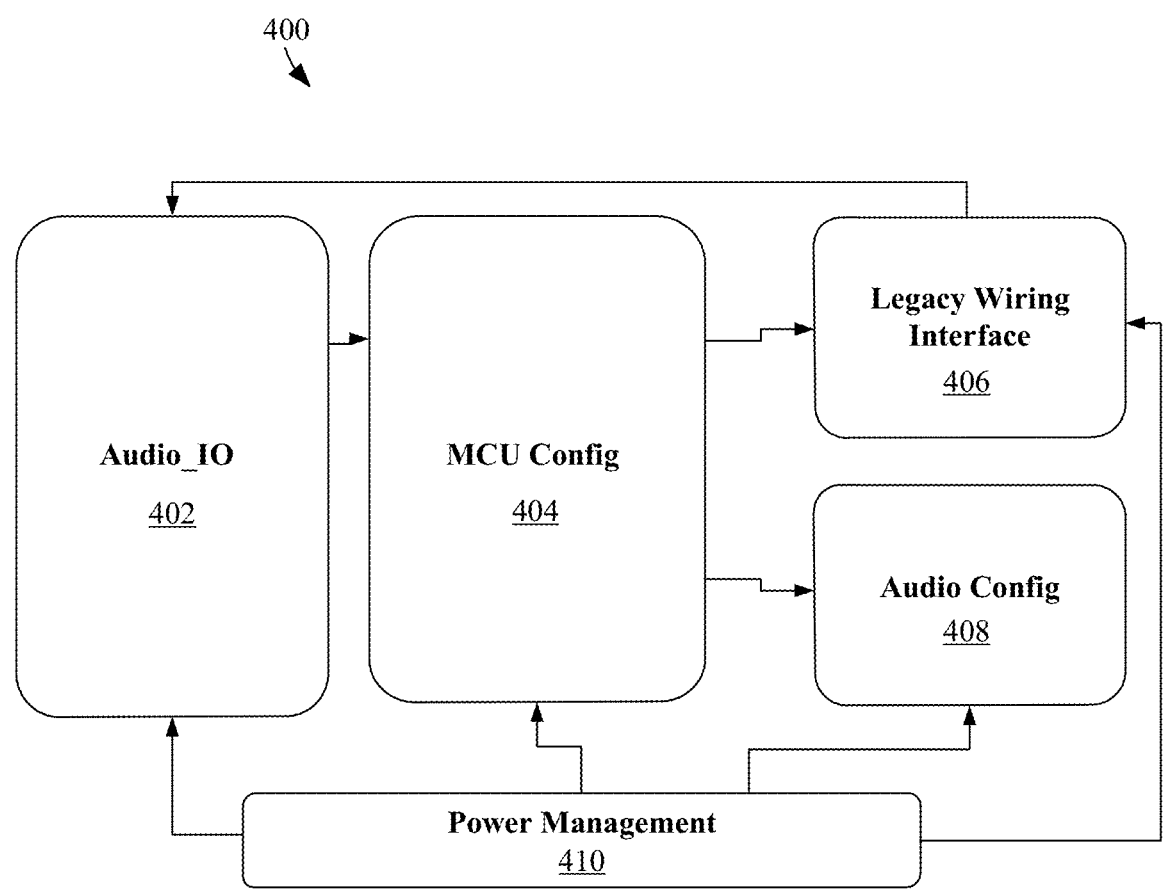
FIG. 4A shows a first-level functional block diagram of the various subsystem components of the exemplary intercom station, in accordance with some embodiments of the invention.

FIG. 4A shows a first-level functional block diagram 400 of the various subsystem components of the exemplary intercom station, in accordance with some embodiments of the invention. As depicted in greater detail in FIGS. 4C and 4D, the intercom station adapts to existing intercom systems using isolation circuitry to insulate the intercom station from the building's wiring, which increases compatibility across multiple systems and ensures that other building residents are not negatively affected by the intercom station being installed on a shared system. The intercom station maintains legacy functionality by maintaining buttons, a speaker, and a microphone in an alternate subcircuit so that in the event of power loss or Internet loss, the user is still able to hear their doorbell ring and interact with the front door while present in the apartment unit. In some embodiments, the hardware and software of the intercom station may be implemented in accordance with the diagrams shown and discussed in reference to FIGS. 16 and 17.

The analog legacy wiring interface 406 for a legacy intercom system interfaces with the legacy intercom system by relaying audio signals, door unlock requests, door unlock approvals, lobby speaker activation and deactivation requests, and/or lobby microphone activation and deactivation requests. In embodiments where the lobby panel 112 includes a video camera or a still camera, which permits a user to see the guest on a video screen on or near the intercom station 108, the analog legacy wiring interface 406 also relays a video feed. In some embodiments, the analog legacy wiring interface 406 may be implemented on a mount plate PCB and is represented in greater detail in FIGS. 4C and 4D; and the audio input-output (I/O) circuit 402, processor (e.g., microcontroller unit) config circuit (MCU config) 404, audio config 408, and power management circuit 410 are all on a main circuit board (along with interface headers that interact with the mount plate PCB) represented in FIG. 5A, a block diagram of the main circuit board. The universal relay and audio isolation subsystems in the analog legacy wiring interface 406 for the legacy intercom processes such information, exchanges audio signals with the audio input-output (I/O) circuit 402, and exchanges non-audio information with the processor config circuit 404, which controls the intercom station. In some embodiments, the processor config circuit 404 is a microcontroller unit config circuit (MCU config) 404. For convenience, this disclosure may describe "microcontroller unit config circuits (MCU config)" in particular, but the teachings and discussion may apply more generally to "processor config circuits" as well, as referenced in FIGS. 16 and 17. The MCU config 404 use a communication protocol (e.g., MQTT via Wi-Fi) to transmit messages to the managed backend system, a local device, or a local server. The audio input-output (I/O) circuit 402 processes audio signals, and exchanges audio signals with the MCU config 404.

The power management circuit 410 includes regulators and voltage protection circuitry to allow for the various subsystems to operate at their respective required voltages. In some embodiments, a global voltage source of 6 V (e.g., provided by four AA batteries) and a global voltage source of 5 V (e.g., provided by a USB cable) are converted to 3.3 V, 2.5 V, and 15 V when needed. In some embodiments, the intercom station is powered by a standard battery or by a plurality of standard batteries (e.g., four AA batteries) with typical usage conveniently requiring infrequent battery replacement or recharging. In some embodiments, greater than 12 months of battery life may be achieved by using sleep modes on the MCU 404, even while maintaining a steady connection to the Internet at all times so that a guest does not need to wait for the intercom station to regain Internet connection. In some embodiments, the intercom station may also be externally powered via a cable (e.g., micro-USB).

Audio config 408 includes both the isolation circuitry needed to accommodate tone detection 540 functionality as well as the configuration circuitry needed to support the station speaker. In some embodiments, the regulator that boosts 6 V to 15 V (as referenced above) and the amplifier that outputs to the station speaker are located in this schematic sheet as well.

Figure 4B:
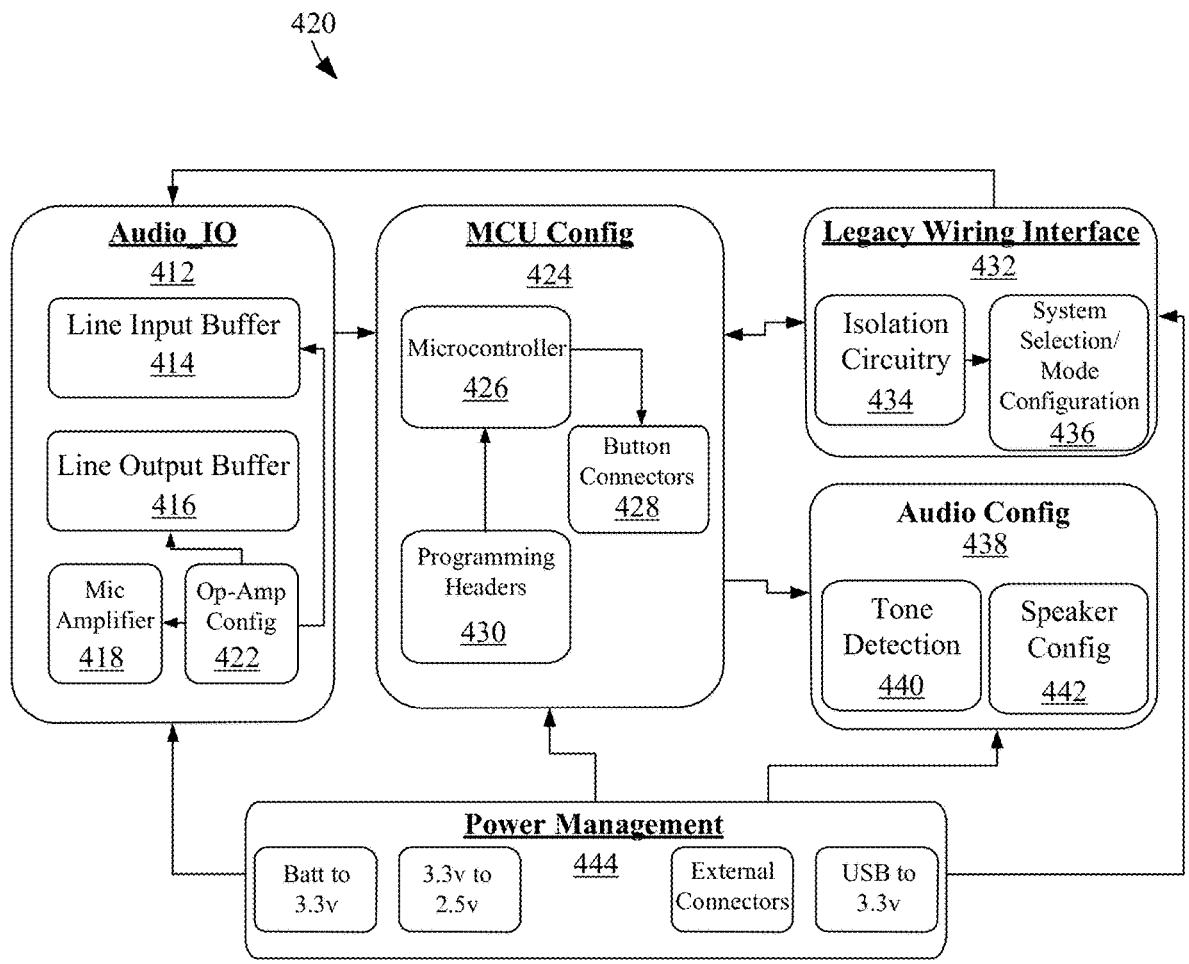
FIG. 4B shows a second-level functional block diagram of the various subsystem components of the exemplary intercom station, in accordance with some embodiments of the invention.

FIG. 4B shows a second-level functional block diagram 420 of the various subsystem components of the exemplary intercom station, in accordance with some embodiments of the invention. To develop the intercom station, much experimentation was conducted on a wide range of legacy intercom systems in order to understand their common characteristics and to avoid engineering a universal intercom system that works only for a specific legacy system. A circuit ("Buzr Lite") that is able to detect doorbell rings and alert the user in a mobile phone application was achieved through opto-isolation methods, which required much trial and error, as the signal that is sent through the line is very variable between systems and may trigger multiple erroneous doorbell ring notifications if not tuned correctly. In some embodiments, a push notification should be received within a brief period (e.g., 5 seconds) of someone pressing the doorbell at the front of the building. Additionally, only one push notification will be received. In some embodiments, oscillations in the doorbell or continuous doorbell presses will not trigger additional notifications within a refractory period (e.g., 90 seconds) of the first notification.

To achieve universal wiring compatibility across a wide variety of legacy intercom systems, sourced documentation from the most common systems were studied. A universal relay system is then devised, assuming that signals are properly isolated in the next stage of the intercom station's circuitry. To understand how legacy intercom systems communicate audio, oscilloscope readings of the various systems under interaction were recorded and studied. Exemplary waveforms resulting from these experiments are discussed herein with reference to FIGS. 6A, 6B, 6C, and 6D. By compiling waveforms across many systems, universal circuitry that would work across each of these systems is devised.

Generally, all systems share the same four core operations of talking, listening, doorbell ringing, and buzzing a door open. Accordingly, there are only a limited number of wiring configurations to achieve this. However, there is no standard as to how these connections are made or even how many wires there are. The major configurations are digital or analog and either 2, 4, or 5 wires (although 3 & 6 wire systems exist as well). Three exemplary legacy systems are the 2-wire digital Aiphone GT system, the analog PK543A (which can accommodate 3-wire stations, 4-wire stations, or 5-wire stations), and the analog AF1000 (a 6-wire station).

In some embodiments, the intercom station comprises isolation circuits and other electronics that perform signal processing and filtering operations (e.g., hardware-based or software-based digital signal processing) for the management of various audio functions 412. The intercom station processes audio for wireless transmission by extracting electrical signals through isolation circuits and pre-filtering audio via an analog-to-digital converter (ADC) and transmitting the encoded audio to the mobile app for listening by the user. In some embodiments, the ADC is directly on a processor. In some embodiments, the processor is a microcontroller unit (MCU). For convenience, this disclosure may describe "microcontroller units (MCU)" in particular, but the teachings and discussion may apply more generally to "processors" as well, as referenced in FIGS. 16 and 17. In some embodiments, the ADC is a device external to a processor or other circuits. In some embodiments, the intercom station further includes an audio codec that interfaces with the ADC. The intercom station also processes audio for audible output by receiving audio signal via the mobile app and transmitting the audio signal to the intercom station. In some embodiments, the audio signal is first processed through a digital-to-analog converter (DAC) before being fed into a filter, whereas in alternative embodiments, the audio signal is fed directly into a filter. The filter outputs to a decoder and is eventually outputted to the front door speaker.

The audio input-output (I/O) circuit 412 performs all audio transmission and filtering functions related to legacy communication as well as the station microphone. These functions share a common operational amplifier bank 422. The line input buffer 414 extracts audio from the legacy system to be used by the intercom station via the processor's 426 ADC. In some embodiments, this process requires isolation (such as via a transformer) and amplification to allow the incoming signals to be interpretable by a typical processor ADC, which would otherwise be challenging due to the low amplitude of incoming signals compared to the sensitivity of the ADC. This need for amplification is highlighted in FIG. 6C. The line output buffer (or line output driver) 416 performs the opposite operation as the line input buffer 414 by taking output from a digital-to-analog converter (DAC), running the result through isolation (such as via a transformer), and finally attenuating the signal so that it is once again within the expected amplitude range of the legacy system. In some embodiments, microphone amplifier 418 is a microelectromechanical (MEMS) microphone whose signal is passed through an operational amplifier circuit before being fed into the processor 426. In some embodiments, the processor is a microcontroller unit (MCU) 426. In some embodiments, the operational amplifier bank 422 contains shutdown functionality for power saving purposes, and configures various voltage dividers to adapt the general-purpose input/output (GPIO) voltage of 3.3 V to the expected shutdown (SHDN) voltage of 2.5 V.

The microcontroller unit config circuit (MCU config) 424 is the overall configuration of the microcontroller unit (MCU) 426 and its associated button connectors 428 and programming headers 430. In some embodiments, the microcontroller unit (MCU) 426 includes pin/port connectivity, power, and antenna connectivity. In some embodiments, the button connectors 428 are the button inputs for the intercom station's user input interfacing, such as the "talk", "listen", "buzz", "device reset", and "WiFi reset" features. In some embodiments, the programming headers 430 are optional programming headers for UART & SW/JLink interfaces, which enable rapid prototyping and board programming but may be removed for mass production. In some embodiments, the microcontroller unit (MCU) 426 is configured to interact with and control a station audio emission subsystem and a station audio reception subsystem, as described with reference to FIG. 1A.

Figure 4C:
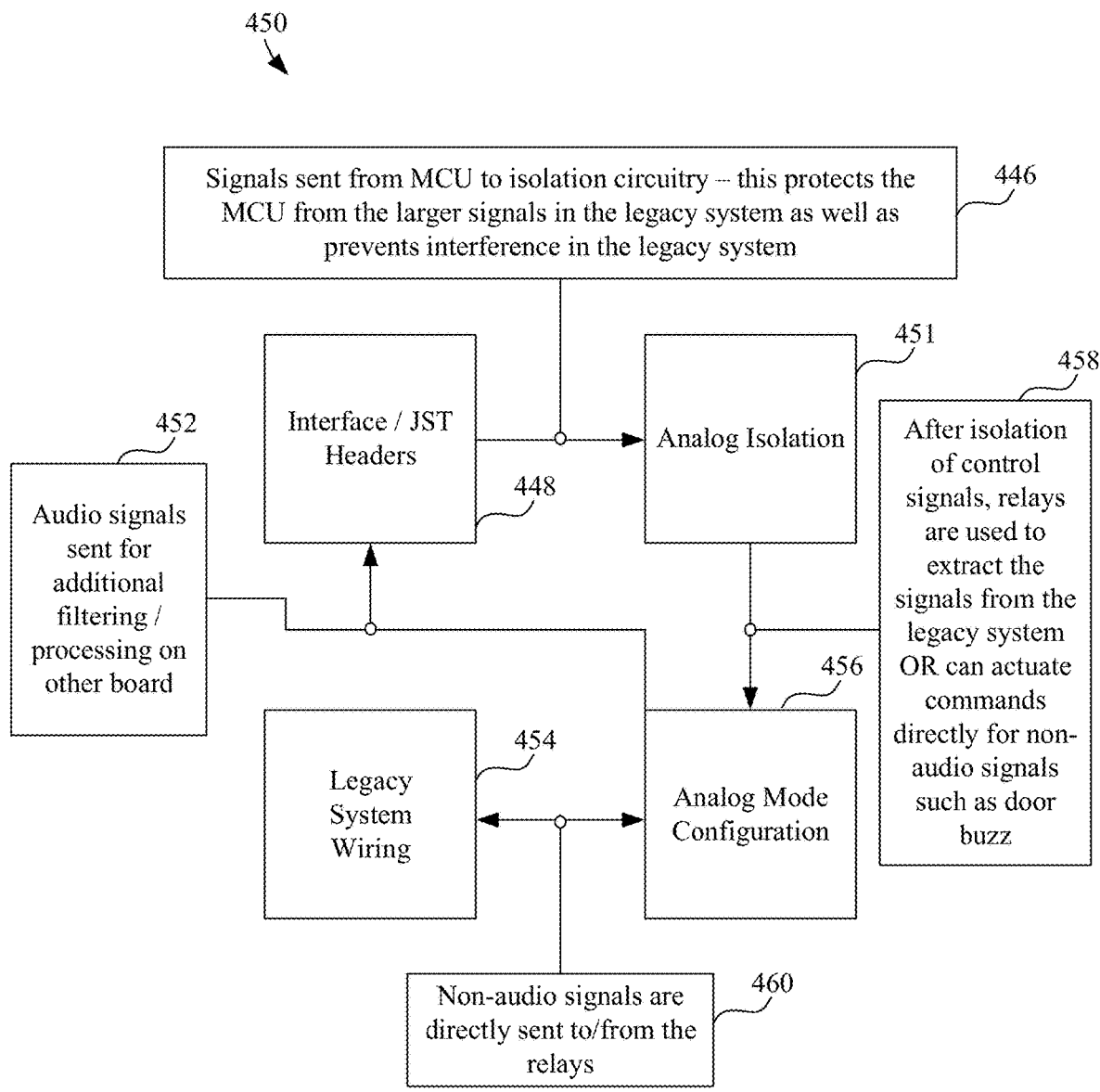
FIG. 4C shows a functional block diagram of the exemplary intercom station with separate universal relay and audio isolation subsystems, in accordance with some embodiments of the invention.
Figure 4D:
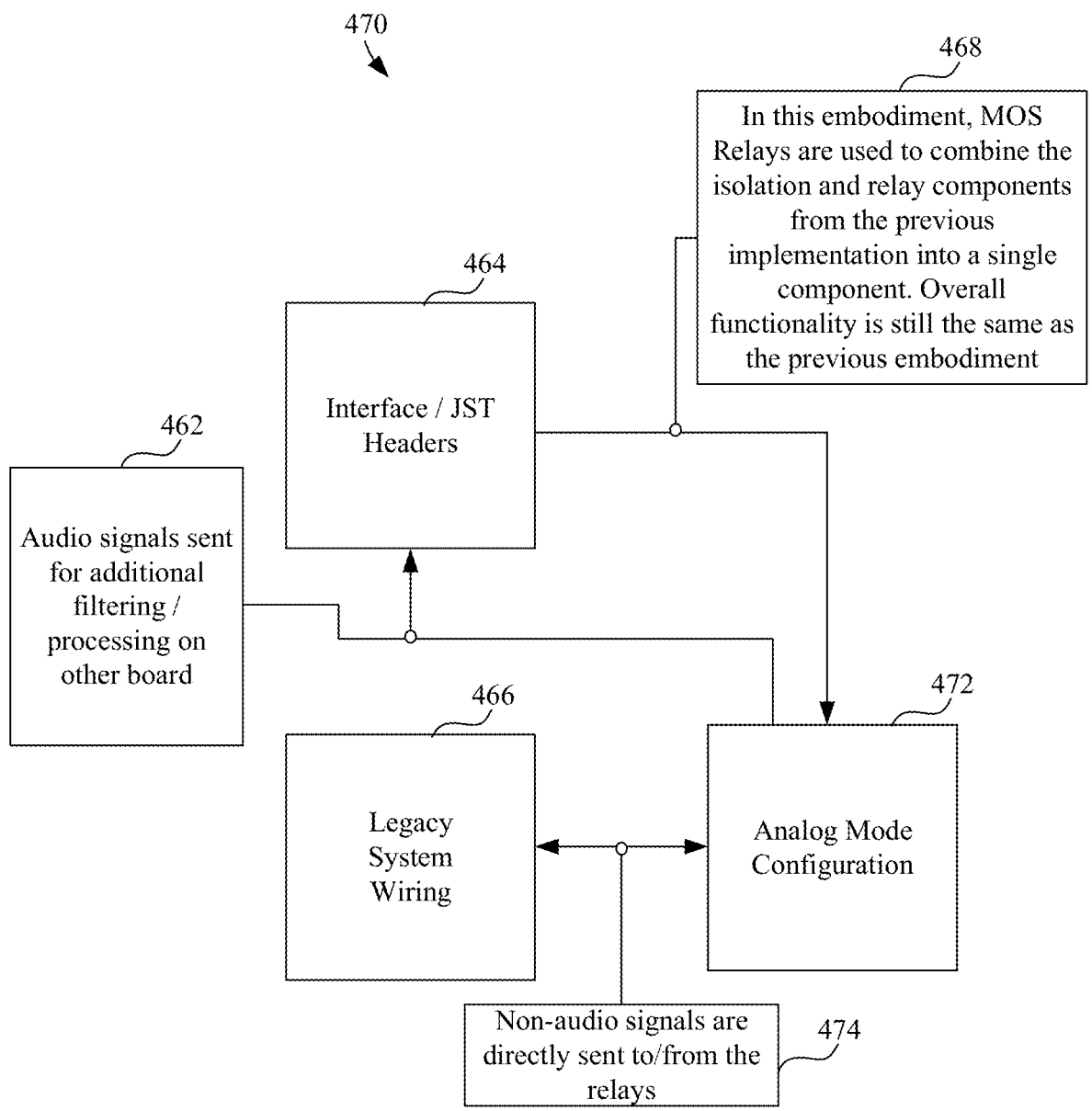
FIG. 4D shows a functional block diagram of the exemplary intercom station with combined universal relay and audio isolation subsystems, in accordance with some embodiments of the invention.

As described above, in some embodiments, the analog legacy wiring interface 432 may be implemented on a mount plate PCB and is represented in greater detail in FIGS. 4C and 4D. The analog legacy wiring interface 432 contains circuitry needed for compatibility with analog legacy intercom systems. Other legacy wiring interface designs may be implemented for compatibility with digital legacy intercom systems. The analog legacy wiring interface 432 contains isolation circuitry 434, which are isolators used to extract incoming control signals from the microcontroller unit config circuit (MCU config) 424 before passing the signals to the relays to control the legacy system. In some embodiments, this subcircuit is technically deprecated by the embodiment depicted in FIG. 4D when this subsystem is combined with the mode configuration circuit 436, which is the signal routing and relay control circuitry that allows the intercom station to manipulate the legacy system. For example, the mode configuration circuit 436 allows the intercom station to buzz the legacy system and opens the line in or line out circuits so that the intercom station may interact with the audio signals via the audio input-output (I/O) circuit 412.

Audio config 438 includes both the isolation circuitry needed to accommodate tone detection 440 functionality as well as the station speaker configuration circuitry 442. The tone detection circuit 440 detects and extracts the oscillation waveform shown in FIGS. 6B and 6C, and is discussed in greater detail with reference to FIG. 5C.

FIG. 4C shows a functional block diagram 450 of the exemplary intercom station with separate universal relay and audio isolation subsystems, in accordance with some embodiments of the invention. This embodiment may be used in conjunction with the second-level functional block diagram 420 as depicted in FIG. 4B and may be implemented in accordance with the circuit diagrams shown in FIGS. 5D (universal relay) and 5E (audio isolation). In some embodiments, a subsystem may reside on a separate mounting PCB. The legacy system wiring 454 includes pre-existing wires from the legacy system. In some embodiments, the legacy system wiring 454 may be connected to the intercom station via B2W connectors.

Relay control signals 446 are sent from the microcontroller unit config circuit (MCU config) 424 via headers that interface with the main board to the isolation circuitry for analog signal extraction. The isolation circuitry protects the microcontroller unit config circuit (MCU config) 424 from the larger signals in the legacy system as well as prevents interference in the legacy system. Headers 448 provide connectivity to the main PCB. An analog isolation circuit 451 generates a barrier between the relays/legacy system and the MCU control signals. In some embodiments, the analog isolation circuit 451 is implemented using techniques such as opto-isolation, RF isolation, and TTL (transistor-transistor logic) MOSFET circuits. In some embodiments, it is implemented using MOS-relays, which combines the analog isolation circuit 451 and the analog mode config circuit 456 as discussed with reference to FIG. 4D.

Audio signals 452 are passed through the mount plate because all isolation and audio processing are performed on the main board. The functionality of the mount plate with reference to audio signals 452 is to connect to the proper line of the legacy intercom system when audio is needed to prevent unintended interference or audio artifacts to the legacy system when the intercom station is not attempting to communicate on the talk or listen lines. This is also manifested in relays B and C in FIG. 5D.

Signals 458 are sent from the analog isolation circuit 451 to control the relays in the analog mode config circuit 456. After isolation of control signals, the relays extract the signals 458 from the legacy intercom system. In some embodiments, the signals 458 may actuate commands directly for non-audio signals, such as a door buzz. Non-audio signals 460 directly control the legacy intercom system. For example, a non-audio signal 460 may engage relay D in FIG. 5D to trigger a door buzz.

FIG. 4D shows a functional block diagram 470 of the exemplary intercom station with combined universal relay and audio isolation subsystems, in accordance with some embodiments of the invention. This embodiment may be used in conjunction with the second-level functional block diagram 420 as depicted in FIG. 4B and may be implemented in accordance with the circuit diagram shown in FIG. 5F. In some embodiments, a subsystem may reside on a separate mounting PCB. The operation of FIG. 4D parallels that of FIG. 4C in a manner that is readily apparent to those skilled in the art. Signals 468 are a combination of relay control signals 446 and signals 458. Analog mode config circuit 472 includes a major improvement in terms of signal integrity and BOM cost by combining analog isolation circuit 451 and analog mode config circuit 456 by using MOS relays. These components automatically perform both the isolation functionality and the relay/switching functionality to properly interface with and control the legacy intercom system wiring.

Figure 5A:
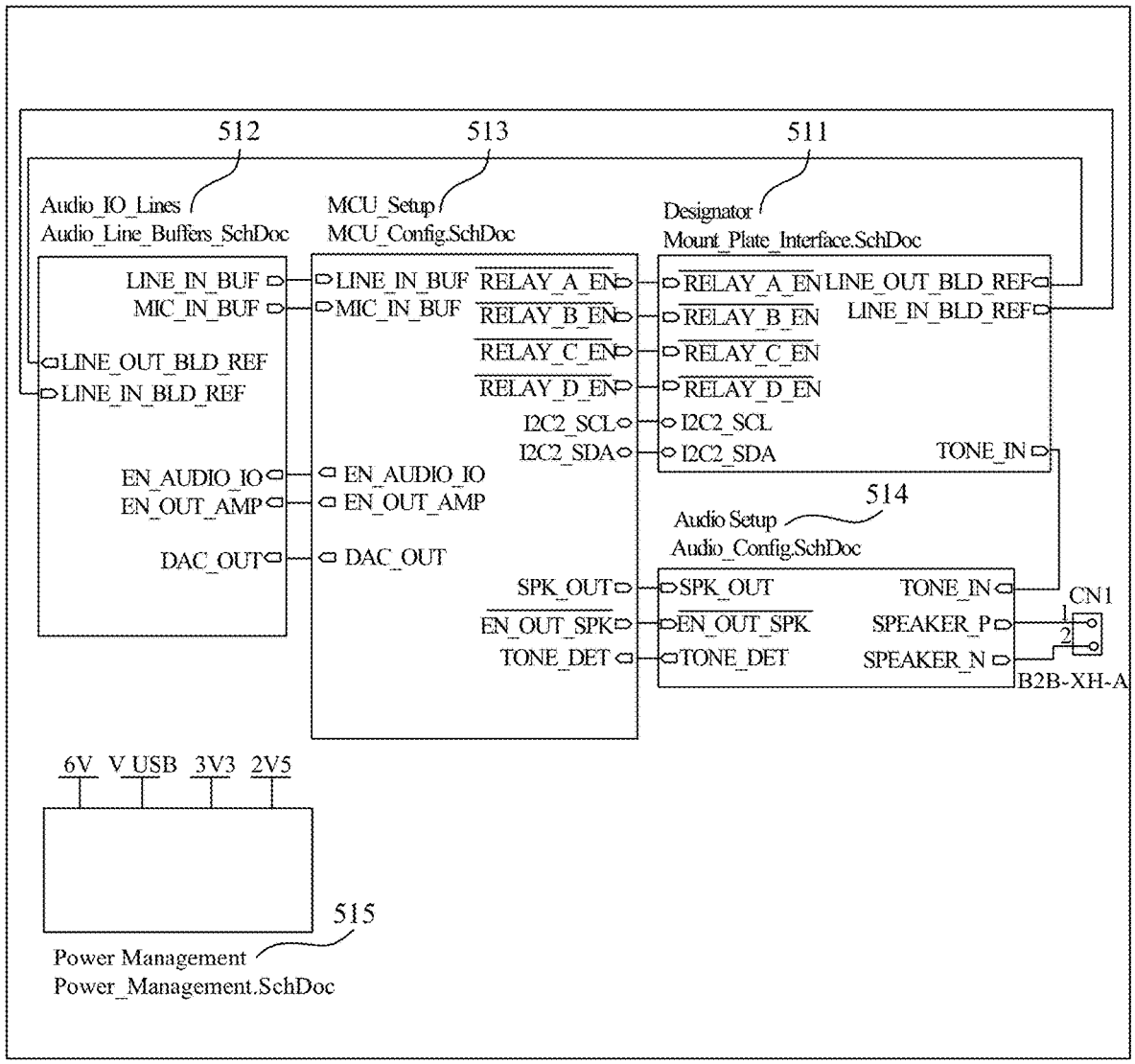
FIG. 5A shows an exemplary functional block diagram of the various electrical components of the exemplary intercom station, in accordance with some embodiments of the invention.

FIG. 5A shows an exemplary functional block diagram 510 of the various electrical components of the exemplary intercom station, in accordance with some embodiments of the invention. The block diagram 510 shows the connections between the various subsystem components shown in the first-level and second-level functional block diagrams of FIGS. 4A and 4B. The analog legacy wiring interface 511 for a legacy intercom system receives an audio signal ("AUDIO_TO_STATION") from the legacy intercom system. In some embodiments, this audio signal is a message from the microphone of the lobby panel to be relayed to the user of the intercom station. The universal relay and audio isolation subsystems in the analog legacy wiring interface 511 for the legacy intercom processes the audio signal ("AUDIO_TO_STATION") and transmits another audio signal ("LINE_IN_BLD_REF") to a line input buffer of an audio input-output (I/O) circuit 512. Similarly, the analog legacy wiring interface 511 for the legacy intercom receives an audio signal ("LINE_OUT_BLD_REF") from a line output driver of the audio input-output (I/O) circuit 512. In some embodiments, this audio signal is a message from the user of the intercom station to be relayed to the speaker of the lobby panel. The universal relay and audio isolation subsystems in the analog legacy wiring interface 511 for the legacy intercom processes the audio signal ("LINE_OUT_BLD_REF") and transmits another audio signal ("AUDIO_FM_STATION") to the legacy intercom system.

The line input buffer of the audio input-output (I/O) circuit 512 receives the audio signal ("LINE_IN_BLD_REF") from the analog legacy wiring interface 511 for a legacy intercom system and transmits an audio signal ("LINE_IN_BUF") to a processor 513. In some embodiments, the processor 513 is a microcontroller unit (MCU) 513. The line output driver of the audio input-output (I/O) circuit 512 receives an audio signal ("DAC_OUT") from the microcontroller unit (MCU) 513 and transmits an audio signal ("LINE_OUT_BLD_REF") to the analog legacy wiring interface 511 for the legacy intercom system.

The microphone input buffer ("MIC_IN_BUF") of the audio input-output (I/O) circuit 512 is the output from the operational amplifier circuit that corresponds to a driver being used for the on-board microelectromechanical (MEMS) microphone. Although alternative solutions exist for configuring a microphone within a product, advances in MEMS technology have brought such microphones to the cutting edge of the overall IoT industry. Specific considerations were taken on the mechanical side to ensure that proper vibration dampening and sound channels were included. The microphone input buffer ("MIC_IN_BUF") line is fed into one of the two internal microcontroller unit (MCU) ADCs.

The enable audio line ("EN_AUDIO_IO") is one of the two shutdown/enable lines for the operational amplifier bank 422. It controls the voltage buffer (e.g., the operational amplifier) in the line input buffer and the operational amplifier of the microphone. The enable output line ("EN_OUT_AMP") is the other one of the two shutdown/enable lines for the operational amplifier bank 422. It controls the voltage buffer (e.g., the operational amplifier) in the line output driver.

Figure 5B:
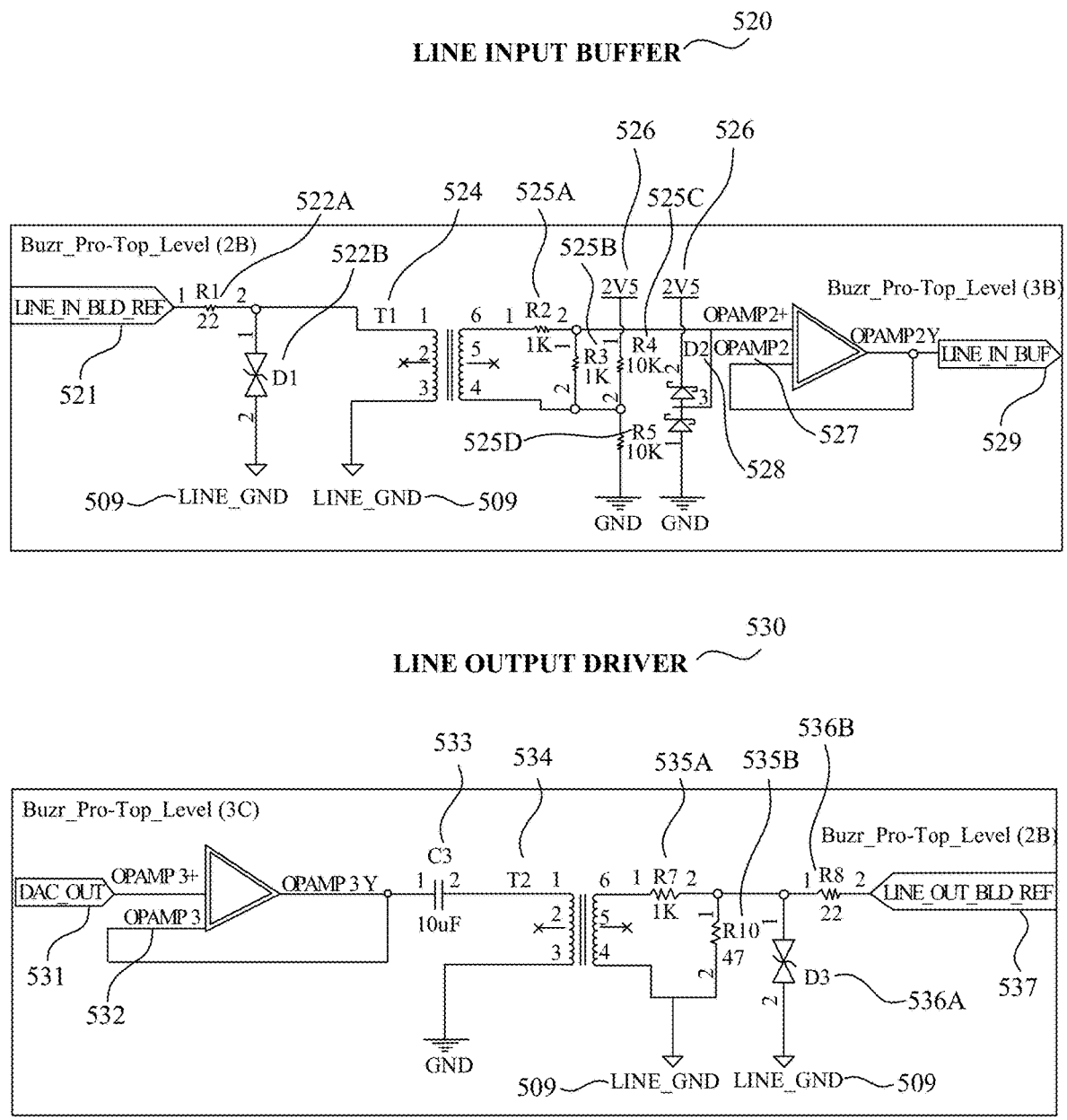
FIG. 5B shows an exemplary circuit diagram of the line input buffer and line output driver of the exemplary intercom station, in accordance with some embodiments of the invention.

FIG. 5B shows an exemplary circuit diagram of the line input buffer 520 and line output driver 530 of the exemplary intercom station, in accordance with some embodiments of the invention. The line input buffer 520 and line output driver 530 may together form an audio input-output (I/O) circuit 512 configured to process audio signals for analog systems. In some embodiments, as shown in the circuit diagram, an audio line ground 509 ("LINE_GND") is a common line from the legacy intercom system, and a "GND" is an electrical ground. The line input buffer 520 receives as input a first input signal 521 ("LINE_IN_BLD_REF") from the wiring interface 511 for a legacy intercom system, which represents an audio signal. In some embodiments, the line input buffer 520 includes a first electrostatic discharge (ESD) and transient protection subcircuit 522A, 522B that is configured to receive the first input signal. In some embodiments, the audio line ground 509 ("LINE_GND") is coupled to the first electrostatic discharge (ESD) and transient protection subcircuit 522A, 522B. In other embodiments, the line input buffer 520 does not include an electrostatic discharge (ESD) and transient protection subcircuit. In some embodiments, the first electrostatic discharge (ESD) and transient protection subcircuit includes a first ESD resistor 522A ("R1", e.g., 22Ω) and a first transient-voltage-suppression (TVS) diode 522B ("D1"). A value of 22Ω for the first ESD resistor 522A is a suitable starting value for signal integrity, as using a capacitor may slow down the signal and using a higher resistance would result in an impedance of the signal as opposed to merely smoothing the signal, the desired result. The 22Ω value may be increased after ESD/signal integrity experiments determine that additional smoothing is required. For example, previous experiments have already determined that the series resistances of the transmission line in the tone detection circuit should be approximately 200Ω due to the type of signal input (see FIG. 6B) that is expected to be observed in the input side of that circuit. Note that many ESD and signal integrity methods are known to those skilled in the art and may easily be substituted here or even removed entirely if providing protection for the circuit components is unnecessary.

The line input buffer 520 further includes a first galvanic isolator and voltage scaler subcircuit 524, 525A, 525B, 525C, 525D. In some embodiments, the audio line ground 509 ("LINE_GND") is coupled to the first galvanic isolator and voltage scaler subcircuit 524, 525A, 525B, 525C, 525D. In embodiments of the line input buffer 520 that include a first electrostatic discharge (ESD) and transient protection subcircuit 522A, 522B, the first galvanic isolator and voltage scaler subcircuit 524, 525A, 525B, 525C, 525D is coupled to the first electrostatic discharge (ESD) and transient protection subcircuit 522A, 522B. In embodiments of the line input buffer 520 that do not include an electrostatic discharge (ESD) and transient protection subcircuit, the first galvanic isolator and voltage scaler subcircuit 524, 525A, 525B, 525C, 525D is configured to receive the first input signal. In some embodiments, the first galvanic isolator and voltage scaler subcircuit 524, 525A, 525B, 525C, 525D includes a first transformer 524 ("T1"). In some such embodiments, the first transformer 524 ("T1") performs both galvanic isolation and voltage scaling functions. In other embodiments, the first galvanic isolator and voltage scaler subcircuit 524, 525A, 525B, 525C, 525D includes a first transformer 524 ("T1") and a first voltage scaler 525A, 525B, 525C, 525D coupled to the first transformer 524 ("T1"). In some embodiments, the audio line ground 509 ("LINE_GND") is coupled to the first transformer 524 ("T1"). In some embodiments, no amplification nor attenuation from the first transformer 524 is needed, so the first transformer 524 is 1:1. In other embodiments, the first transformer 524 is configured to have another ratio of primary and secondary coils to achieve the attenuation or amplification effects of voltage scaling. In still other embodiments, the first galvanic isolator and voltage scaler subcircuit 524, 525A, 525B, 525C, 525D includes an opto-isolator. In some such embodiments involving the opto-isolator or other isolation component, the voltage scaling is approximately 1. Note that this scale factor applies only to the isolation component, not to the entire first galvanic isolator and voltage scaler subcircuit 524, 525A, 525B, 525C, 525D, as additional scaling and/or attenuation may be required.

In some embodiments, the first voltage scaler 525A, 525B, 525C, 525D includes a first voltage divider 525A, 525B coupled to the first transformer 524 ("T1"). In some embodiments, the first voltage divider 525A, 525B includes a plurality of resistors 525A, 525B ("R2" and "R3"). In some embodiments, the first voltage divider 525A, 525B generates a ratio of approximately 50% (e.g., "R2" and "R3" are both 1 kΩ); i.e., it halves the output of the first transformer 524 so that the signal is in the appropriate range for the MCU 513. The 50% ratio permits the line input buffer 520 to obtain the signals for a wide variety of legacy intercom systems. In some embodiments, the first voltage scaler 525A, 525B, 525C, 525D further includes a second voltage divider 525C, 525D coupled to the first voltage divider 525A, 525B, where the bottom side of the output of the first transformer 524 is connected to the second voltage divider 525C, 525D. In some embodiments, the second voltage divider 525C, 525D includes a plurality of resistors 525C, 525D ("R4" and "R5"). In some embodiments, the second divider 525C, 525D generates a ratio of approximately 50% (e.g., "R4" and "R5" are both 10 kΩ); i.e., it biases the signal about the midpoint (half) of the supply voltage, $V_{cc}$ 526 (e.g., 2.5 V). It would be apparent to those skilled in the art to alter the first voltage divider 525A, 525B and the second voltage divider 525C, 525D to achieve the necessary voltage scaling, such as combining the two voltage dividers into a single voltage divider that includes a plurality of resistors.

The line input buffer 520 further includes a first voltage buffer 527 coupled to the first galvanic isolator and voltage scaler subcircuit 524, 525A, 525B, 525C, 525D, wherein the first voltage buffer 527 is configured to transmit a first output signal 529 ("LINE_IN_BUF") to a processor 513. In some embodiments, the processor 513 is a microcontroller unit (MCU) 513. In some embodiments, the first voltage buffer 527 is an operational amplifier 527 ("OPAMP2"). Other implementations of the first voltage buffer 527 would be apparent to those skilled in the art. In some embodiments, the first voltage buffer 527 is coupled to the first voltage scaler 525A, 525B, 525C, 525D. In some embodiments, the first voltage buffer 527 is coupled to the first voltage divider 525A, 525B. In some embodiments, the first voltage buffer 527 is operational in the frequency range 200 Hz-4,000 Hz as well as in power supply ranges up to 2.5 V. Although human hearing typically detects sounds ranging from 20 Hz to 20,000 Hz, the frequencies that correspond to human speech are at the lower end of that range (around 300 Hz to 3,400 Hz), so an operational frequency range of 200 Hz-4,000 Hz is sufficient to transmit human voice intelligibly. Shutdown functionality with low supply current across up to four voltage buffers (e.g., four operational amplifiers) for high energy efficiency may also be desired. In some embodiments, the line input buffer 520 further includes a voltage-limiting subcircuit 528 coupled to the first voltage buffer 527, which limits an input to the first voltage buffer 527 to within a predefined threshold if this input were to exceed the supply voltage $V_{cc}$ 526 (e.g., 2.5 V). In some embodiments, the predefined threshold is the supply voltage $V_{cc}$ 526 (e.g., 2.5 V). In some embodiments, the voltage-limiting subcircuit 528 is a Schottky barrier diode 528 ("D2"). In other embodiments, the voltage-limiting subcircuit 528 is a regulator, a divider, or another type of diode.

The line output driver 530 receives as input a second input signal 531 ("DAC_OUT") from the microcontroller unit (MCU) 513, which represents an audio signal. The line output driver 530 includes a second voltage buffer 532 configured to receive a second input signal from the MCU 513. In some embodiments, the second voltage buffer 532 is an operational amplifier 532 ("OPAMP3"). Other implementations of the second voltage buffer 532 would be apparent to those skilled in the art. The line output driver 530 further includes a high-pass filter 533, 534 coupled to the second voltage buffer 532. In some embodiments, the high-pass filter 533, 534 is a DC block, filtering out frequencies below a pre-determined threshold. In some embodiments, the high-pass filter 533, 534 is implemented as a capacitor 533 ("C3") operating in conjunction with a second transformer 534, where the capacitor 533 ("C3") is a first component of the high-pass filter 533, 534, and the second transformer 534 is a second components of the high-pass filter 533, 534. The line output driver 530 further includes a second galvanic isolator and voltage scaler subcircuit 534, 535A, 535B coupled to the high-pass filter 533, 534. In some embodiments, the audio line ground 509 ("LINE_GND") is coupled to the second galvanic isolator and voltage scaler subcircuit 534, 535A, 535B. In some embodiments, the high-pass filter 533, 534 and the second galvanic isolator and voltage scaler subcircuit 534, 535A, 535B share a component, a resistive element 534. In some embodiments, the resistive element 534 is a second transformer 534 ("T2"), wherein the second transformer 534 includes a plurality of windings. In some such embodiments, the second transformer 534 ("T2") performs both galvanic isolation and voltage scaling functions. In some embodiments, the audio line ground 509 ("LINE_GND") is coupled to the second transformer 534 ("T2"). In other embodiments, the second galvanic isolator and voltage scaler subcircuit 534, 535A, 535B includes a second transformer 534 ("T2") and a second voltage scaler 535A, 535B coupled to the second transformer 534 ("T2"). In some embodiments, no amplification nor attenuation from the second transformer 534 is needed, so the second transformer 534 is 1:1.

By modeling the primary winding of the transformer as a resistive impedance of 600Ω, the capacitor 533 (e.g., C3=10 μF) is being part of a high-pass filter with a cutoff frequency of approximately 26 Hz. The capacitor value may change as long as the cutoff frequency does not interfere with the minimum target voice frequency that the transformer is sourced for, namely approximately 200 Hz, which corresponds to a minimum capacitance of approximately 1.3 μF. This filter design may easily be modified depending on the target frequencies or desired filter selection (e.g., using a high-pass filter that includes an operational amplifier or an inductor). In some embodiments, the value of the capacitor 533 is based on the impedance of the selected second transformer 534. In some embodiments, a capacitance of 10 μF for the capacitor 533 and an impedance of 600Ω for the second transformer 534 perform well with legacy intercom systems. To avoid applying a load to the legacy intercom system output that is greater than what a standard apartment panel would apply, in some embodiments, the DC resistance of each winding of the plurality of windings of the second transformer 534 is higher than the resistance of the legacy station speaker that it is replacing. In some embodiments, the DC resistance of each winding of the plurality of windings of the second transformer 534 is 115Ω. In other embodiments, the same effect is achieved by including a compensating series resistor so that the DC resistance of each winding of the plurality of windings of the second transformer 534 may be lower than the resistance of the legacy station speaker that it is replacing. In some embodiments, the second transformer 534 is suitable for voice audio. For example, the TTC-5023 transformer supports a range of audio signals of 200 Hz-4,000 Hz.

In some embodiments, the second voltage scaler 535A, 535B includes a third voltage divider 535A, 535B coupled to the second transformer 534 ("T2"). In some embodiments, the third voltage divider 535A, 535B includes a plurality of resistors 535A, 535B ("R7" and "R10"). In some embodiments, the audio line ground 509 ("LINE_GND") is coupled to at least one of plurality of resistors 535A, 535B ("R7" and "R10"). In some embodiments, the third voltage divider 535A, 535B generates a ratio of approximately 4.5% (e.g., "R7" is 1 kΩ and "R10" is 47Ω), which closely approximates the signal range expected to be fed into an amplifier of a legacy intercom system. The determination of the 4.5% ratio took some experimentation of various values to discover due to the very low input that is typically sent from legacy intercom stations to amplifiers in legacy intercom systems, which results from using a speaker as a "reverse microphone" in most analog applications. Feeding in too high of a value would likely damage the legacy system by overloading the amplifier. Exemplary tuning operations include: performing signal sweeps of signal to be fed into A/D converter to examine the attenuation of audio signals fed through the input transformer, performing signal sweeps to simulate D/A converter operations to examine the attenuation and degradation of audio sent through the output transformer, and experimenting with various DC offsets to bias the input and output signals within the rail voltages of the voltage buffer (e.g. the operational amplifier) as well as the A/D and D/A converters on the MCU 513. For impedance matching, 50Ω is the appropriate speaker impedance required to avoid incurring audio interference back at the front door speaker.

In some embodiments, the line output driver 530 further includes a second electrostatic discharge (ESD) and transient protection subcircuit 536A, 536B coupled to the second galvanic isolator and voltage scaler subcircuit 534, 535A, 535B and configured to transmit a second output signal 537 ("LINE_OUT_BLD_REF") to the wiring interface 511 for the legacy intercom system. In some embodiments, the audio line ground 509 ("LINE_GND") is coupled to the second electrostatic discharge (ESD) and transient protection subcircuit 536A, 536B. In some embodiments, the second electrostatic discharge (ESD) and transient protection subcircuit 536A, 536B includes a second ESD resistor 536B ("R8", e.g., 22Ω) and a second transient-voltage-suppression (TVS) diode 536A ("D3"). In other embodiments, the line output driver 530 does not includes a second electrostatic discharge (ESD) and transient protection subcircuit, in which case the second galvanic isolator and voltage scaler subcircuit 534, 535A, 535B is configured to transmit a second output signal 537 ("LINE_OUT_BLD_REF") to the wiring interface 511 for the legacy intercom system In some embodiment, the line input buffer 520 and the line output driver 530 are partially or completely disabled upon normal operation of the intercom station until either "talk" or "listen" commands are initiated correspondingly. Thus, power consumption is minimized.

Figure 5C:
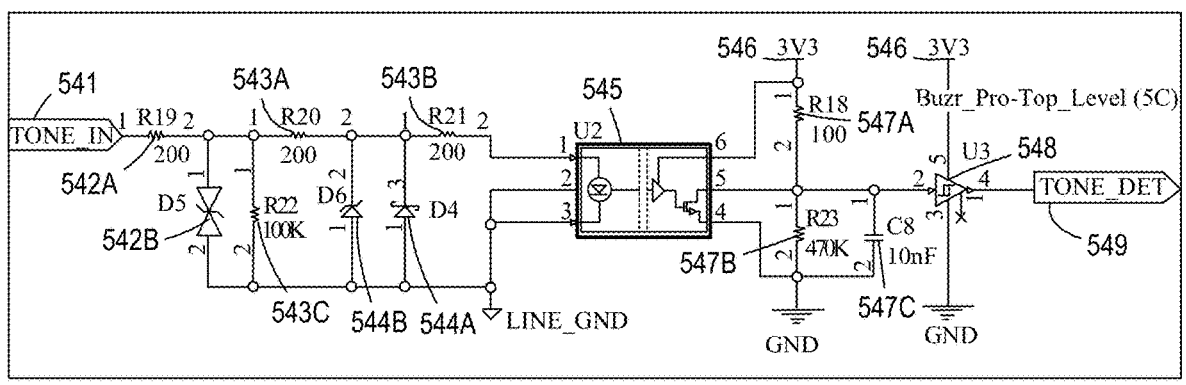
FIG. 5C shows an exemplary circuit diagram of the tone detection subsystem of the exemplary intercom station, in accordance with some embodiments of the invention.

FIG. 5C shows an exemplary circuit diagram 540 of the tone detection subsystem of the exemplary intercom station, in accordance with some embodiments of the invention. In some embodiments, as shown in the circuit diagram, an audio line ground ("LINE_GND") is a common line from the legacy intercom system, and a "GND" is an electrical ground. The tone detection subsystem detects that a guest is activating the doorbell 134 (and thus requesting to be buzzed in or to talk to the user) by inputting a tone in signal 541 ("TONE_IN") and generating a tone detection signal 549 ("TONE_DET"). The tone in signal 541 ("TONE_IN") is passed through the mount plate PCB without any connectivity to the isolation or relay subcircuits. It is first fed into an ESD/signal integrity subcircuit 542A, 542B, which in some embodiments is comprised of a resistor 542A ("R19") and a TVS diode 542B ("D5"), similar to those present in the line input buffer and line output driver. The signal then is fed through additional protection sub-circuitry 543A, 543B, 543C, 544A, 544B, which in some embodiments comprises a plurality of resistors 543A, 543B, 543C ("R20", "R21", and "R22") and a first diode 544A ("D4") (e.g., BAT54 or a similar Zener diode), a second diode 544B ("D6") (e.g., BZT52C3V3S-7 or a similar Schottky rectifier diode) before being fed into an isolator 545 ("U2"). In some embodiments, the isolator 545 ("U2") is configured as an open collector device. Accordingly, pin 6 of the isolator 545 ("U2") is connected directly to the 3.3 V voltage source 546, pin 4 is fed directly to ground, and pin 5 (which is seen as the output of the isolator 545) is connected into a small voltage divider 547A, 547B, which in some embodiments comprises a top resistor 547A ("R18") and a bottom resistor 547B ("R23"), with the top resistor 547A ("R18") serving as a pullup resistor of the output line. In some embodiments, a small load capacitor 547C is placed on the output line to provide signal stability.

In some embodiments, the isolator 545 ("U2") operates as follows: If the input signal is a logic "1", the light-emitting diode (LED) in the isolator 545 ("U2") may engage, which will cause a logic "1" to appear at the gate of the internal transistor. When this transistor is activated, current from the 3.3 V voltage source has a path of lowest impedance that passes through the transistor directly to ground, as opposed to flowing through the top 547A and bottom resistors 547B

("R18" & "R23"). This causes the output of the isolator 545 ("U2"), i.e., the input of the Schmitt trigger 548 ("U3"), to be a logic "0". As the Schmitt trigger 548 ("U3") is non-inverting, the output of the Schmitt trigger 548 ("U3"), namely the tone detection signal 549 ("TONE_DET"), is a logic "0". Alternatively, if a logic "0" is sent as an input signal, both sides of the internal LED will be at low voltage, and no current is able to flow inside the isolator 545 ("U2"). This causes the internal transistor to be turned off. When this occurs, the output (pin 5) of the isolator 545 ("U2") is automatically pulled up to 3.3 V as provided by the voltage source, which corresponds to a logic "1". The output of the Schmitt trigger 548 ("U3"), namely the tone detection signal 549 ("TONE_DET"), is thus a logic "1". In some embodiments, the Schmitt trigger 548 ("U3") is implemented as an operational amplifier 548. Experimental data demonstrating the operation of the tone detection subsystem is described with reference to FIG. 6C. Additional design considerations have been taken to improve power efficiency by removing the need for inverting logic, and therefore removing the constant connection from the 3.3 V voltage source 546 to the resistive load of the top 547A and bottom resistors 547B ("R18" & "R23"); however, the overall functionality of the circuit remains the same. In some embodiments, the circuit also formats the input analog waveform into a digital format bound by ground and 3.3 V.

Figure 5D:
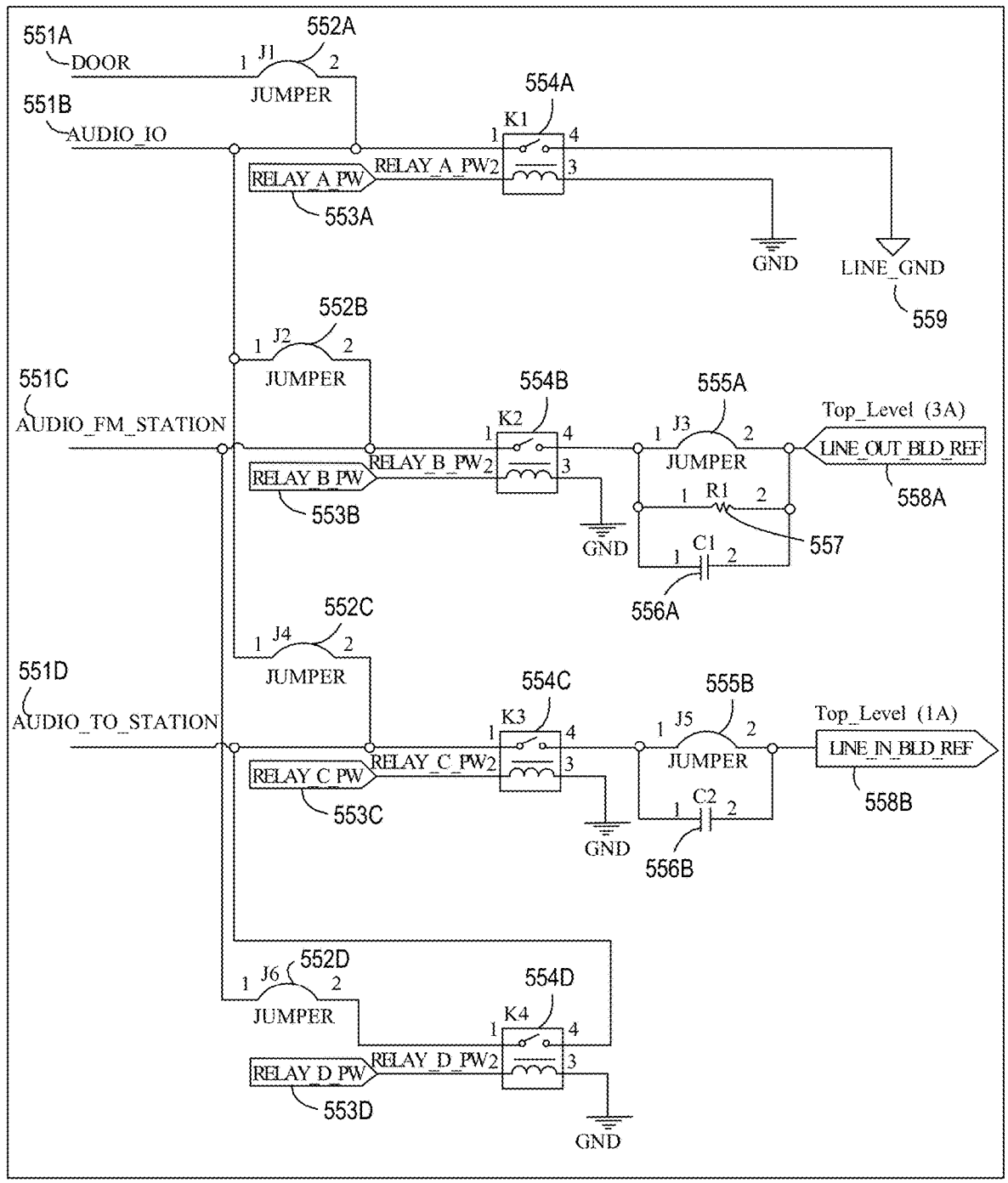
FIG. 5D shows an exemplary circuit diagram of the universal relay subsystem of the exemplary intercom station, in accordance with some embodiments of the invention.

FIG. 5D shows an exemplary circuit diagram 550 of the universal relay subsystem of the exemplary intercom station, in accordance with some embodiments of the invention. When used in combination with the audio isolation circuit shown in FIG. 5E, these circuits may implement the functional block diagram of the exemplary intercom station with separate universal relay and audio isolation subsystems as shown in FIG. 4C. The universal relay subsystem includes a series of relays 554A, 554B, 554C, 554D ("K1", "K2", "K3", "K4") connected to various signals from an analog legacy intercom system. Relay A 554A ("K1") allows connectivity to be made between the audio input-output 551B ("AUDIO_IO") and audio line ground 559 ("LINE_GND") signals of 3-wire systems. Note that in some embodiments and technical documentation, "LINE_GND" may be referred to as "AUDIO_COM". It may also be configured to make a connection between the doorbell 551A ("Door") and audio line ground 559 ("LINE_GND") signals of 5- and 6-wire systems, depending on the configuration of the corresponding jumper 552A ("J1"). This connection may be used for door buzz operations. Alternatively, relay D 554D ("K4") may be used to make a connection between the audio from station 551C ("AUDIO_FM_STATION") and audio to station 551D ("AUDIO_TO_STATION") signals, which performs the door buzz operation in 4-wire systems when Jumper 6 552D ("J6") is connected.

Audio communication may be performed in a similar manner. As described earlier with reference to FIGS. 5A and 5B, the universal relay and audio isolation subsystems in the wiring interface 511 for the legacy intercom processes the audio signal 551D ("AUDIO_TO_STATION") and transmits another audio signal ("LINE_IN_BLD_REF") 558B to a line input buffer 520 of an audio input-output (I/O) circuit 512. Similarly, the wiring interface 511 for the legacy intercom receives an audio signal 558A ("LINE_OUT_BLD_REF") from a line output driver 530 of the audio input-output (I/O) circuit 512. The audio signal 558B ("LINE_IN_BLD_REF") is audio coming from the building via the audio to station signal 551D ("AUDIO_TO_STATION") (for 4-, 5-, and 6-wire systems) or via the audio input-output signal 551B ("AUDIO_IO") (for 3-wire systems), depending on the configuration of Jumper 4 552C ("J4"), and may be sent to the main board by energizing relay C 554C ("K3"). Similarly, an audio signal 558A ("LINE_OUT_BLD_REF") sent from the line output driver 530 back to the building via the audio from station signal ("AUDIO_FM_STATION") (for 4-, 5-, and 6-wire systems) or the audio input-output signal 551B ("AUDIO_IO") (for 3-wire systems), depending on the configuration of Jumper 2 552B ("J2"), and may be sent from the main board back to the legacy station by energizing relay B 554B ("K2").

Jumpers 3 555A ("J3") and 5 555B ("J5") may bypass passive components if required in specific systems. In some embodiments, some or all jumpers are replaced by toggle switches or similar devices to increase useability by end users.

Figure 5E:
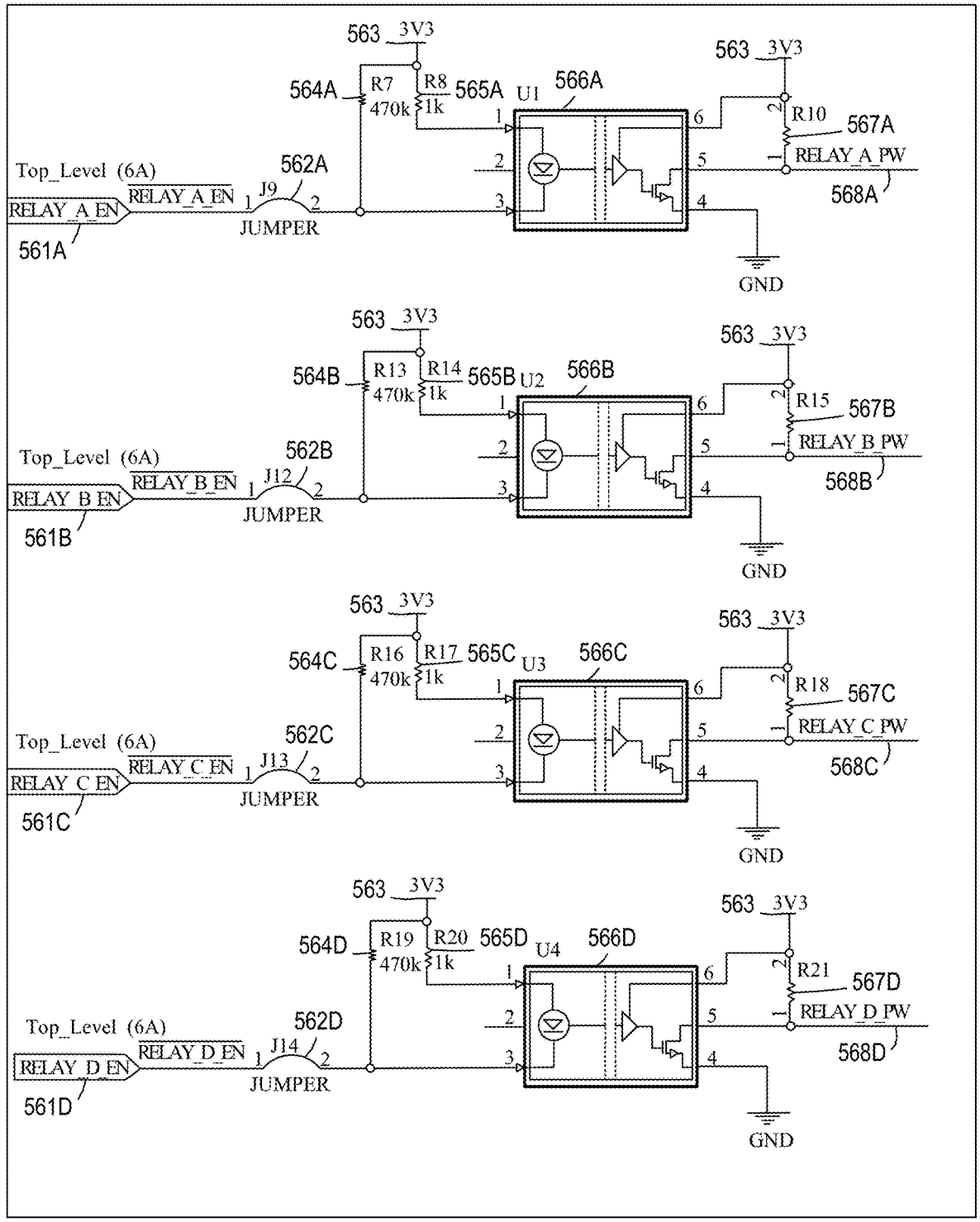
FIG. 5E shows an exemplary circuit diagram of the audio isolation subsystem of the exemplary intercom station, in accordance with some embodiments of the invention.

FIG. 5E shows an exemplary circuit diagram 560 of the audio isolation subsystem of the exemplary intercom station, in accordance with some embodiments of the invention. When used in combination with the universal relay circuit shown in FIG. 5D, these circuits may implement the functional block diagram of the exemplary intercom station with separate universal relay and audio isolation subsystems as shown in FIG. 4C. In some embodiments, Jumpers 9 562A ("J9"), 12 562B ("J12"), 13 562C ("J13"), and 14 562D ("J14"), are closed by default and are inserted for prototyping purposes only. Enable signals are sent to the isolators 566A, 566B, 566C, 566D ("U1", "U2", "U3", and "U4"). For each isolator 566A, 566B, 566C, 566D, if the input signal is a logic "0", the light-emitting diode (LED) in the isolator may engage, which will cause a logic "1" to appear at the gate of the internal transistor. As the output of an isolator 566A, 566B, 566C, 566D is pulled up to 3.3 V provided by a voltage source 563 (logic "1") via the pullup resistors 567A, 567B, 567C, 567D ("R10", "R15", "R18", and "R21"), energizing this transistor will allow current from that voltage source 563 to flow to ground via the transistor and will result in a logic "0" on the RELAY_X_PW 568A, 568B, 568C, 568D (where "X" is "A", "B", "C", or "D") line corresponding to the input. Alternatively, if a logic "1" is sent as an input signal, both sides of the internal LED will be high voltage, and no current is able to flow inside the isolator 566A, 566B, 566C, 566D. This causes the internal transistor to be turned off. When this occurs, the output (pin 5) of the isolator 566A, 566B, 566C, 566D is automatically pulled up to 3.3 V as provided by the voltage source 563, which corresponds to a logic "1".

Figure 5F:
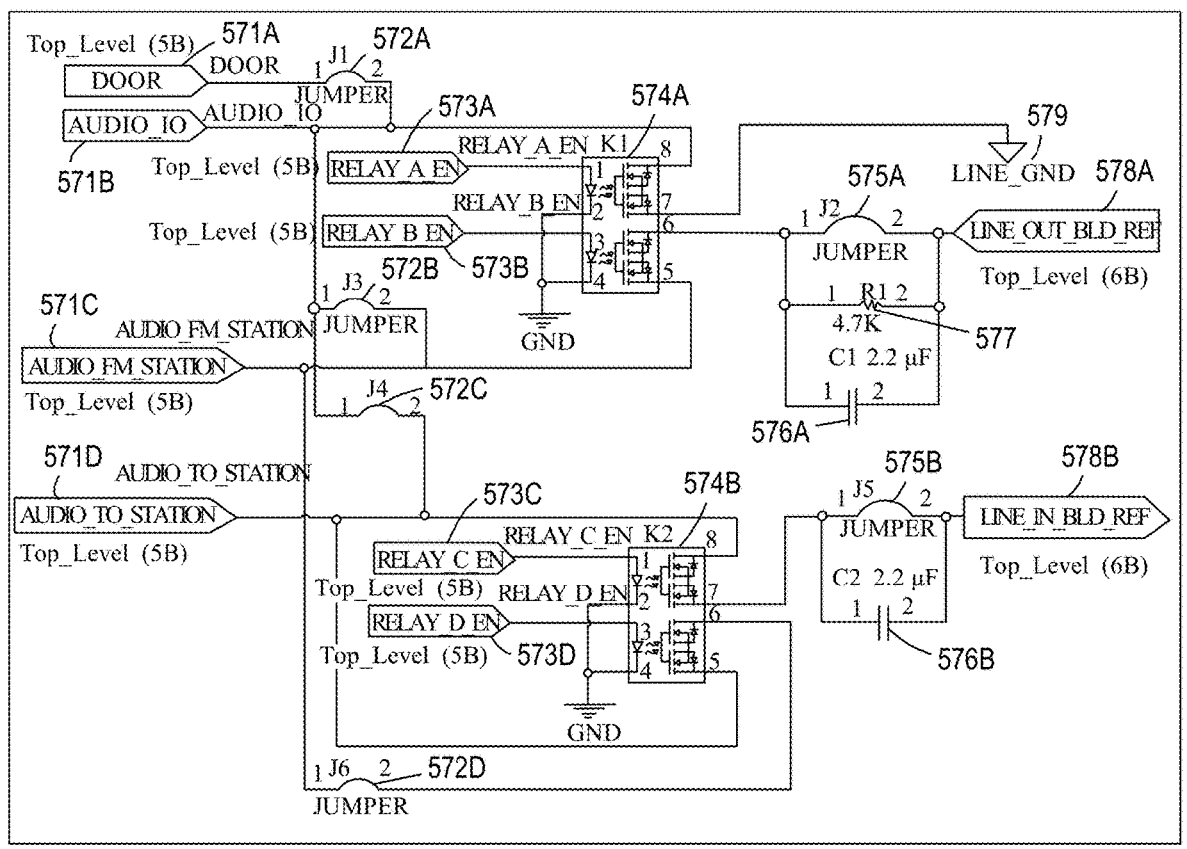
FIG. 5F shows an exemplary circuit diagram of the combined audio isolation and universal relay subsystems of the exemplary intercom station, in accordance with some embodiments of the invention.

FIG. 5F shows an exemplary circuit diagram 570 of the combined audio isolation and universal relay subsystems of the exemplary intercom station, in accordance with some embodiments of the invention. This circuit may implement the functional block diagram of the exemplary intercom station with combined universal relay and audio isolation subsystems as shown in FIG. 4D. This embodiment combines FIGS. 5D and 5E into a single circuit. Components 574A ("K1") and 574B ("K2") each comprise two relays. Let the relays in component 574A ("K1") be "Relay A" and "Relay B", and the relays in component 574B ("K2") be "Relay C" and "Relay D", corresponding to their enable signals. Relay A ("K1") allows connectivity to be made between audio input-output 571B ("AUDIO_IO") and audio line ground 579 ("LINE_GND") signals of 3-wire systems. Note that in some embodiments and technical documentation, "LINE_GND" may be referred to as "AUDIO_COM". It may also be configured to make a connection between the doorbell 571A ("Door") and audio line ground 579 ("LINE_GND") signals of 5- and 6-wire systems, depending on the configuration of the corresponding jumper 572A ("J1"). This connection may be used for door buzz operations. Alternatively, relay D ("K4") may be used to make a connection between the audio from station 571C ("AUDIO_FM_STATION") and audio to station 571D ("AUDIO_TO_STATION") signals, which performs the door buzz operation in 4-wire systems when Jumper 6 572D ("J6") is connected.

Audio communication may be performed in a similar manner. As described earlier with reference to FIGS. 5A and 5B, the universal relay and audio isolation subsystems in the wiring interface 511 for the legacy intercom processes the audio signal 571D ("AUDIO_TO_STATION") and transmits another audio signal 578B ("LINE_IN_BLD_REF") to a line input buffer 520 of an audio input-output (I/O) circuit 512. Similarly, the wiring interface 511 for the legacy intercom receives an audio signal 578A ("LINE_OUT_BLD_REF") from a line output driver 530 of the audio input-output (I/O) circuit 512. The audio signal 578B ("LINE_IN_BLD_REF") is audio coming from the building via the audio to station signal 571D ("AUDIO_TO_STATION") (for 4-, 5-, and 6-wire systems) or via the audio input-output signal 571B ("AUDIO_IO") (for 3-wire systems), depending on the configuration of Jumper 4 572C ("J4"), and may be sent to the main board by energizing relay C (part of "K2"). Similarly, an audio signal 578A ("LINE_OUT_BLD_REF") sent from the line output driver 530 back to the building via the audio from station signal 571C ("AUDIO_FM_STATION") (for 4-, 5-, and 6-wire systems) or the audio input-output signal 571B ("AUDIO_IO") (for 3-wire systems), depending on the configuration of Jumper 3 572B ("J3"), and may be sent from the main board back to the legacy station by energizing relay B (part of "K1").

Jumpers 2 575A ("J2") and 5 575B ("J5") may bypass passive components if required in specific systems. In some embodiments, some or all jumpers are replaced by toggle switches or similar devices to increase useability by end users.

FIGS. 6A, 6B, 6C, and 6D show various exemplary electrical waveforms associated with an exemplary legacy intercom system and an exemplary intercom station, in accordance with some embodiments of the invention. Most attempted isolation methods could not successfully extract ring signals (or listen signals) due to low amplitude thresholds. To solve this problem, simultaneously selecting a specific isolation method as well as tuning the passive network leads to the isolator system disclosed herein. With reference to the tone detection system shown in FIG. 5C, the resistances R19, R20, and R21 are increased up to around 200Ω to limit the potential of damage to the isolator. Various diode combinations were attempted to both prevent damage as well as limit noise on the signal line. Note that the "LINE_GND" line shown in the various figures is not an electrical ground but rather is a common audio line from the legacy intercom system. Incorrect installation or different specifications of legacy systems may cause unforeseen behaviors that the universal intercom station must protect against. Furthermore, note that in some embodiments and technical documentation, "LINE_GND" may be referred to as "AUDIO_COM".

Figure 6A:
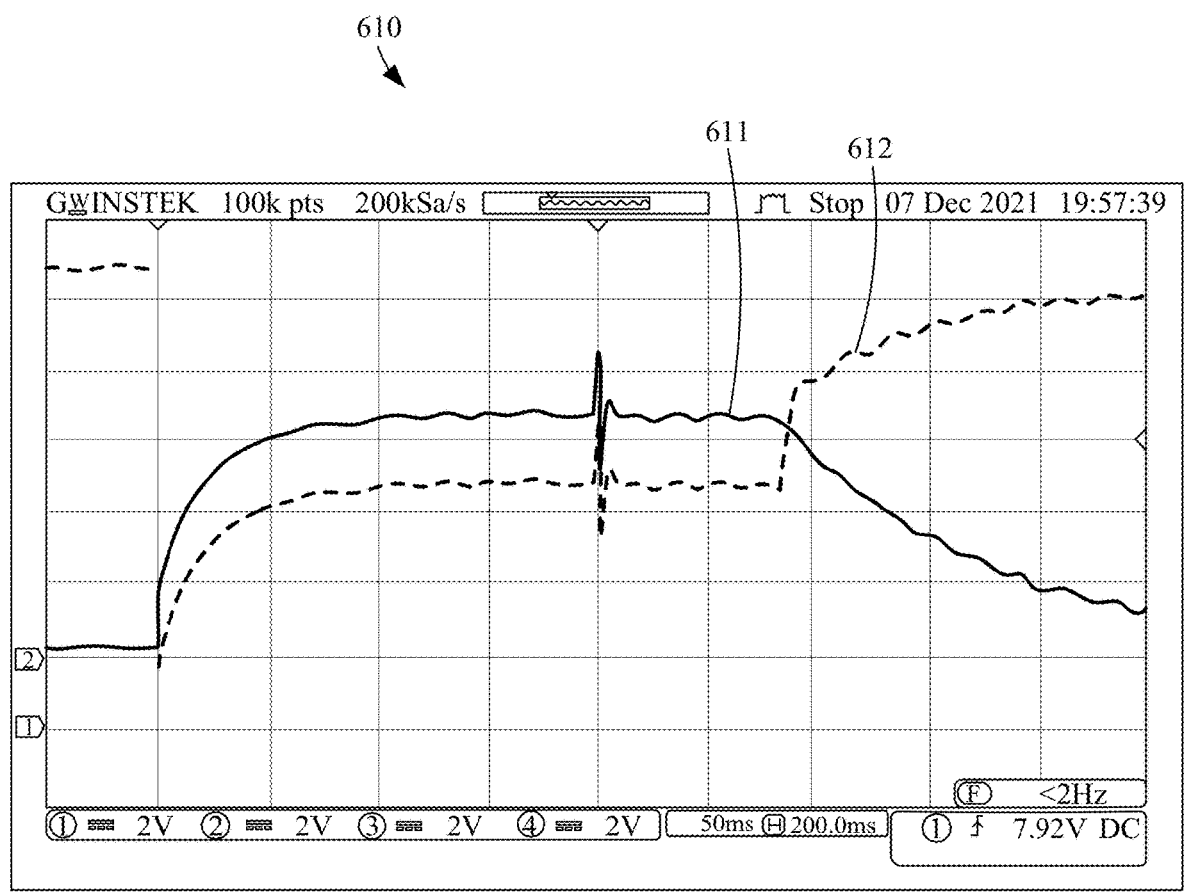
FIG. 6A shows exemplary electrical waveforms of a door buzz signal from the intercom station of an exemplary legacy intercom system, in accordance with some embodiments of the invention.

FIG. 6A shows exemplary electrical waveforms 610 of a door buzz signal from the intercom station of an exemplary legacy intercom system, in accordance with some embodiments of the invention. With reference to the analog legacy wiring interface, audio isolation, and universal relay subsystems discussed above regarding FIGS. 5A, 5B, 5C, 5D, 5E, and 5F, the solid waveform 611 represents the signal detected on the AUDIO_TO_STATION line and the waveform 612 represents the signal detected on the AUDIO_F-ROM_STATION line when a door buzz operation is performed on a 4-wire analog PK543 intercom station, which entails shorting the two aforementioned lines. It would be apparent to those skilled in the art to replicate the necessary door buzz signal based on the experiments performed on legacy intercom stations such as the 4-wire analog PK543 intercom station. Note that digital systems, in contrast, generally do not send door buzz signals by merely shorting two wires, but instead send instructions to an intercom central unit (ICU). In some embodiments, the wires are shorted for at least a minimum period of time regardless of how long the "door" button is pressed by a user.

In an example configuration of the PK543, pressing the "door" button on a 4-wire analog PK543 intercom station applies a closure across the intercom station's terminals 2 and 3. The closure is routed to the PK543 amplifier's terminals 2 and 3. After the amplifier senses the closure, it provides 16 V of AC voltage across the amplifier's terminals D and K. Meanwhile, DC voltage is also present across terminals L+ and L− as the unfiltered output of a full-wave rectifier fed by the same 16 V of AC voltage, which is applied to the door release mechanism to unlock the door. In one variation, a closure the across the PK543 amplifier's terminals 1 and E can be used to output 16 V of AC voltage across the amplifier's terminals D and K.

Figure 6B:
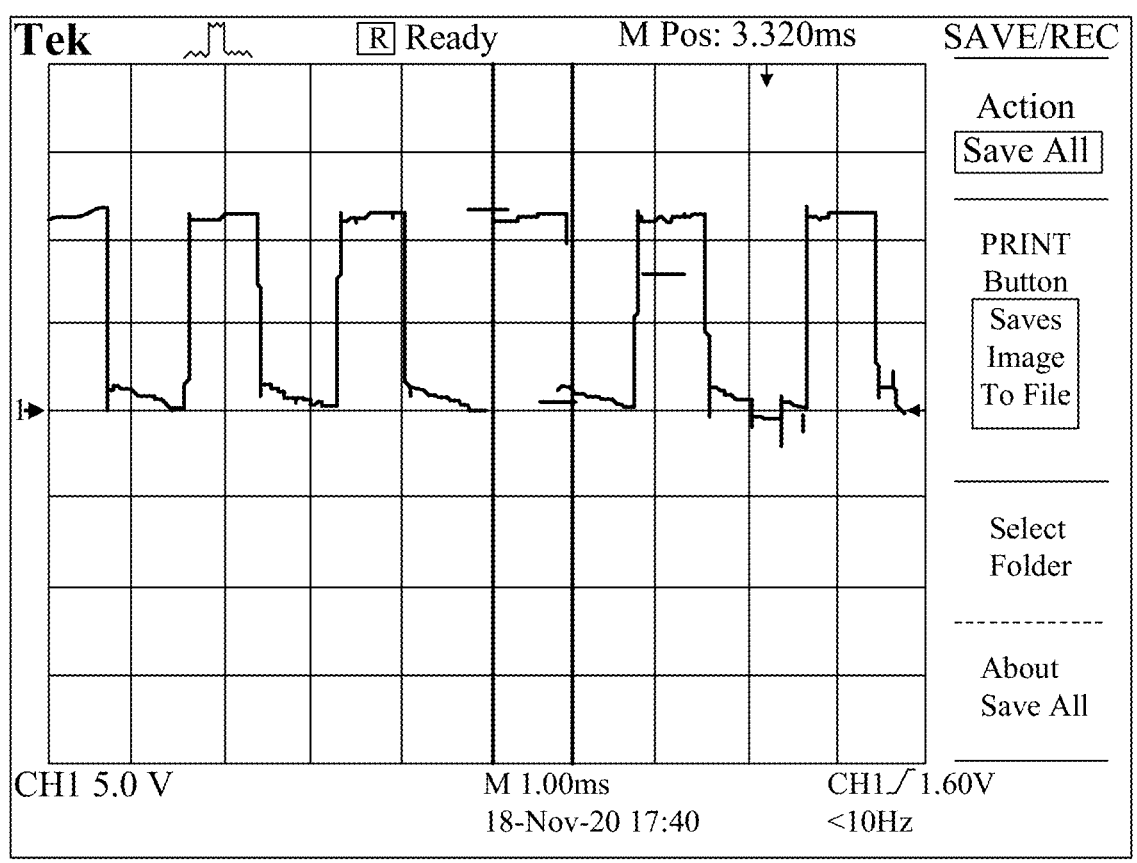
FIG. 6B shows an exemplary electrical waveform of a door ring signal from the lobby panel of an exemplary legacy intercom system, in accordance with some embodiments of the invention.

FIG. 6B shows an exemplary electrical waveform 620 of a door ring signal from the lobby panel of an exemplary legacy intercom system, in accordance with some embodiments of the invention.

Figure 6C:
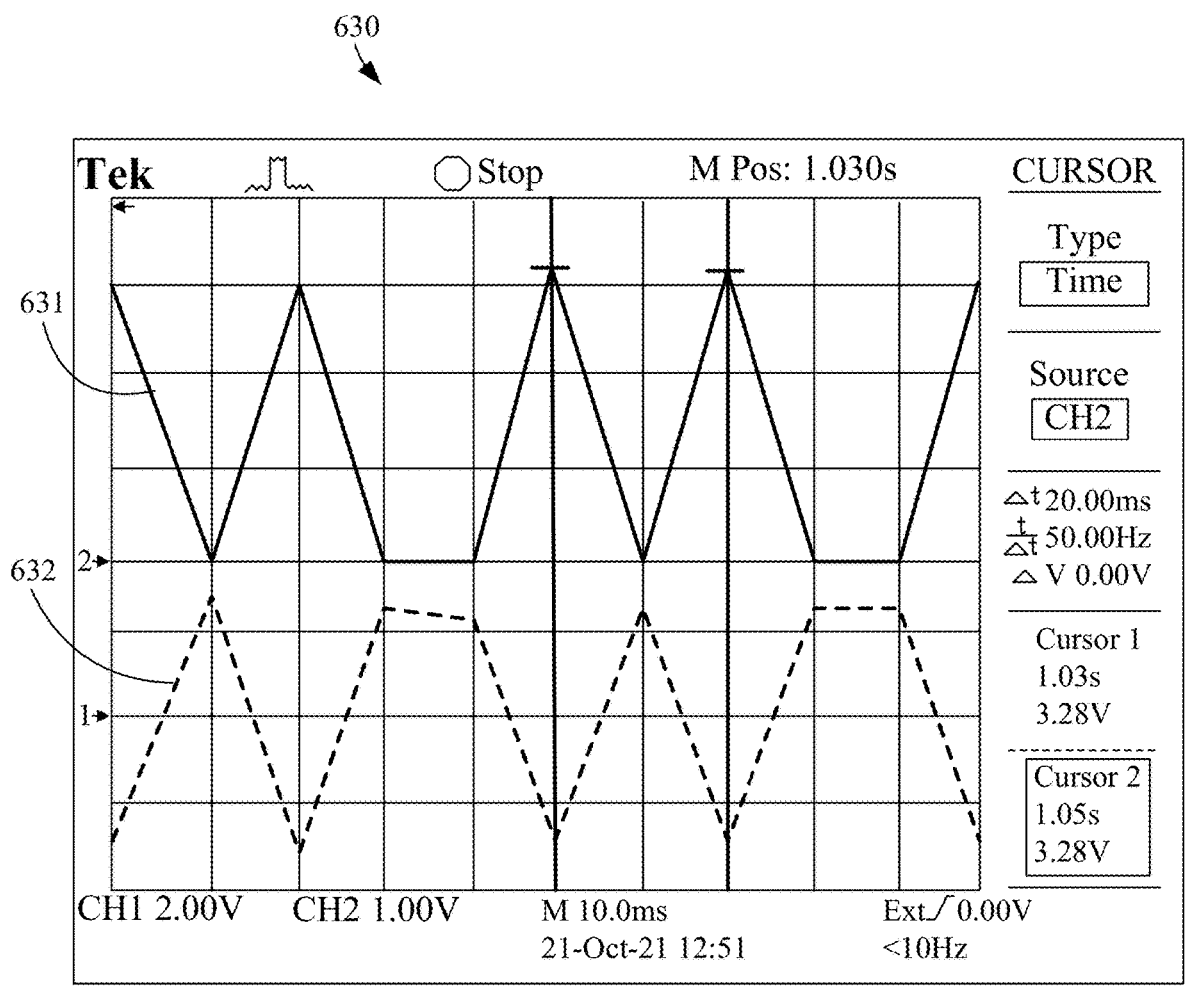
FIG. 6C shows exemplary electrical waveforms of a door ring signal from the lobby panel of an exemplary legacy intercom system and the response from the tone detection subsystem of an exemplary intercom station, in accordance with some embodiments of the invention.

FIG. 6C shows exemplary electrical waveforms of a door ring signal from the lobby panel of an exemplary legacy intercom system and the response from the tone detection subsystem of an exemplary intercom station, in accordance with some embodiments of the invention. With reference to the tone detection circuit described above regarding FIG. 5C, the solid waveform 631 represents the tone detection signal ("TONE_DET") and the waveform 632 represents the tone in signal ("TONE_IN"). These waveforms confirm that the tone detection circuit described above regarding FIG. 5C operates as intended, by inverting, scaling, and limiting the tone in signal appropriately.

Figure 6D:
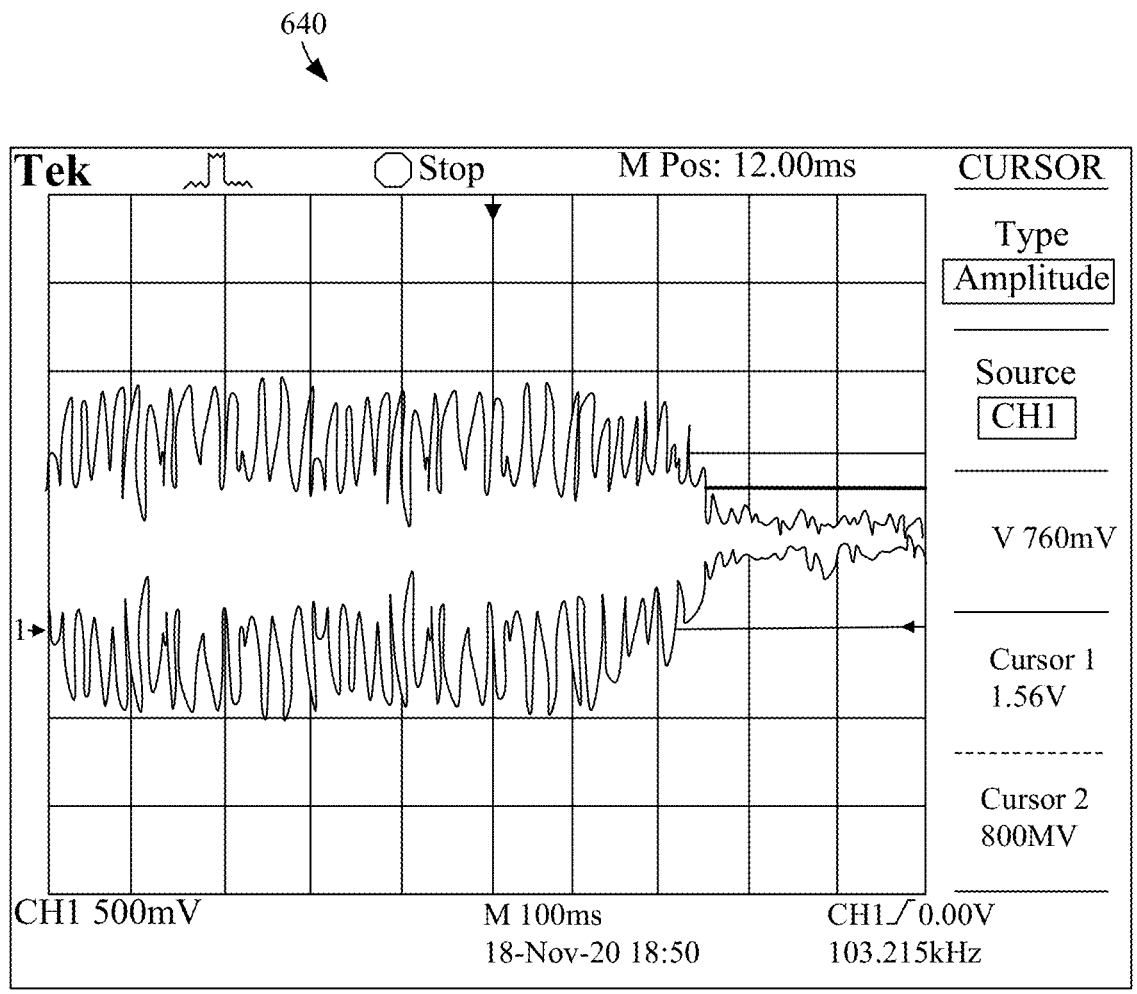
FIG. 6D shows an exemplary electrical waveform of a user yelling into the microphone of the lobby panel of an exemplary legacy intercom system, in accordance with some embodiments of the invention.

FIG. 6D shows an exemplary electrical waveform 640 of a user yelling into the microphone of the lobby panel of an exemplary legacy intercom system, in accordance with some embodiments of the invention.

Audio System

Figure 7A:
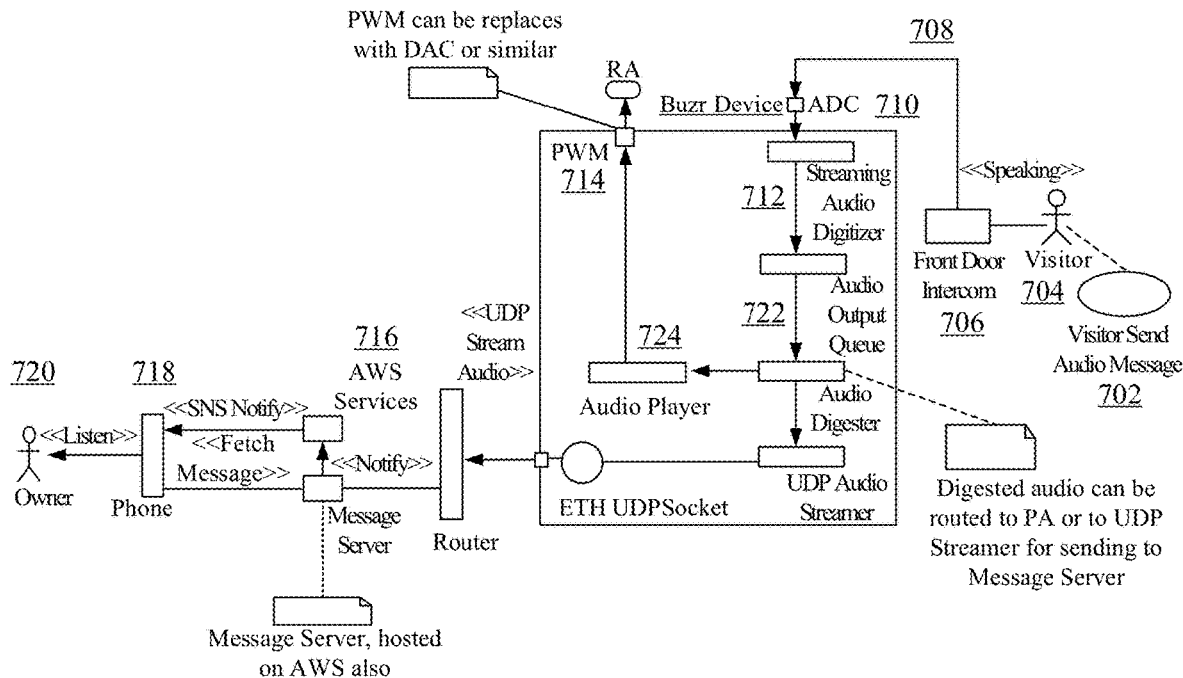
FIG. 7A shows a schematic of various components of an exemplary intercom system, including components of an exemplary intercom station, when a guest speaks to a user, in accordance with some embodiments of the invention.

FIG. 7A shows a schematic of various components of an exemplary intercom system, including components of an exemplary intercom station, when a guest speaks 704 to a user 720, in accordance with some embodiments of the invention. In some embodiments, the audio signal 702 from the intercom lobby 706 (e.g., a guest's audio message) goes through an isolation component or buffer circuit on a printed circuit board (PCB) (not shown) in the intercom station. The output 708 from the isolation component or buffer circuit 704 is then inputted into an ADC 710 on the processor (e.g., the microcontroller), which digitizes the audio signal 708 and organizes it into digital packets sent to an audio digester 712, which transforms the information into a format that may be received by downstream stages. Depending on whether the end goal is the speaker on the user's mobile device 718 or the speaker 724 on the intercom station, the audio digester 712 routes the packets 722 accordingly. If the former, the digital packets 722 are then sent to the backend cloud-computer service (e.g., AWS) 716, which forwards the digital packets to the mobile app 718. The mobile app 718 then uses a software-based digital-to-analog converter (DAC) 714 to recover the original audio signal from the digital packet representation. This recovered audio signal is then outputted to the user 720 via the mobile device's speaker. In some embodiments, the steps in this chain are regulated by a standard network protocol, such as Message Queuing Telemetry Transport (MQTT), which runs over TCP/IP, or WebRTC. In some embodiments, the network protocol includes security and privacy features (e.g., authentication or encryption of signals sent and received).

In some embodiments, the ADC and/or the DAC are external from the MCU, e.g., an external digital signal processing (DSP) chip located elsewhere on the PCB. In some embodiments, the ADC/DAC is implemented in hardware only (e.g., ASIC). In other embodiments, the ADC/DAC is implemented in software only (e.g., sampling algorithm).

In some embodiments, optocoupler technology is employed to implement the isolation circuitry. In other embodiments, especially to avoid the potential for the LEDs in opto-components to wear out over time, capacitive barriers, transformers, radiofrequency (RF) isolators, or transistor-transistor logic (TTL), are used.

Figure 7B:
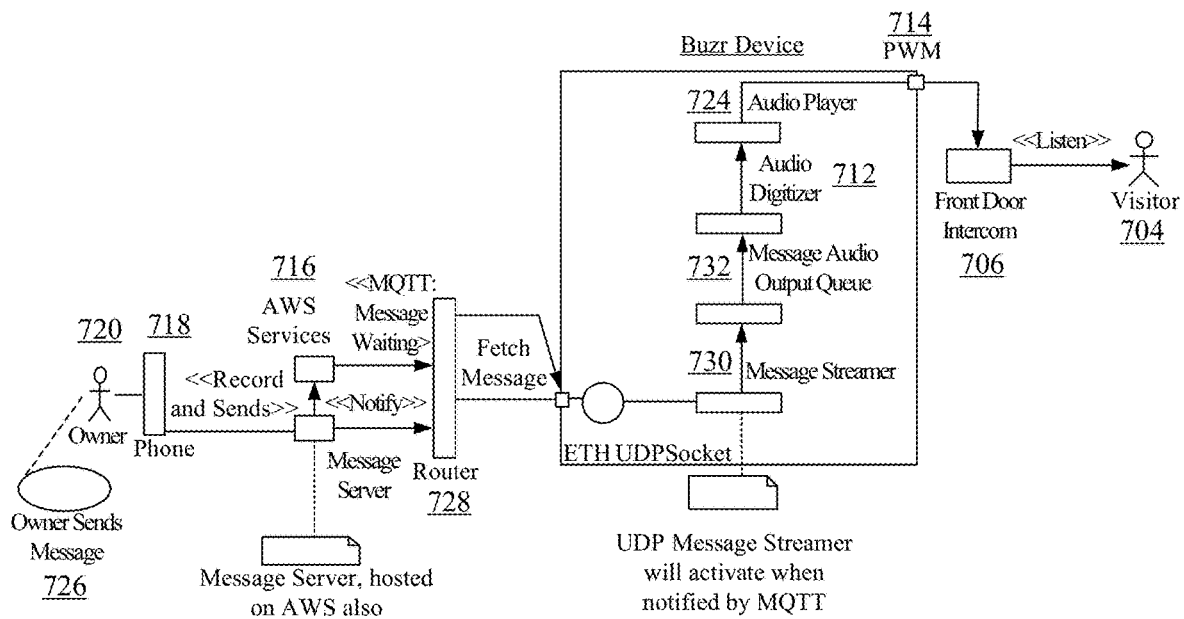
FIG. 7B shows a schematic of various components of an exemplary intercom system, including components of an exemplary intercom station, when a user speaks to a guest, in accordance with some embodiments of the invention.

FIG. 7B shows a schematic of various components of an exemplary intercom system, including components of an exemplary intercom station, when a user speaks 726 to a guest 704, in accordance with some embodiments of the invention.

In some embodiments, the backend cloud computing service 716 stores recordings of audio from the microphone of the lobby, the microphone of the intercom station, and the microphone of the mobile device. A user 720 is able to later access and playback these recordings via the mobile app 718 or website, which may be useful in cases where the user missed an audio transmission or would later like a further record of who was in the building. In some embodiments, the user 720 may download the audio recordings. A user 720 may also record an audio conversation between the user 720 and a guest 704. In some embodiments, the user 720 may elect to activate or deactivate the recording feature or may set in advance conditions under which the recording feature is activated. In some embodiments, the audio is encrypted from end to end.

In some embodiments, the backend cloud-computing service 716 may send a pre-recorded voice message to the lobby speaker 706 upon receiving a doorbell ring, prompting the guest to wait 704 or to leave a voicemail that will be recorded. In some embodiments, the host 720 may generate multiple pre-recorded voice messages and create rules that determine which voice message is played. In other embodiments, if the backend cloud-computing service 716 determines that the user 720 is likely to be absent from the apartment unit and is also not responding to the mobile app notifications, the backend cloud-computer service 716 will send a pre-recorded voice message (e.g., "the host is unavailable") to the lobby speaker 706 upon receiving a doorbell ring. Use cases may include an away message while the user is on vacation.

Message Journeys

FIGS. 8A, 8B, 8C, 8D, 8E, and 8F show exemplary message journeys for various use cases of the exemplary intercom station, in accordance with some embodiments of the invention.

Figure 8A:
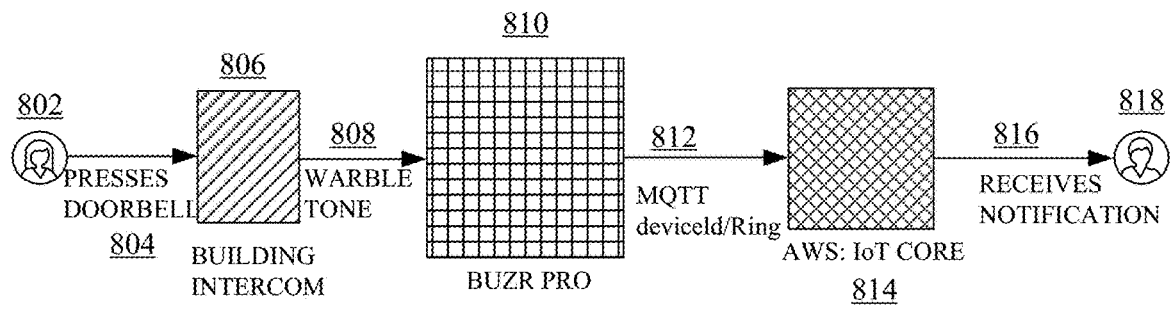
FIGS. 8A, 8B, 8C, 8D, 8E, 8F, 8G, and 8H show exemplary message journeys for various use cases of the exemplary intercom station, in accordance with some embodiments of the invention.

In FIG. 8A, a guest 802 presses a doorbell 804 to request the door being unlocked. In response, the lobby panel 806 (building intercom) sends the request 808 (e.g., via a warble tone) to the intercom station 810 (Buzr Pro). The intercom station then sends the request (along with the device ID corresponding to the intercom station) to the backend cloud-computer service 814 (AWS: IoT Core) via a standard network protocol, such as Message Queuing Telemetry Transport (MQTT). In some embodiments, the network protocol includes security and privacy features (e.g., authentication or encryption of signals sent and received). The backend cloud-computer service finally forwards the request to a user 818 via a mobile app notification 816.

Figure 8B:
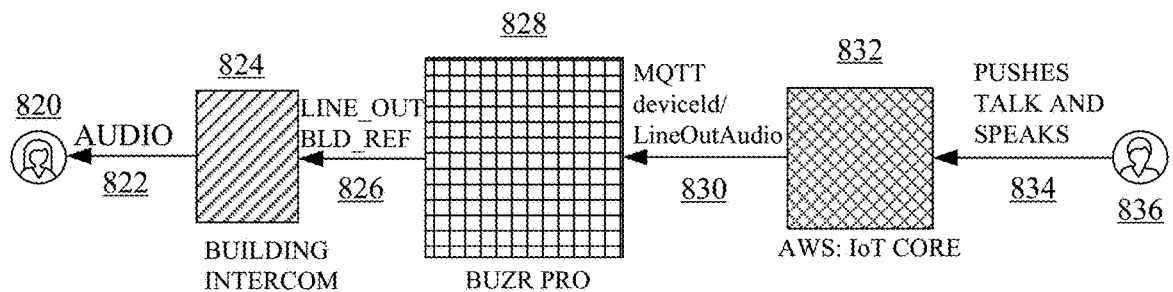

In FIG. 8B, a user 836 pushes the virtual talk button 834 on a mobile app and speaks into the microphone of user's mobile device. The talk request and the audio signal are sent to the backend cloud-computer service 832 (AWS: IoT Core), which forwards the talk request (along with the device ID) and the audio signal to the intercom station 828 (Buzr Pro) via a standard network protocol 830 (MQTT). The intercom station then sends the audio signal 826 to the lobby panel 824 (building intercom), which then generates an audio sound 822 via a speaker for a guest 820 at the lobby to hear.

Figure 8C:
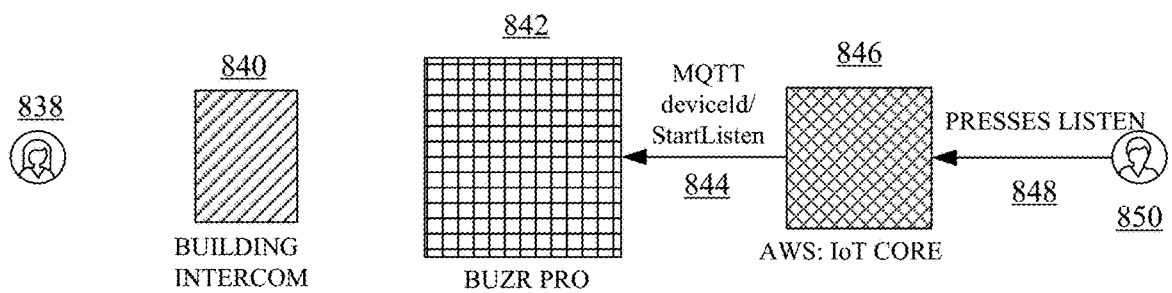

In FIG. 8C, a user 850 pushes the virtual listen button 848 on a mobile app. The listen request is sent to the backend cloud-computer service 846 (AWS: IoT Core), which forwards the listen request (along with the device ID) to the intercom station 842 (Buzr Pro) via a standard network protocol 844 (MQTT). The intercom station then sends listen request to the lobby panel 840 (building intercom), which then activates the microphone in the lobby panel to begin sensing sound from the lobby. The guest 838 is then able to speak to the user 850.

Figure 8D:
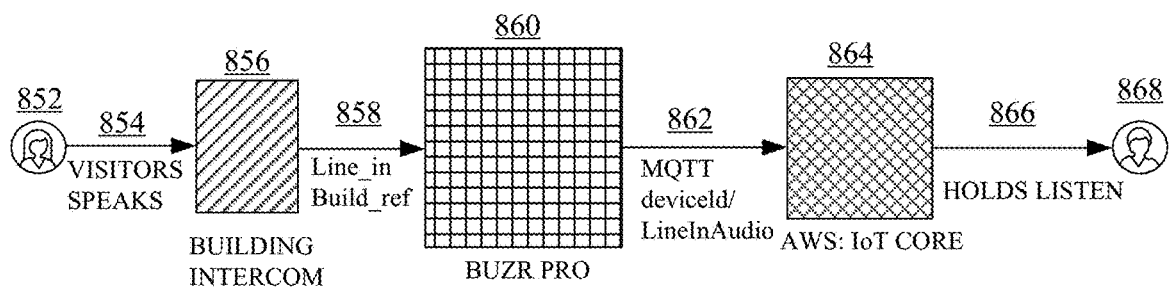

In FIG. 8D, a guest 852 speaks 854 into a speaker of a lobby panel (building intercom) 856, which has been activated in accordance with FIG. 8C. The audio signal 858 generated by the guest speaking (along with a reference to the intercom station ID) is forwarded to the intercom station 860 (Buzr Pro). The intercom station then sends the audio signal (along with the device ID corresponding to the intercom station) to the backend cloud-computer service 864 (AWS: IoT Core) via a standard network protocol 862 (MQTT). The backend cloud-computer service 864 finally forwards the audio signal to the user 868 via the mobile app as long as the user 868 continues to hold the virtual listen button 866 of the mobile app.

Figure 8E:
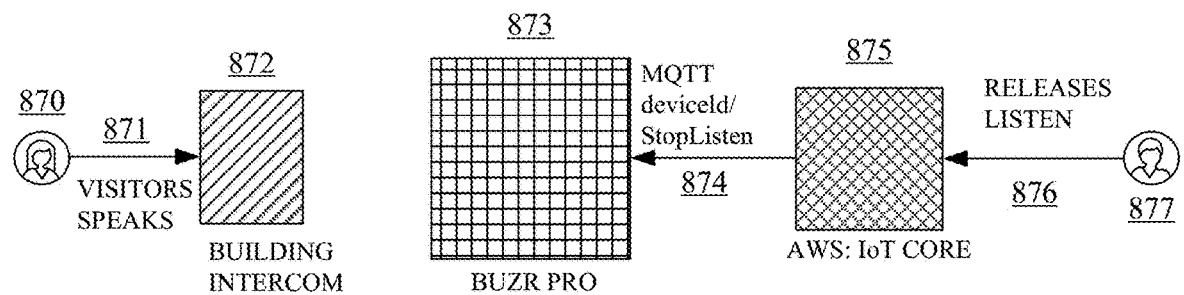

In FIG. 8E, the user 877 releases the virtual listen button 876 of the mobile app, which has been activated in accordance with FIG. 8C. The "stop listen" request is sent to the backend cloud-computer service 875 (AWS: IoT Core), which forwards the "stop listen" request (along with the device ID) to the intercom station 873 (Buzr Pro) via a standard network protocol 874 (MQTT). The intercom station then halts the reception of audio signals from the lobby panel 872 (building intercom). After this time, if the guest 870 continues to speak 871 into the microphone in the lobby panel, the audio signal from the guest 870 does not reach the intercom station, and hence does not reach the user 877.

Figure 8F:
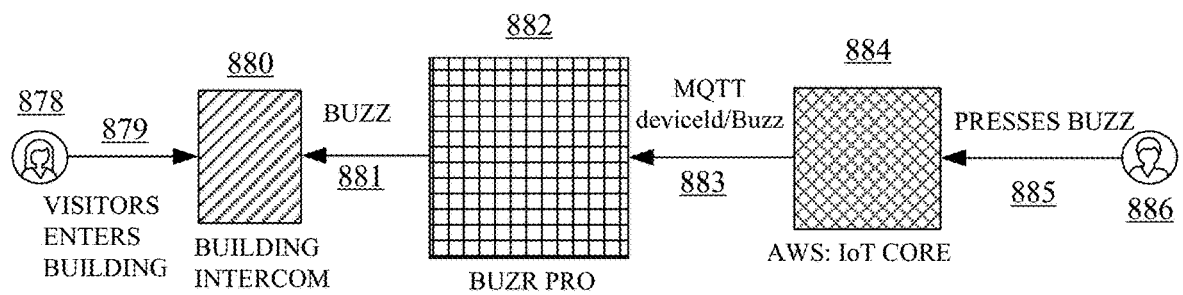

In FIG. 8F, a user 886 pushes the virtual door ("buzz") button 885 on the mobile app to unlock the door. The unlock request is sent to the backend cloud-computer service 884 (AWS: IoT Core), which forwards the unlock request (along with the device ID) to the intercom station 882 (Buzr Pro) via a standard network protocol 883 (MQTT). The intercom station then sends the unlock request 881 to the lobby panel 880 (building intercom), which unlocks the door for the guest 878 to enter the building 879.

Figure 8G:
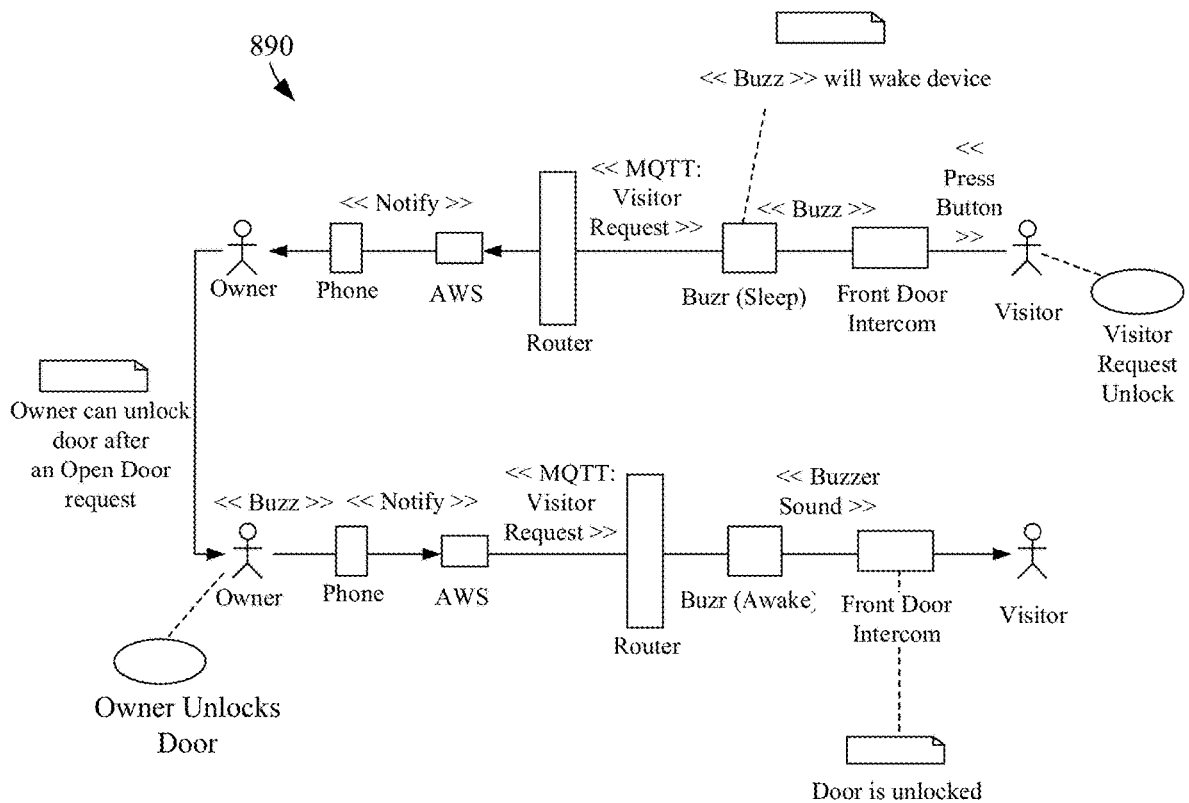

FIG. 8G shows a schematic of various components of an exemplary intercom system when a guest sends an unlock request 890, in accordance with some embodiments of the invention. The message journeys for these use cases are shown and described above in FIGS. 8A and 8F. In some embodiments, the intercom station is by default in a low-power ("sleep") mode. When the intercom station receives an unlock request, it then "awakened" and enters a high-power mode.

Figure 8H:
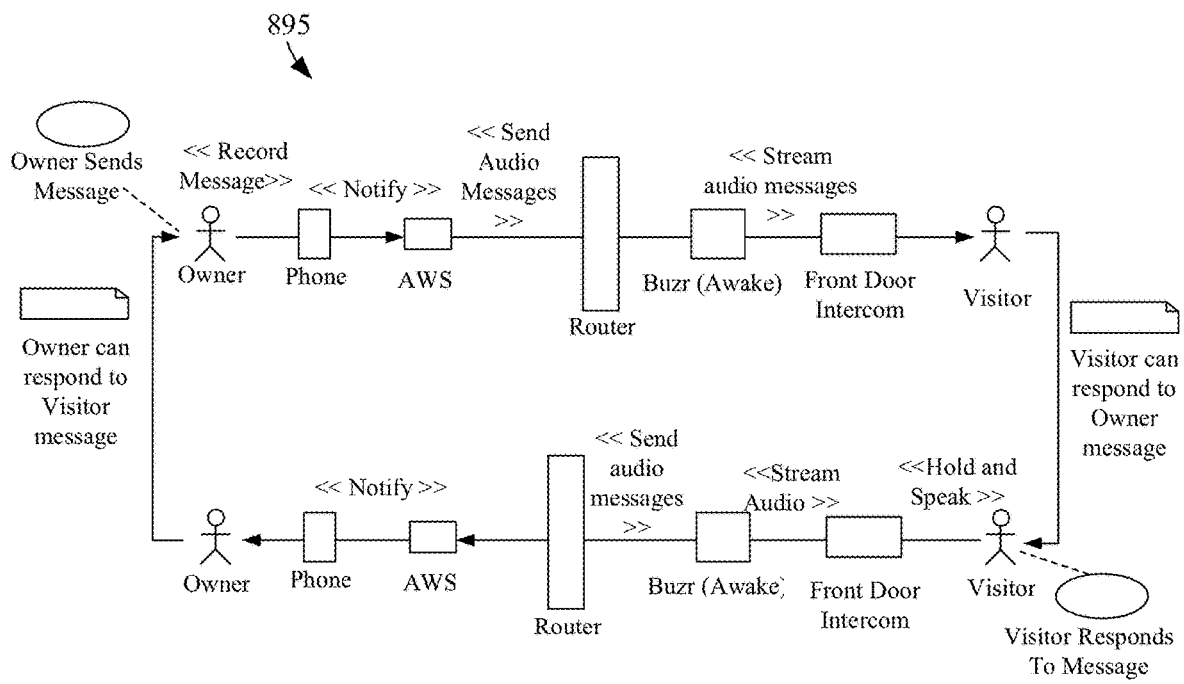

FIG. 8H shows a schematic of various components of an exemplary intercom system when a user and a guest speak to each other 895, in accordance with some embodiments of the invention. The message journeys for these use cases are shown and described above in FIGS. 8B, 8C, 8D, and 8E.

Accounts and Registering an Intercom Station to an Account

A person may create an account with a password on the mobile app or through a website associated with the intercom station ("intercom station website"). The account may also be created via a third-party log in system, such as Google, Facebook, or Apple, so that the backend system may associate a particular user with a particular intercom station. When the mobile app is first downloaded onto a mobile device, the user is prompted to either sign in with an account that is already made or by setting up a new account. In some embodiments, the mobile app requires the user to input a mobile number with two-factor authentication. In some embodiments, the mobile app requires verification via e-mail, text, or other messaging means. In some embodiments, the verification is a form of two-factor authentication. In some embodiments, the mobile app requires confirmation that the user is authorized before being able to control the intercom station. This may include providing lease information to validate that the user lives in or owns the unit he/she is intending to install the intercom station. The user's account may be suspended upon the expiration of the lease over the apartment until unless a lease renewal is confirmed. In some embodiments, the user provides a photo of the legacy device that he/she would like to replace in the apartment to ensure compatibility and reduce time on the phone with customer service. This function may be performed by, for example, using machine vision and image recognition to identify legacy devices from a user-uploaded photograph.

The user may be prompted in the mobile app to register a new intercom station to the user's account. In the "set up your device" mode, the user registers the new intercom station by scanning a QR code or other identifying code on the intercom station or manually entering an intercom station ID number to associate the user's account with this particular intercom station. The user may also dissociate the intercom station from their account.

Once an intercom station is associated with a user, it may be configured to connect to the local Wi-Fi network in the user's apartment unit. The mobile app instructs the user to push the Wi-Fi pairing button on the intercom station, which prompts the intercom station to emit its own Wi-Fi network to connect to the user's mobile device. The mobile app then requests that the user enter the credentials for accessing the local Wi-Fi network. When the intercom station successfully connects to the local Wi-Fi network, it provides a "connection successful" message to the user if it connects to the network intended by the user. Further associations also begin on the backend cloud-computing service. For example, in some embodiments, a "Just in Time Registration" (JiTR) process begins, the intercom station requests the creation of a CA certificate, and the certificate is registered with the backend cloud-computing service. In some embodiments, the intercom station clears previously stored Wi-Fi credentials upon the press of a button or other input.

Mobile Application Fundamentals

In some embodiments, the intercom system includes features such as the use of a guest mobile app, virtual keys for guests to enable the unlocking of the door when the user is not present, geofencing, the automatic unlocking of the door upon request, and the unlocking of the door via the intercom station or the mobile app without an unlock request sent by a guest.

In some embodiments, the mobile app associated with the intercom station has two modes: host (user) and guest. The host mode is for a user who has access to the apartment unit in which the intercom station is installed; the host mode enables the host to perform all the of the intercom station functions remotely, as well as other functions described in this disclosure. The guest mode is for a guest who seeks access to the building. In some embodiments, there is a stand-alone app for integration partners.

An account may be designated as a host, as a guest, or as both a host and a guest (for different intercom stations). An account may be designated as a host for multiple intercom stations (e.g., a real estate agent managing multiple apartment units), and/or as a guest for multiple other intercom stations (e.g., a cleaning service with multiple clients). A single particular intercom station may be associated with multiple hosts (e.g., members of the same household living the apartment unit) as well as with multiple guests. In some embodiments, the mobile app permits a single mobile device to save multiple account and password combinations.

In some embodiments, the mobile app enables multiple users to communicate with one another. This may be, for example, via text messaging, via requests for a virtual key, or via request for a modification to an existing virtual key (e.g., delay the expiration time). When a guest requests a virtual key, the host receives a notification on his/her mobile device, after which the host may grant, deny, or ignore the request via the mobile app. In some embodiments, the mobile app is integrated with third-party mobile messaging apps, such as e-mail, SMS, WhatsApp, iMessage, Facebook Messenger, or Google Voice.

Unlock the Door Via Mobile Application

In some embodiments, the intercom station enables a user to perform the door, talk, and listen functions remotely through the mobile app as a host. The mobile app includes a graphical user interface (GUI) that reproduces the physical interface of the intercom station, such a virtual talk button that enables the user to speak to the guest, a virtual listen button that enables the user to listen to sounds in the lobby including the guest's voice, and a virtual door button that enables the user to approve the request to unlock the door. In some embodiments, the mobile device enables these functions by means other than virtual buttons, such as voice commands.

Figure 9A:
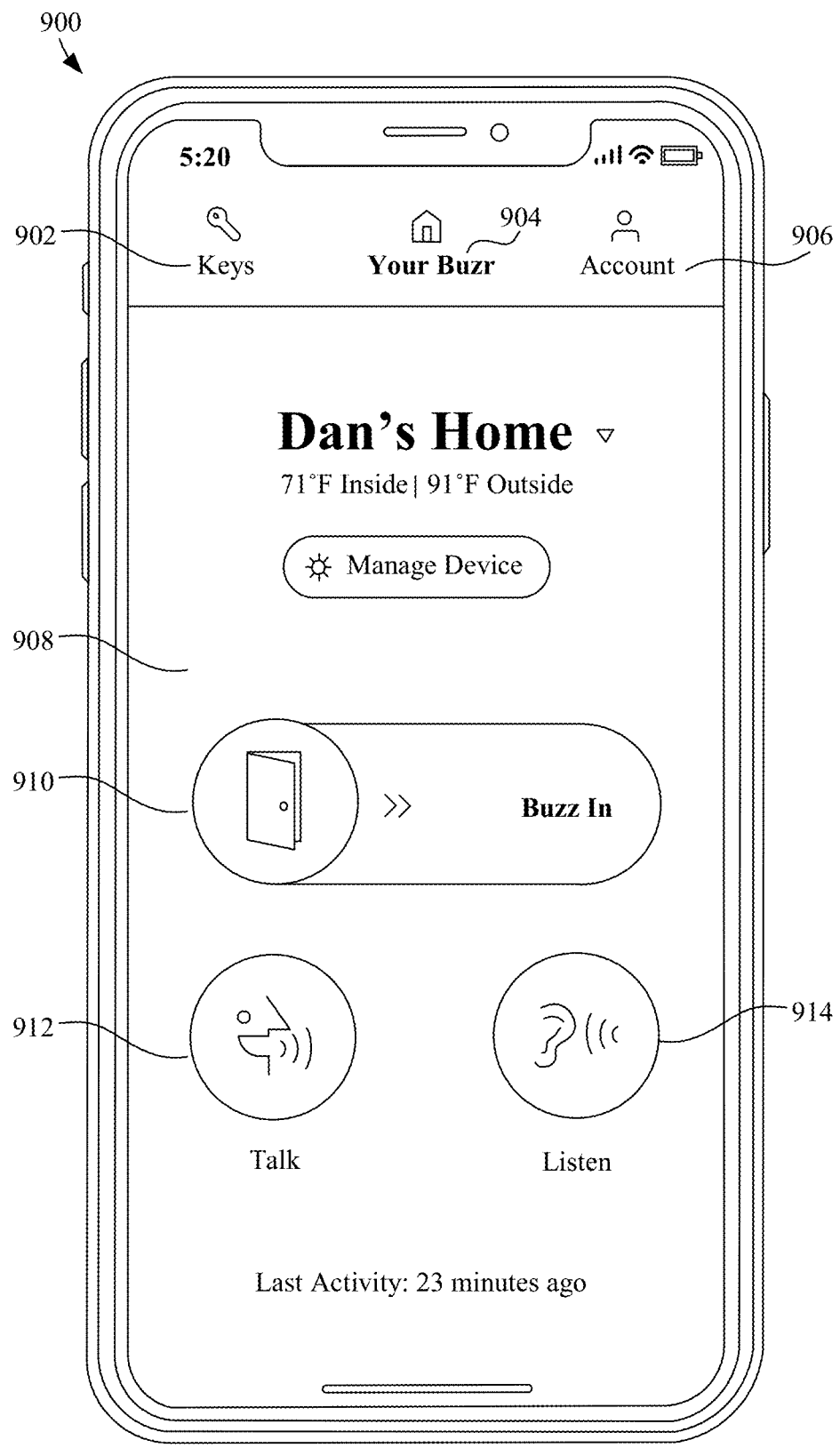
FIG. 9A shows an exemplary home screen of a graphical user interface (GUI) of an intercom station mobile app, in accordance with some embodiments of the invention.

FIG. 9A shows an exemplary home screen of a graphical user interface (GUI) 900 of an intercom station mobile app, in accordance with some embodiments of the invention. The top row menu has three items: "keys" 902, "your Buzr" 904, and "account" 906. The user is in the home screen 908 when "your Buzr" 904 is selected. The home screen 908 shows the three virtual buttons described above: talk 912, listen 914, and door ("buzz in") 910.

When a guest outside the door requests unlocking the door, he or she activates ("rings") a doorbell on the lobby panel that corresponds to the guest's target apartment unit. When the doorbell is activated, the lobby panel sends the unlocking request as a signal to the ICU, which relays it to the intercom station in the target apartment unit. The intercom station then relays the unlocking request to the backend cloud-computing service, which in turn relays the unlocking request to the mobile app. In response, the mobile app generates a notification ("doorbell ring notification") to the user that the request has been made. Such a notification may include an audible sound being emitted from the mobile device, a series of vibrations of the mobile device, or other push notifications typical for mobile devices.

Figure 9B:
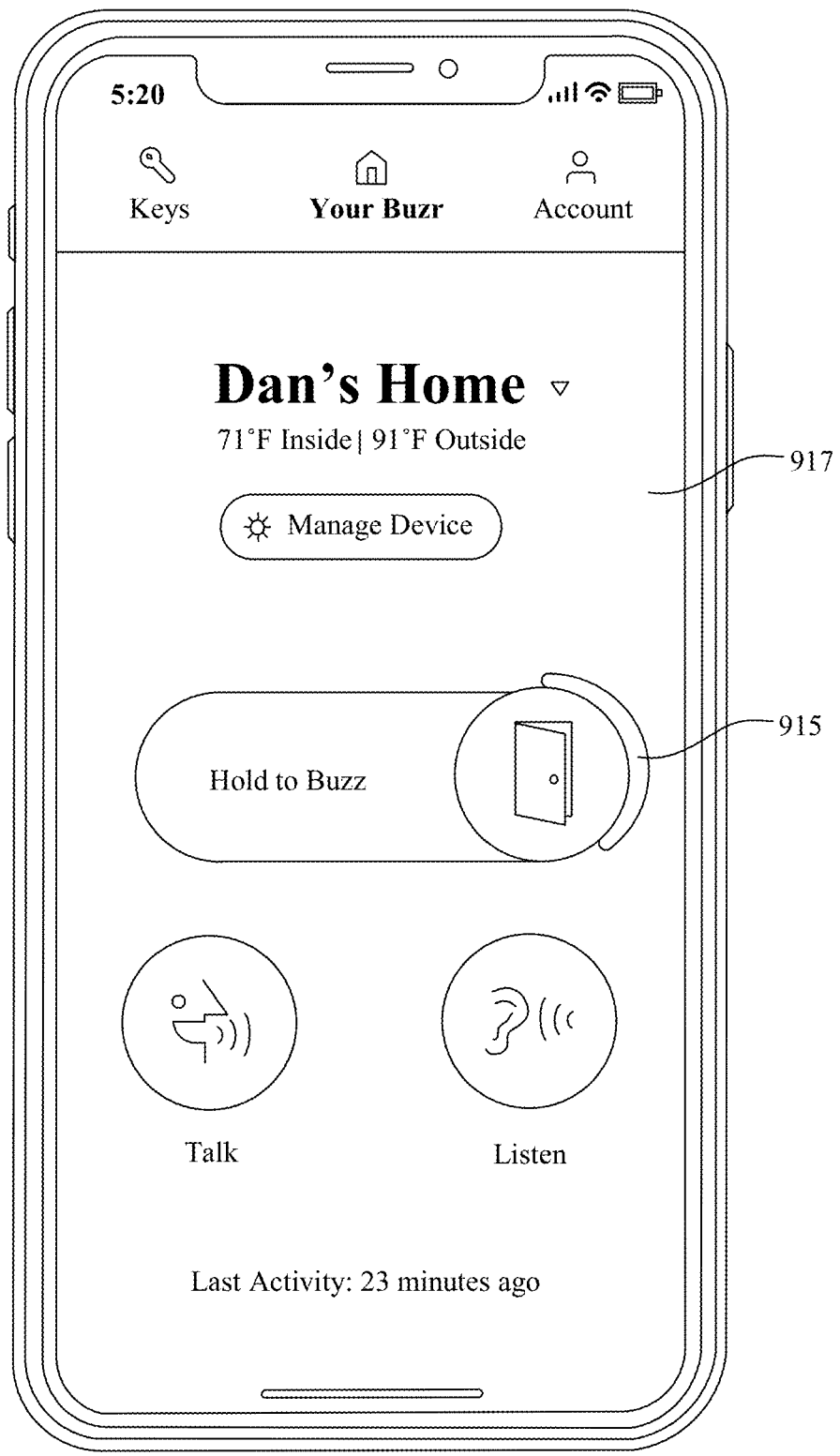
FIG. 9B shows an exemplary "buzzing" screen of a GUI of an intercom station mobile app, in accordance with some embodiments of the invention.

Upon receiving the notification, the user may approve of the unlocking request by activating the virtual door button on the GUI, which causes the mobile app to send the unlocking approval to the backend cloud-computing service, which in turn relays the unlocking approval to the intercom station. This action may be performed by touch-sliding the door ("buzz in") button from a left-most position 910 in FIG. 9A to the right 912, which transitions the GUI to that shown in FIG. 9B, which shows an exemplary "buzzing" screen 917 of a GUI of an intercom station mobile app and the door button in a right-most position 915, in accordance with some embodiments of the invention. In some embodiments, the user may select the buzz length for each door open request. A potential use case for a longer buzz length is in multi-door buildings. For example, consider a building where a guest first encounters a first door that leads to an enclosed area, where the guest then encounters a second door before entering the building proper. The guest must be buzzed through both doors in order to enter the building. In such multi-door buildings, where the lobby panel is outside the first door, the user must buzz the guest for a period of time long enough or a sufficient number of times for the guest to open the first door, walk through the enclosed area, and finally open the second door. Thus, in some embodiments, the intercom station's buzz signal is longer than a pre-determined threshold (namely, the typical minimum amount of time it would take a guest to open a door and walk through the enclosed area). In other embodiments, the user may alter the intercom station's buzz signal length. In still other embodiments, the user may instruct the intercom station to send multiple buzz signals.

The intercom station then relays the unlocking approval as a signal to the ICU, which sends a request to the door lock to unlock the door, "buzzing" the guest in. In some embodiments, the mobile app supports the unlocking of the door without a prior unlock request sent by a guest. This is achieved by the host activating the virtual unlock button or its equivalent via the mobile app.

Figure 9C:
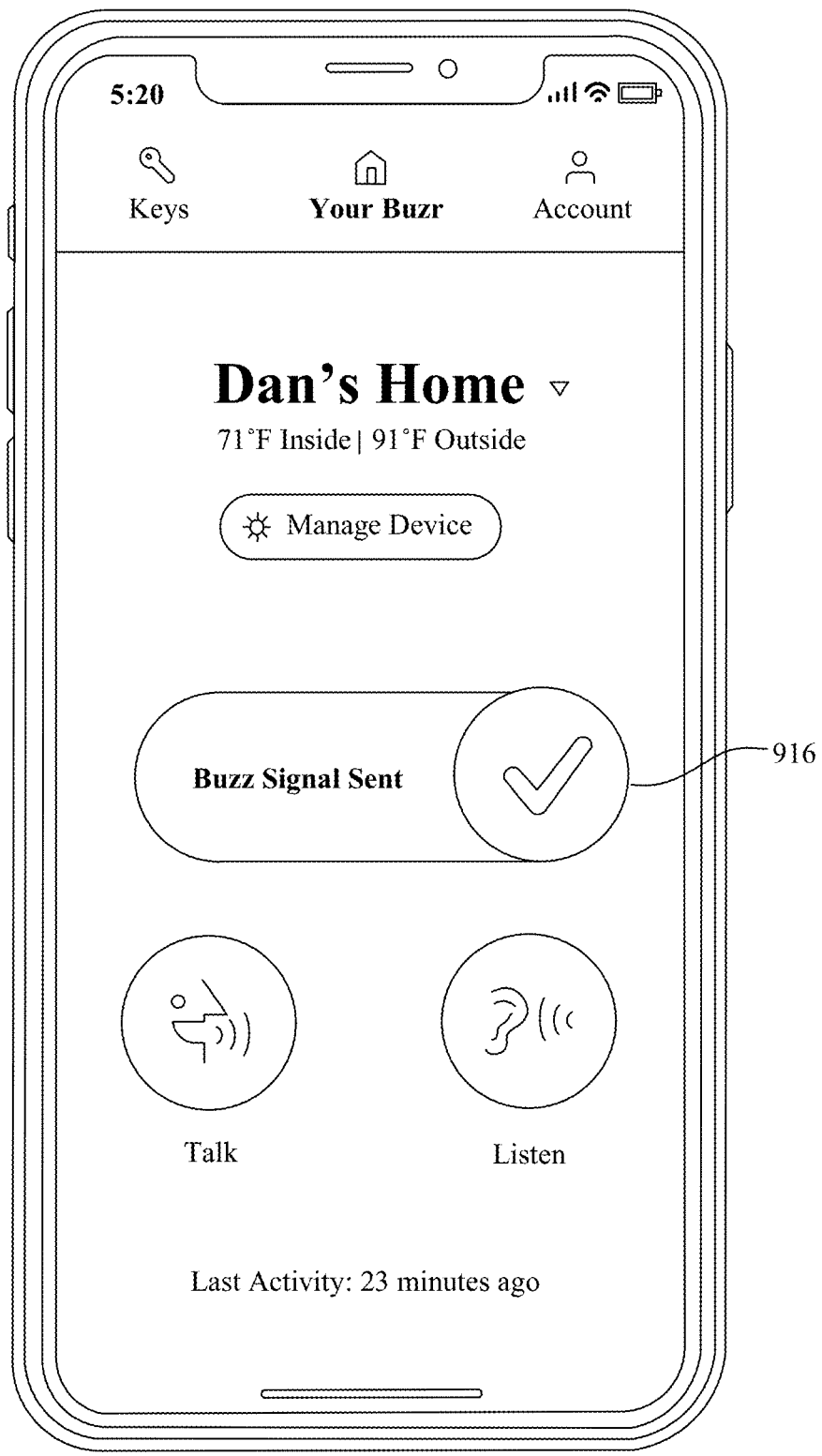
FIG. 9C shows an exemplary "buzzed" screen of a GUI of an intercom station mobile app, in accordance with some embodiments of the invention.

When a user wishes to halt the unlocking of the door, he/she may then release the door ("buzz in") button, which transitions the GUI to that shown in FIG. 9C, which shows an exemplary "buzzed" screen 916 of a GUI of an intercom station mobile app, in accordance with some embodiments of the invention. On this screen, the GUI shows confirmation that the buzz signal has been sent 916. After a brief pause, the GUI transitions back to the home screen shown in FIG. 9A.

Some legacy intercom systems include a "talk interlock" feature built into either the base controller (for digital systems) or the amplifier (for analog systems) component, as referenced in FIG. 1A. This feature requires that the user activate the "talk" feature (e.g., by pressing a "talk" button) before he or she is able to buzz the door open. One motivation for this feature is that it forces the user to identity the guest at the lobby requesting entry before unlocking the door without any knowledge of the guest's identity. To interface with such a feature in legacy intercom systems, some embodiments of the intercom station ensure that the talk interlock requirement is met before sending an unlock request (e.g., a guest applies a virtual key without a user to first speak to the guest). In some embodiments, the intercom station pulses the talk line. For example, in analog systems, the enable of a MOS relay is set "high" for a sufficiently long period of time (e.g., approximately 1 second) before sending any buzz signals to ensure that this talk interlock requirement is met and the intercom station is able to buzz successfully.

In some embodiments, the intercom station includes a "device mute" feature, where a user may mute the intercom station temporarily. Typical use cases include avoiding awakening occupants already asleep, avoiding interrupting activity in the building unit, and generally establishing a quiet environment. In such embodiments, the intercom station is configured to intercept and mute all audio signals that would otherwise be sent to the intercom station (e.g., doorbell rings). In some embodiments, all communication with the building door may still be accomplished via the mobile application while the intercom station is muted. In some embodiments, rather than muting all audio signals, the user may determine how much signals are altered. For example, the user may adjust the volume of a doorbell ring or of audio communication, or may select from a variety of ringtones, which may be pre-recorded audio or PWM waveforms. Such embodiments may be implemented by intercepting an incoming signal at the processor (e.g., the microcontroller unit) with the audio buffer circuitry disclosed with reference to FIGS. 5B and 5C, and responding with the proper action upon receiving that incoming signal.

Verbal Communication Via Mobile Application

Figure 9D:
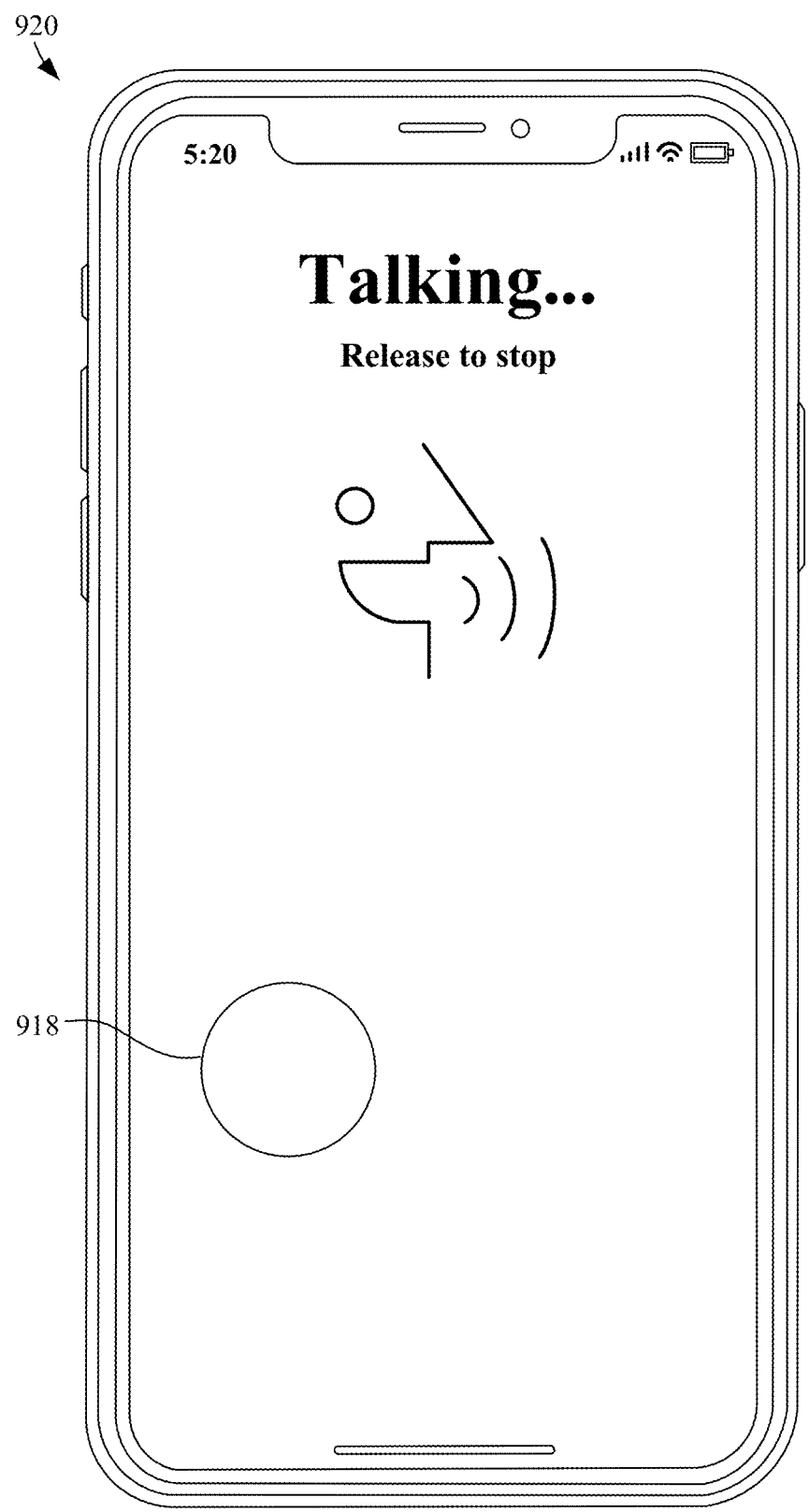
FIG. 9D shows an exemplary "talking" screen of a GUI of an intercom station mobile app, in accordance with some embodiments of the invention.

In some embodiments, the intercom system enables the user via the mobile app and the guest to speak to each other. When the mobile app notifies the user that an unlock request has been sent, the user has the option of activating the microphone of the mobile device and the speaker of the lobby panel, but not the speaker of the mobile device nor the microphone of the lobby panel, by pressing and holding down the virtual talk button 912 on the GUI shown in FIG. 9A. Once these devices are activated, the GUI transitions to that shown in FIG. 9D, which shows an exemplary "talking" screen 920 of a GUI of an intercom station mobile app, in accordance with some embodiments of the invention. Now, the user may speak to the guest at the lobby. When the user releases the virtual talk button (the white circle 918 in FIG. 9D), the microphone of the mobile device and the speaker of the lobby panel are deactivated, and the user may no longer speak to the guest. The GUI then transitions back to that shown in FIG. 9A.

Figure 9E:
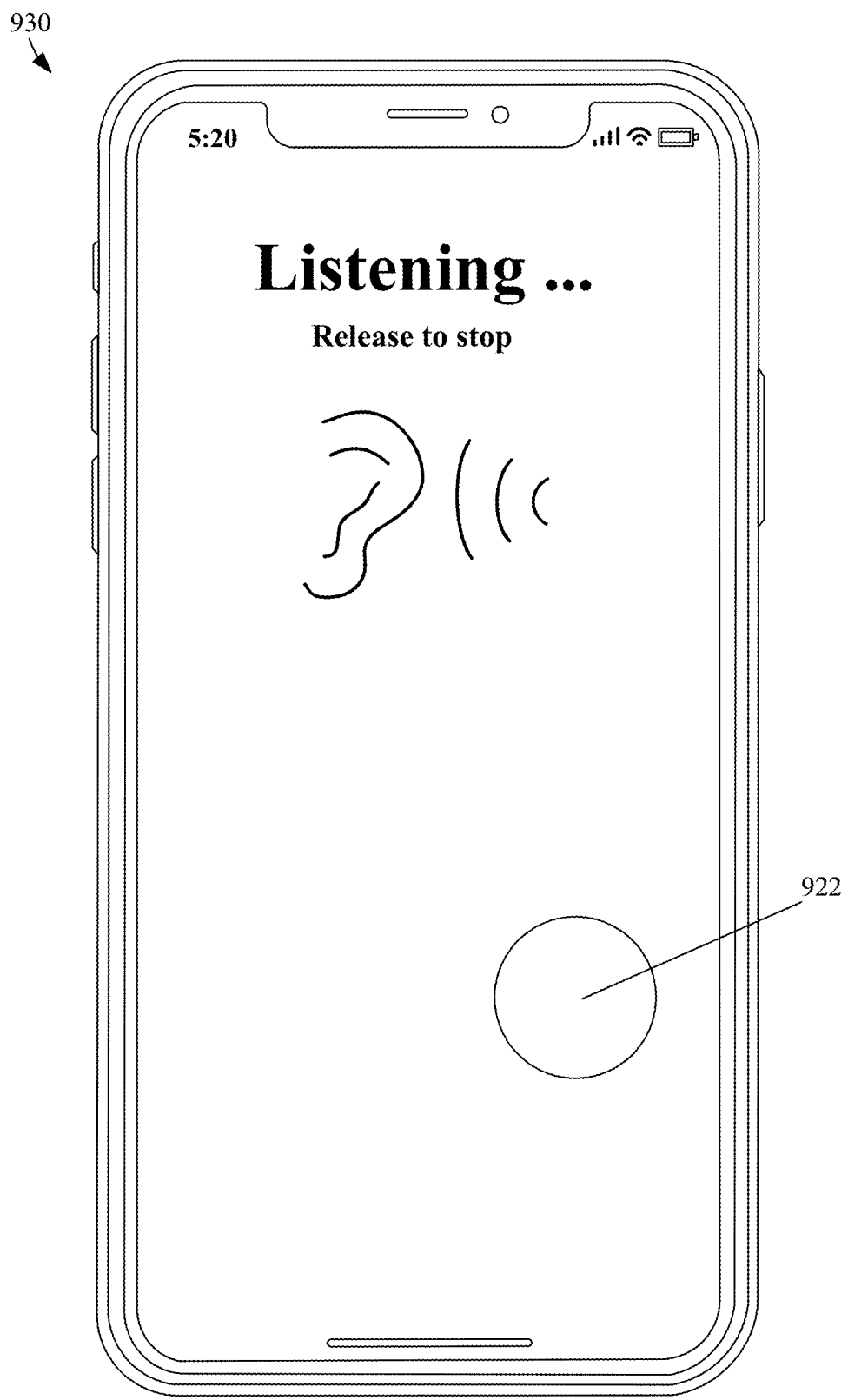
FIG. 9E shows an exemplary "listening" screen of a GUI of an intercom station mobile app, in accordance with some embodiments of the invention.

In some embodiments, the intercom system enables the user via the mobile to passively listen to sounds in the lobby, including the guest's voice, by pressing and holding down the virtual listen button 914 on the GUI shown in FIG. 9A, which activates the microphone of the lobby panel and the speaker of the mobile device, but not the speaker of the lobby panel nor the microphone of the mobile device. Once these devices are activated, GUI transitions to that shown in FIG. 9E, which shows an exemplary "listening" screen 930 of a GUI of an intercom station mobile app, in accordance with some embodiments of the invention. Now, the guest in the lobby may speak to the user. When the user releases the virtual listen button (the white circle 922 in FIG. 9E), the microphone of the lobby panel and the speaker of the mobile device are deactivated, and guest user may no longer speak to the user. The GUI then transitions back to that shown in FIG. 9A. By alternately pressing the virtual talk 912 and the virtual listen buttons 914 on the GUI 900, the user may conduct a conversation via mobile device with a guest at the lobby.

In some embodiments, if the user receives an incoming telephone call while conversing with a guest via the mobile app, the telephone call is displayed in a heads-up notification as to not remove focus from the mobile app. The user has the options of answering the call (which disconnects the conversation with the guest) or ignoring the call (which continues the conversation with the guest uninterrupted).

In some embodiments, whenever the virtual talk 912 or virtual listen buttons 914 are pressed, held, or released, a signal encapsulating the request is sent from the mobile device to the backend cloud-computing service, which in turn relays the request to the intercom station. The intercom station then relays the request as a signal to the ICU, which sends the request to the lobby panel to activate or deactivate the appropriate devices. Whenever audio signal is transmitted (e.g., the user holds down the virtual talk button while speaking into the mobile device microphone, the user holds down the virtual listen button 914 while the guest is speaking into the lobby panel microphone), the signal is routed between mobile device, the backend cloud-computing service, the intercom station, the ICU, and the lobby panel.

In some embodiments, the microphone and the speaker of the intercom station are inactivated when the microphone and the speaker of the mobile device are activated as discussed above regarding the operation of the virtual talk and the virtual listen functions. In some embodiments, if multiple users who are hosts of the same intercom station (e.g., two roommates) attempt to speak to a guest at the lobby by using the virtual talk function on their respective mobile apps, then only the first one to activate the virtual talk function will be able to talk, and the speaker of the lobby panel will emit the sounds from the microphone of the mobile device of that first user. The second user received a notification on their mobile device indicating that someone else is speaking to the lobby.

Automatic Unlocking

In some embodiments, the mobile app supports the automatic unlocking of the door upon request by a guest. This is achieved by the host activating the automatic unlocking feature via the mobile app or intercom station website. The activation is stored in the backend cloud-computing service. After this feature has been activated, whenever a guest requests the door to be unlocked by ringing the doorbell on the lobby panel, the intercom station will automatically grant the request by confirming with the backend cloud-computing service that the automatic unlocking feature is activated. The host may deactivate the automatic unlocking feature any time. In some embodiments, the host may set in advance conditions under which the automatic unlocking feature is activated. For example, the feature may be activated over a set time period ("between 5 pm and 7 pm tomorrow") or may be activated for a fixed number of unlock requests ("expires after 5 unlock requests"). In some embodiments, the user will receive a notification on the mobile app whenever the automatic unlocking feature is used by a guest or by an integration partner. In some embodiments, each automatic unlocking request is recorded.

Virtual Keys

Figure 10A:
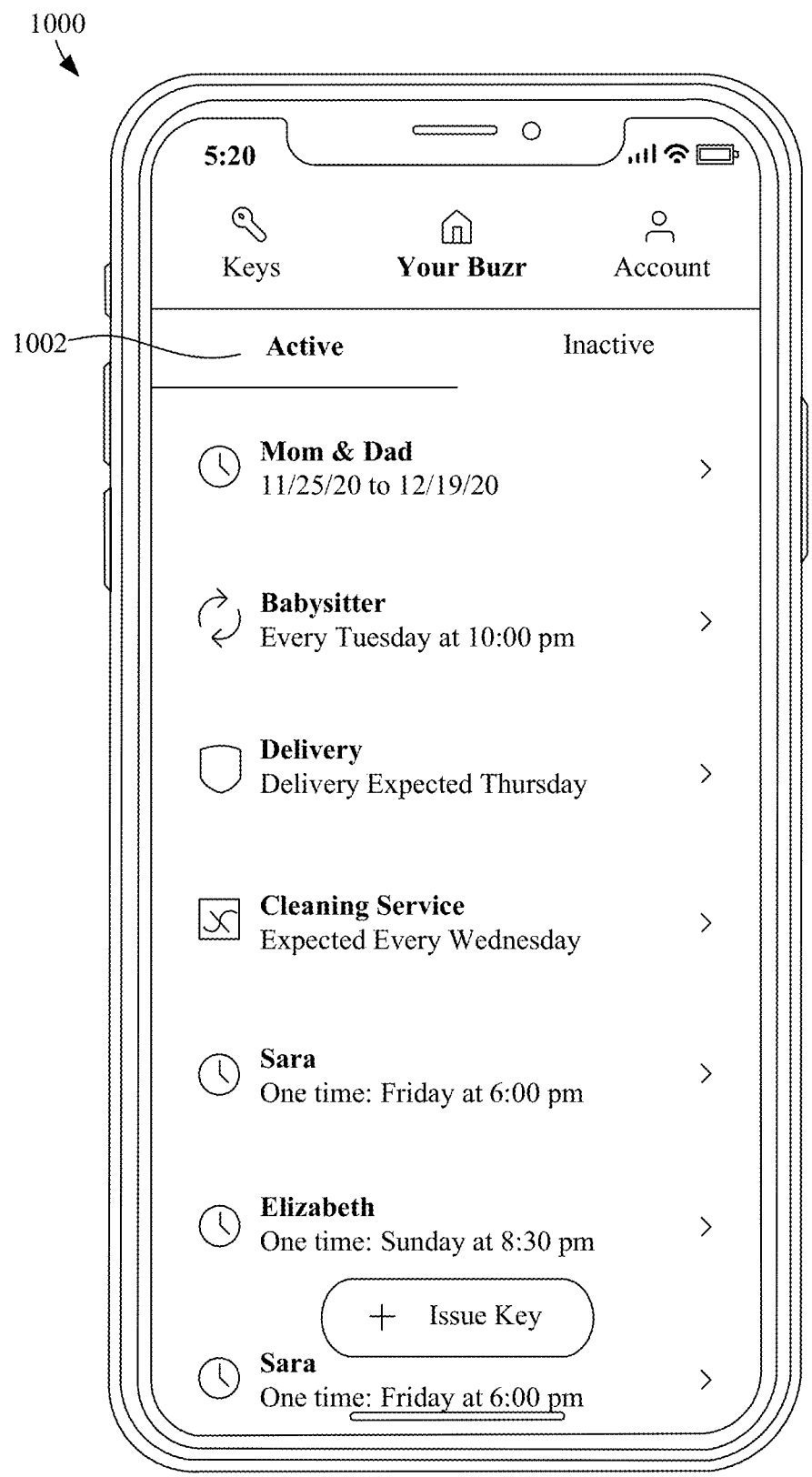
FIG. 10A shows an exemplary "keys" screen of a GUI of an intercom station mobile app, in accordance with some embodiments of the invention.

In some embodiments, the mobile app supports the creation ("activation") of virtual keys for guests to enable the unlocking of the door without the contemporaneous participation by the host user, which is useful when the host is not physically present in the apartment unit and also may not be able to access the mobile app immediately. When the user activates a virtual key, the mobile app sends a virtual key activation signal to the backend cloud-computing service (CCS). The virtual keys are stored in the backend CCS. FIG. 10A shows an exemplary "keys" screen 1000 of a GUI of an intercom station mobile app, in accordance with some embodiments of the invention. In this example, the list of active virtual keys 1002 is shown. The guest may be identified by, for example, full name, nickname, username, e-mail address, phone number, or other identifying information. The guest may or may not have the mobile app nor corresponding account installed on his or her mobile device. If the guest has the mobile app and corresponding account installed on his or her mobile device, the guest is able to use a virtual unlock button on the app to apply the virtual key, which unlocks the door. In some embodiments, whether the guest has the mobile app and corresponding account installed on his or her mobile device or not, the guest receives a URL link via text message or e-mail. When the guest clicks the URL link, the virtual key is applied, which unlocks the door. Whenever a guest applies a virtual key by any means, the backend cloud-computing service (CCS) sends a signal to the intercom station to request the intercom station to send a request to the ICU to unlock the door.

Figure 10B:
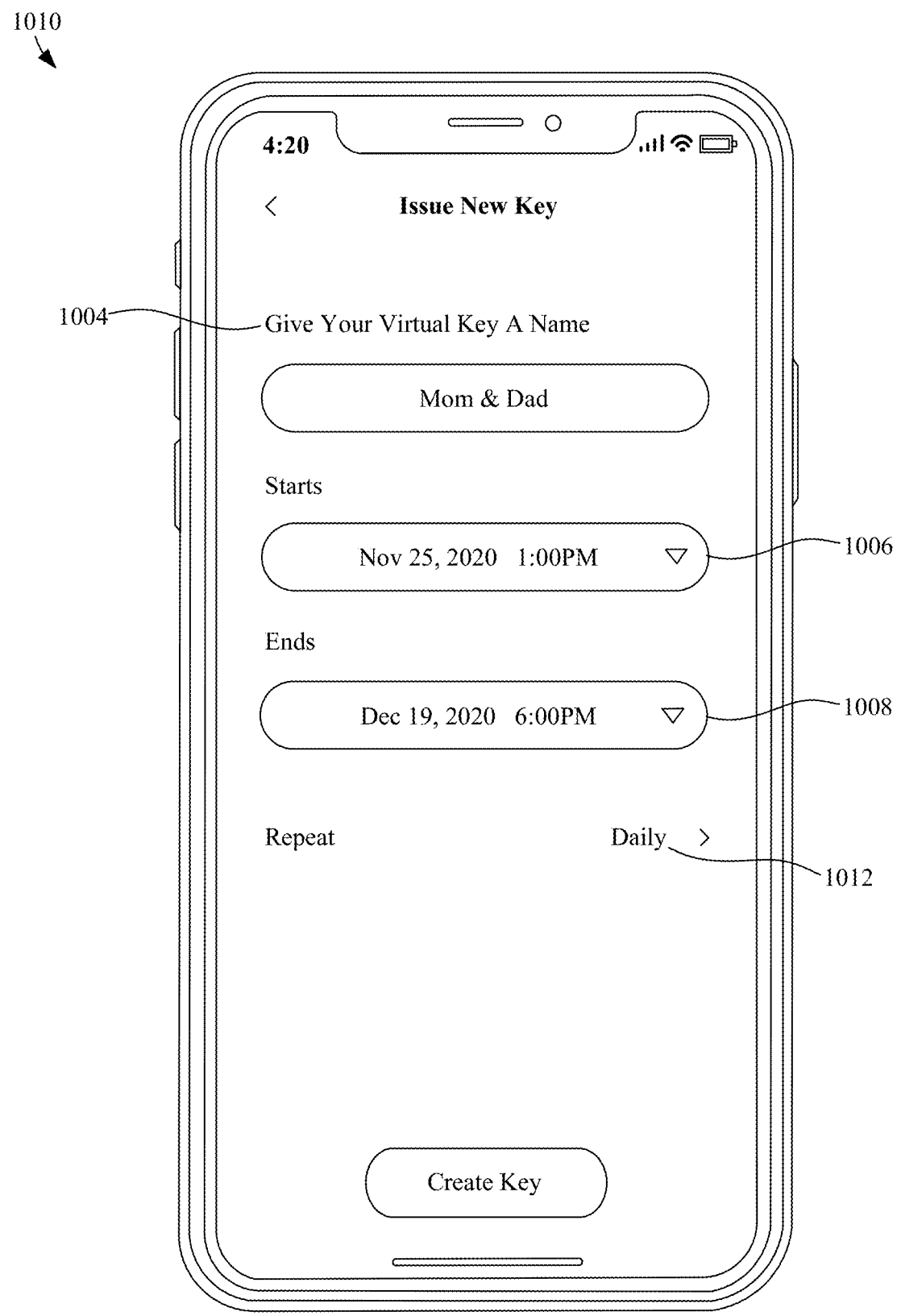
FIG. 10B shows an exemplary "issue new key" screen of a GUI of an intercom station mobile app, in accordance with some embodiments of the invention.

Using the mobile app or intercom station website, a host creates a virtual key for a particular guest. FIG. 10B shows an exemplary "issue new key" screen 1010 of a GUI of an intercom station mobile app, in accordance with some embodiments of the invention. The virtual key may have a name, an ID number, or a code 1004 ("Mom & Dad" in this example). In some embodiments, the host may set in advance conditions under which the virtual key is active, which enhances the security of an otherwise unsupervised system. For example, the feature may exist only over a set time period 1006, 1008 ("between 5 pm and 7 pm tomorrow", "between noon and 1 pm every Tuesday") or may work only for a fixed number of unlock requests ("expires after 5 unlock requests"). In the example, shown in FIG. 10B, the start date/time 1006 is Nov. 25, 2020 at 1:00 pm, the end date/time 1008 is Dec. 19, 2020 at 6:00 pm, and the virtual key repeats daily 1012. These limited virtual keys may be useful for various categories of guests. For example, for a host renting out the apartment unit as a short-term rental (e.g., via Airbnb) may create virtual keys for their guests corresponding only to the time periods of their reservations so that the guests may not access the building outside of their reservation period. A host who expects a dog-walker or cleaning service at particular times during the day or other schedule may create a virtual key so that those guests may not access the building outside of those expected times.

Figure 10C:
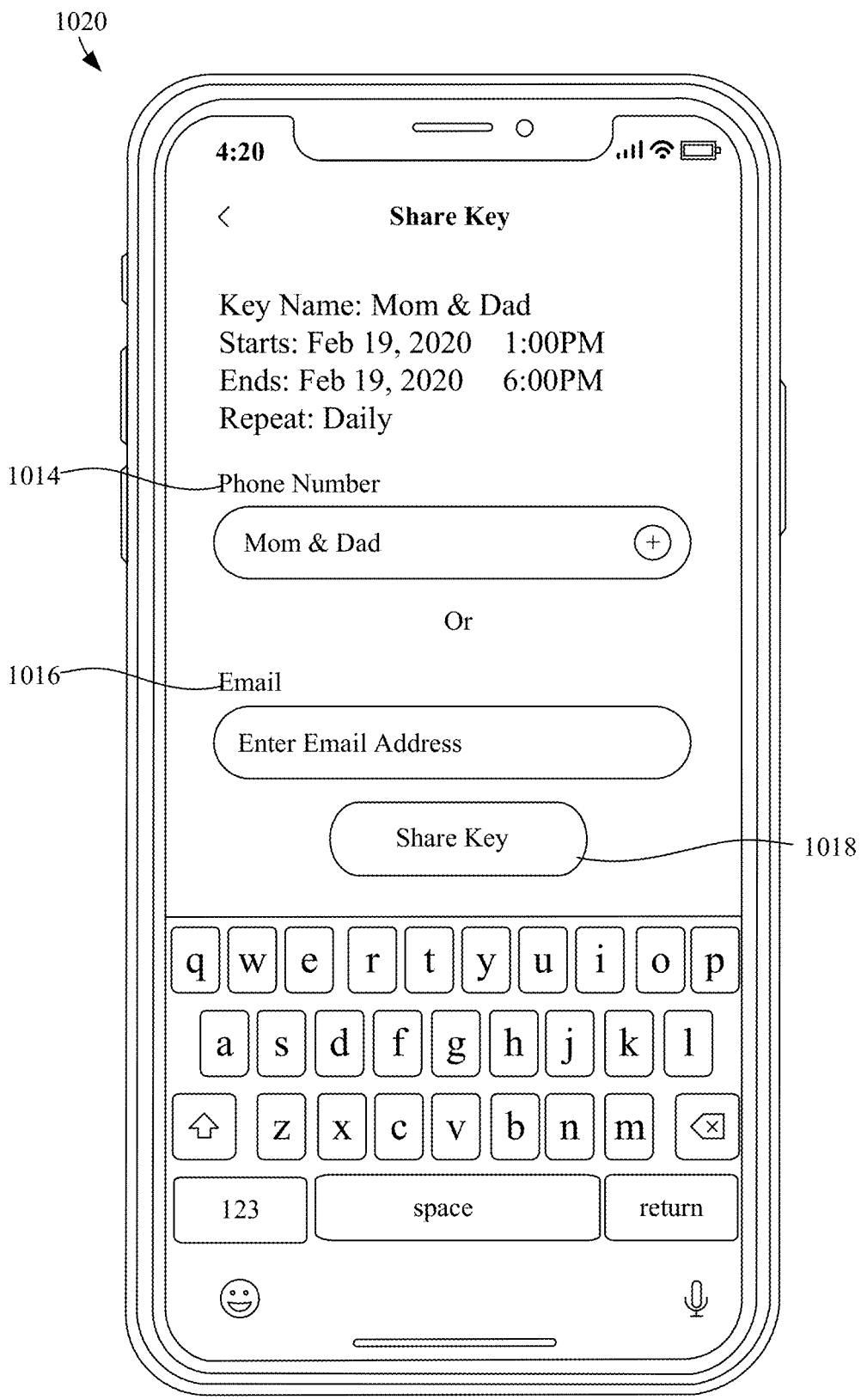
FIG. 10C shows an exemplary "share key" screen of a GUI of an intercom station mobile app, in accordance with some embodiments of the invention.

FIG. 10C shows an exemplary "share key" screen 1020 of a GUI of an intercom station mobile app, in accordance with some embodiments of the invention. Once the user is ready to share the key with the intended guest, he/she reviews the key information and enters the intended recipient's contact information, such as a telephone number 1014 or e-mail address 1016. In some embodiments, the mobile app accesses the contact list available in the user's mobile device to index the possible entries for the recipient's contact information. The user then clicks on "share key" 1018 to send the key to the intended recipient.

Figure 10D:
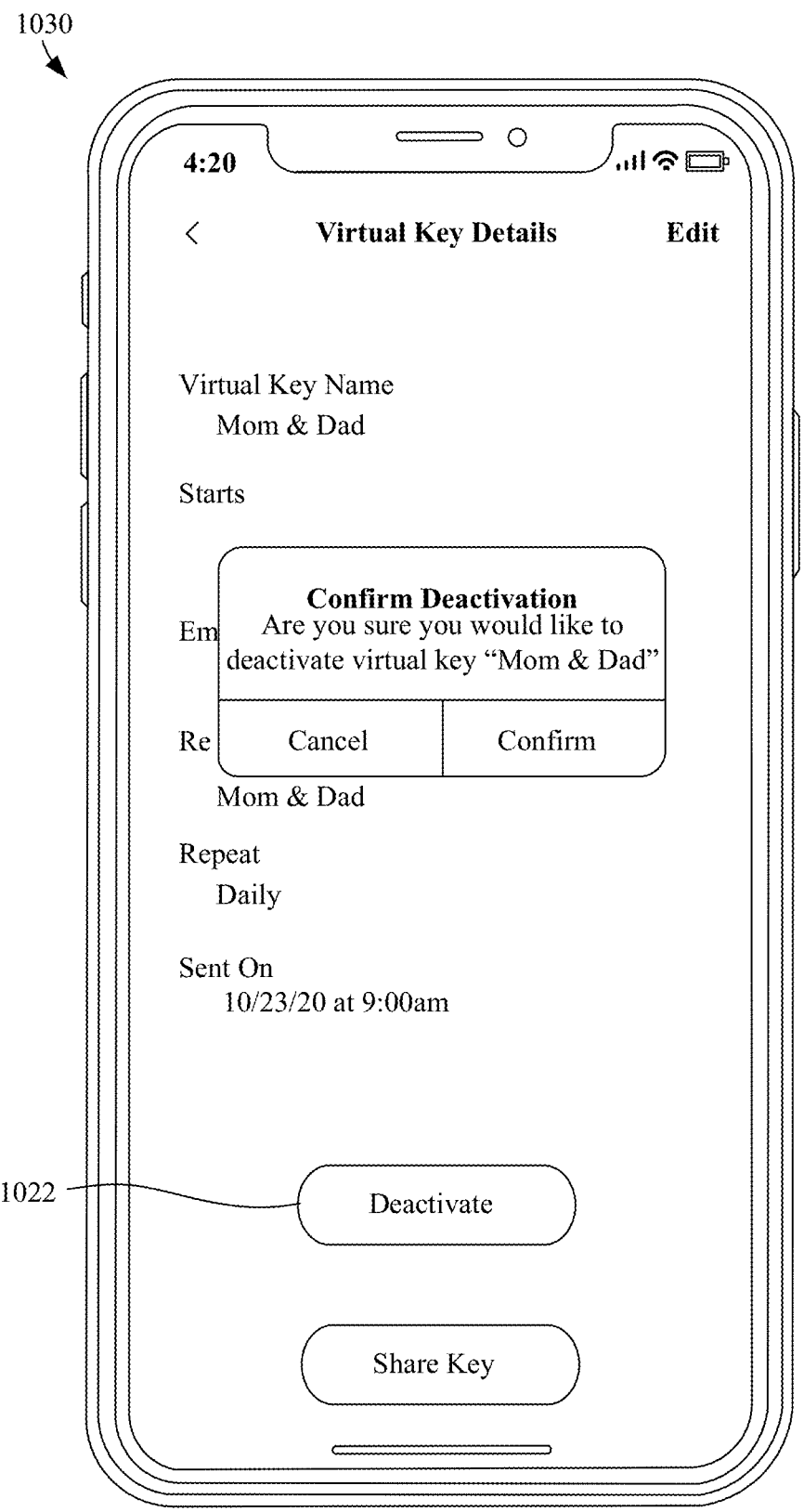
FIG. 10D shows an exemplary "deactivate" screen of a GUI of an intercom station mobile app, in accordance with some embodiments of the invention.

The host user may deactivate a virtual key at any time. FIG. 10D shows an exemplary "deactivate" screen 1030 of a GUI of an intercom station mobile app, in accordance with some embodiments of the invention. When a user wishes to deactivate a virtual key, he/she clicks on the "deactivate" button 1022. The user is then asked to confirm the deactivation.

In some embodiments, if a guest finds that the given virtual key does not work when applied, he/she may use support features in the app to request a new virtual key from the user. The user would then receive a notification for the request, and may respond by resending the virtual key, generating a new active virtual key, or ignoring the request.

In some embodiments, the user receives a notification on the mobile app whenever a virtual key is activated, deactivated, or applied. In some embodiments, each application of a virtual key is recorded. This information may include the ID of the virtual key, the identity of the guest applying the virtual key, and the date/time of the application. In some embodiments, the backend cloud-computing service (CCS), local server, local device, or mobile application generates a record of instances where an integration partner used a virtual key.

Geofencing

In some the embodiments, the virtual key may be applied via geofencing. The host may set via the mobile app or intercom station website a "geofence", or a set of lines or curves. The virtual key is applied whenever the guest's mobile device is determined to breach the geofence. In some embodiments, the geofence is a closed curve encompassing a geographical region. In other embodiments, the geofence is an open curve. For example, the host may set the geofence to be a circle with a 10-meter radius centered around the building's lobby door. This way, the door will automatically unlock when the guest is about to arrive at the door. In some embodiments, the mobile app may access the host mobile device's mapping functions (e.g., Google Maps) to enable the host to view and choose a geofence. In some embodiments, the mobile app may access the guest's mobile device's location functions (e.g., GPS, cellular network triangulation) to determine the guest's location. In some embodiments the geofence is used as a prerequisite for applying a virtual key.

Other Automatic Keys

Other types of automatic keys may be implemented. In some embodiments, the host may provide a guest with a service phone number to call, upon which entering a unique PIN would automatically unlock the door. In some embodiments, the guest may talk to a call center for assistance. In some embodiments, the guest may speak into the lobby microphone and successfully unlock the door by saying the correct password set by the host. In these embodiments, speech recognition technology determines what the guest is saying. In some embodiments, the speech recognition is performed at the intercom station. In other embodiments, the speech recognition is performed in the cloud-computing service.

Third-Party Integration

In some embodiments, the intercom station supports integrations with various types of third-party services, including delivery providers, service providers, and short-term rental services (Airbnb). For example, suppose the intercom station is integrated with a food delivery service. When the user places an order from the food delivery service's mobile app or website, the intercom station automatically generates a virtual key or other automatic key (e.g., PIN, password) as described earlier in this disclosure. The delivery person would then be provided with the virtual key or other automatic key ("key") for automatic entry into the user's building. The key may be provided to the delivery person in several ways: via the delivery person's intercom system mobile app as a guest, via the food delivery service's app, via text message, or via e-mail. In some embodiments, the virtual key or other automatic key is valid only within a reasonable time frame for food delivery (e.g., within 30 minutes of the expected delivery time), which the user may set. In another example, suppose the intercom station is integrated with a short-term rental service, such as Airbnb. When a guest books the user's apartment unit from the short-term rental service's mobile app or website, the intercom station automatically generates a virtual key or other automatic key (e.g., PIN, password). The guest would then be provided with the virtual key or other automatic key ("key") for automatic entry into the user's building. In addition to the key being invalid outside of the reservation time as described earlier in this disclosure, the key may expire in a manner tied to activity via the short-term rental service, e.g., automatic key expiration upon the guest checking out of the short-term rental via that service's app.

In some embodiments, the intercom station may be integrated with an external video camera system near the lobby panel or elsewhere in the building. In some embodiments, the intercom station may be integrated with building management platforms, brokerage services, and/or leasing services.

Monitoring

In some embodiments, the intercom station monitors various features. For example, it monitors its own battery levels and communicates to the user if and when the battery levels are below a pre-determined threshold (e.g., energy remaining in the batteries is only 10% of the total capacity of the batteries). The user may view this information in a "device health" screen in the mobile app. The mobile app sends push notifications to the user when the battery has gone below a threshold (e.g., 25%) so that the user may proactively change or plan a change in the batteries. In some embodiments, low power mode is a default unless the intercom station is actively used, not merely when the batteries are low on remaining energy. In some embodiments, this is achieved in WGM160P via integrated "DTIM" modes.

The intercom station may monitor its Wi-Fi connectivity and communicate to the user if the connectivity is poor. Similarly in the "device health" screen in the mobile app, the user may view the strength of the Wi-Fi connection. The backend cloud-computing service (CCS), such as Amazon Web Services (AWS), sends push notifications to the user when the intercom station has gone off-line.

Figure 10E:
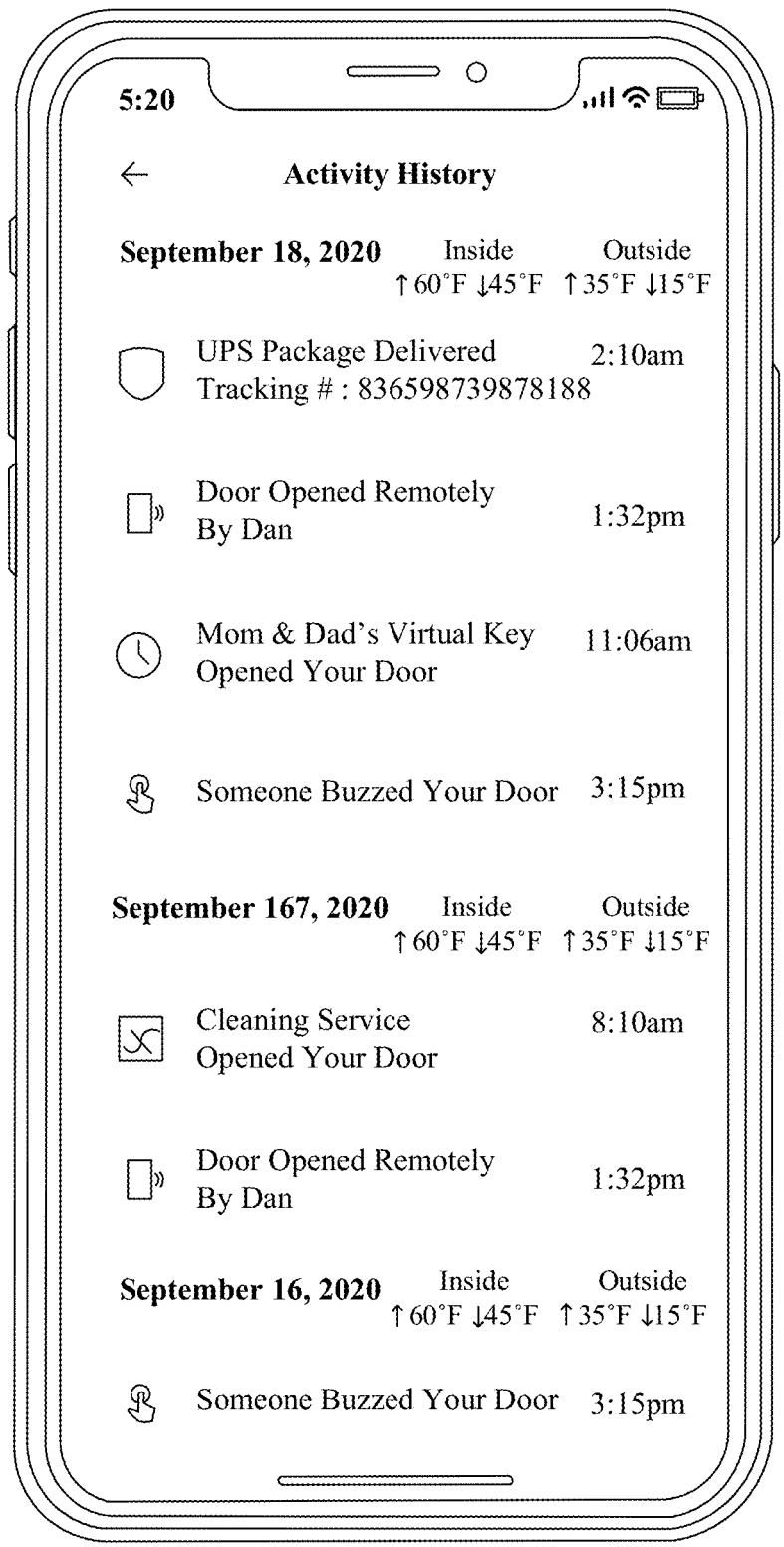
FIG. 10E shows an exemplary "activity history" screen of a GUI of an intercom station mobile app, in accordance with some embodiments of the invention.

The mobile app may monitor usage by maintaining records of who opened the door and when, allowing the user to see exactly when someone was in their building as a result of their intercom station, via a screen in the mobile app. FIG. 10E shows an exemplary "activity history" screen 1040 of a GUI of an intercom station mobile app, in accordance with some embodiments of the invention. One use case for this feature is for third-party verification. For example, suppose a delivery service receives a unique virtual key (perhaps via third-party integration as described above) to leave a package in the user's building. If the delivery service later claims that their delivery person had already delivered the package, the user would be able to verify whether that unique virtual key was activated as claimed. In some embodiments, the delivery service or delivery person would receive a confirmation notice (via, e.g., text message or e-mail) that the virtual key was successfully activated. This feature also provides security to the user and to the building by knowing who was in the building and when.

In some embodiments, the intercom station provides the user with living quality information through on-device passive sensors that permit the user to see, for instance, whether the temperature of the apartment unit is within a certain range (e.g. legal range based on street address), whether there is a gas leak or dangerous gases in the apartment unit (e.g. natural gas, carbon monoxide), whether there is unexpected movement within the apartment unit (especially useful for brokerage firms and property owners that maintain an unoccupied unit).

Management Dashboard

The backend cloud computing service supports a management dashboard for enterprise users by summarizing information on and providing various capabilities, including battery life and Wi-Fi status across multiple apartment units and buildings, user usage across multiple apartment units and buildings, easy-to-provision new devices for new tenants and for new apartments, onboarding and offboarding of tenants and roommates through fleet management.

In some embodiments, multiple users may be affiliated with one particular intercom station under an umbrella apartment account (e.g., members of a household). One roommate may be the administrator and may grant other roommates certain permissions (including administrator status) to use the intercom station with their mobile devices.

Software and Firmware

In some embodiments, all intercom station software and firmware are able to restore to a previous stable release through over-the-air downloads to allow the user to return to a previously working version due to either a failed update or an update that causes unanticipated failures or breaks. The user is able to perform in-field software and firmware updates through over-the-air downloads viewable in the mobile app. These updates would be downloaded from the AWS backend with staged releases if required due to the number of devices in the field. This allows the user to add additional features to their devices and install security patches as needed.

The intercom station is resistant to malicious interception of communications by using on board crypto-encryption. In some embodiments, this is natively supported by the Micrium OS and the WGM160P module, which offers end-to-end encryption when combined with the security provided by the AWS IoT backend. Furthermore, end-to-end encryption alleviates problems pertaining to ambient noise listening by the intercom that could lead to legal issues or customer concerns of the intercom stealing, recording, or transmitting unauthorized information via audio.

Intercom System in Action

Figure 11:
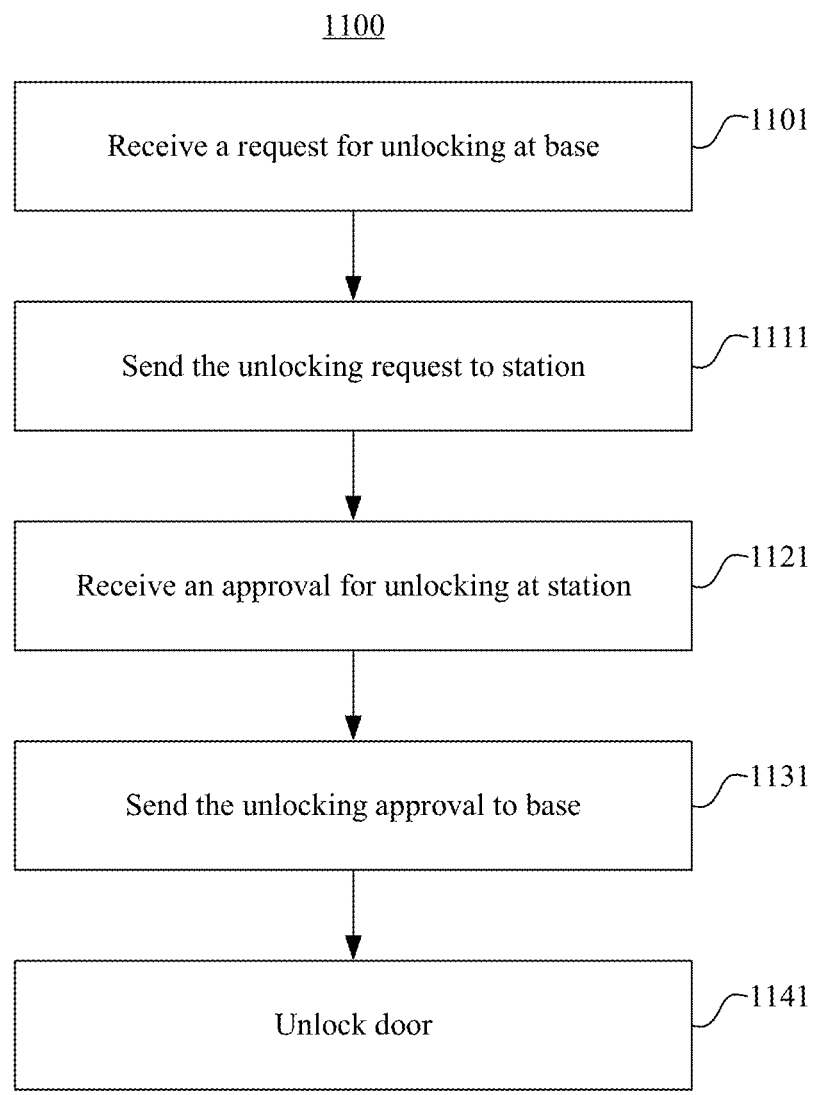
FIG. 11 shows an illustrative flow diagram for unlocking a door using an intercom system from a station, in accordance with one embodiment of the invention.

FIG. 11 shows an illustrative flow diagram 1100 for unlocking a door using an intercom system from a station, in accordance with one embodiment of the invention. Flow diagram 1100 begins at step 1101 by receiving a request for unlocking a door at a base. In some embodiments, this request is performed when a guest presses a button on a panel that corresponds to the apartment unit. In step 1111, the base sends the unlocking request to a station. In step 1121, the station receives an approval for unlocking the door. In step 1131, the station sends the unlocking approval to the base. In step 1141, the base unlocks the door.

Figure 12:
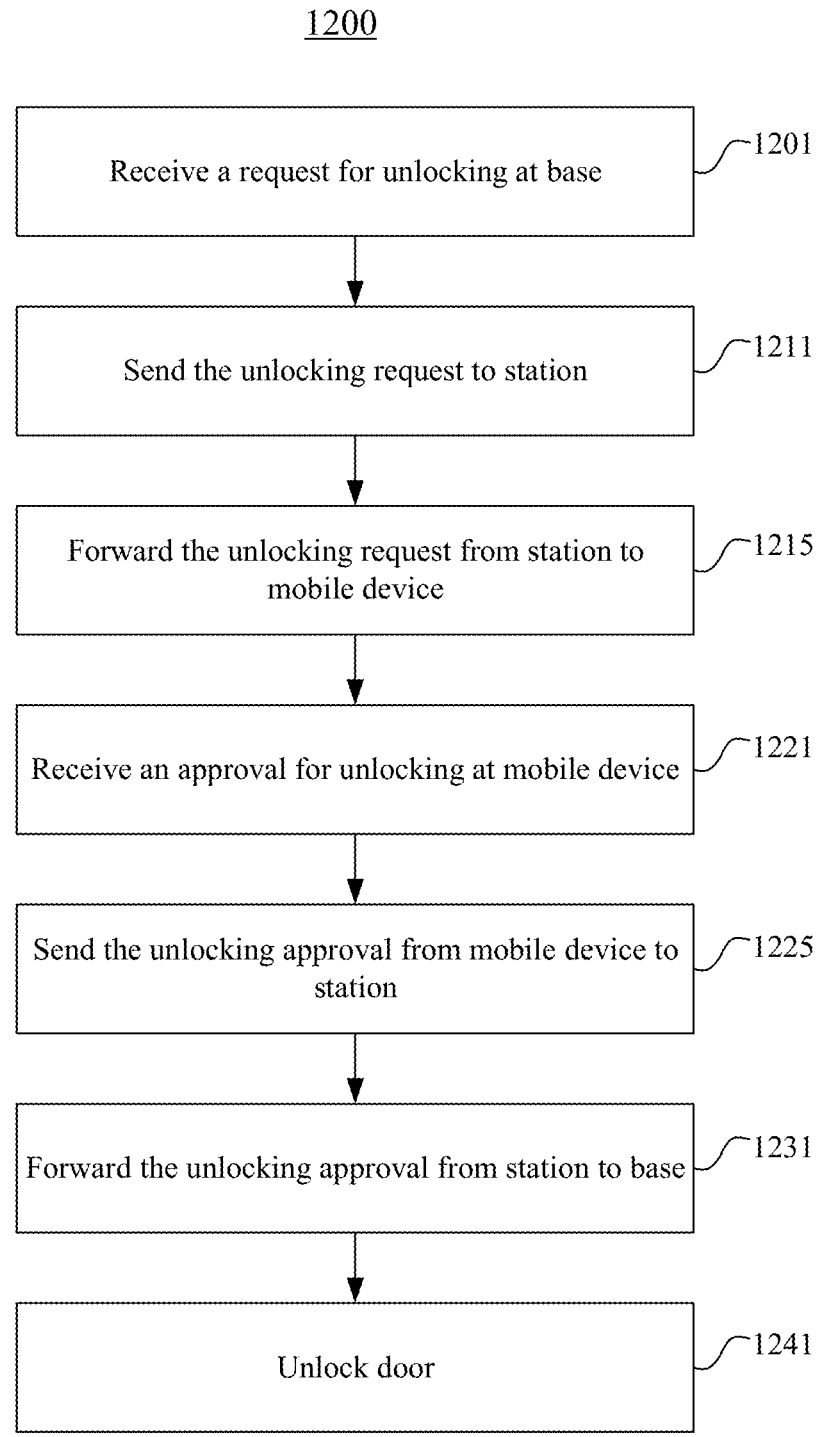
FIG. 12 shows an illustrative flow diagram for remotely unlocking a door using an intercom system, in accordance with one embodiment of the invention.

FIG. 12 shows an illustrative flow diagram 1200 for remotely unlocking a door using an intercom system, in accordance with one embodiment of the invention. Flow diagram 1200 begins at step 1201 by receiving a request for unlocking a door at a base. In some embodiments, this request is performed when a guest presses a button on a panel that corresponds to the apartment unit. In step 1211, the base sends the unlocking request to a station. In step 1215, the station forwards the unlocking request to a mobile device. In step 1221, the mobile device receives an approval for unlocking the door. In step 1225, the mobile device sends the unlocking approval to the station. In step 1231, the station forwards the unlocking approval to the base. In step 1241, the base unlocks the door.

Figure 13:
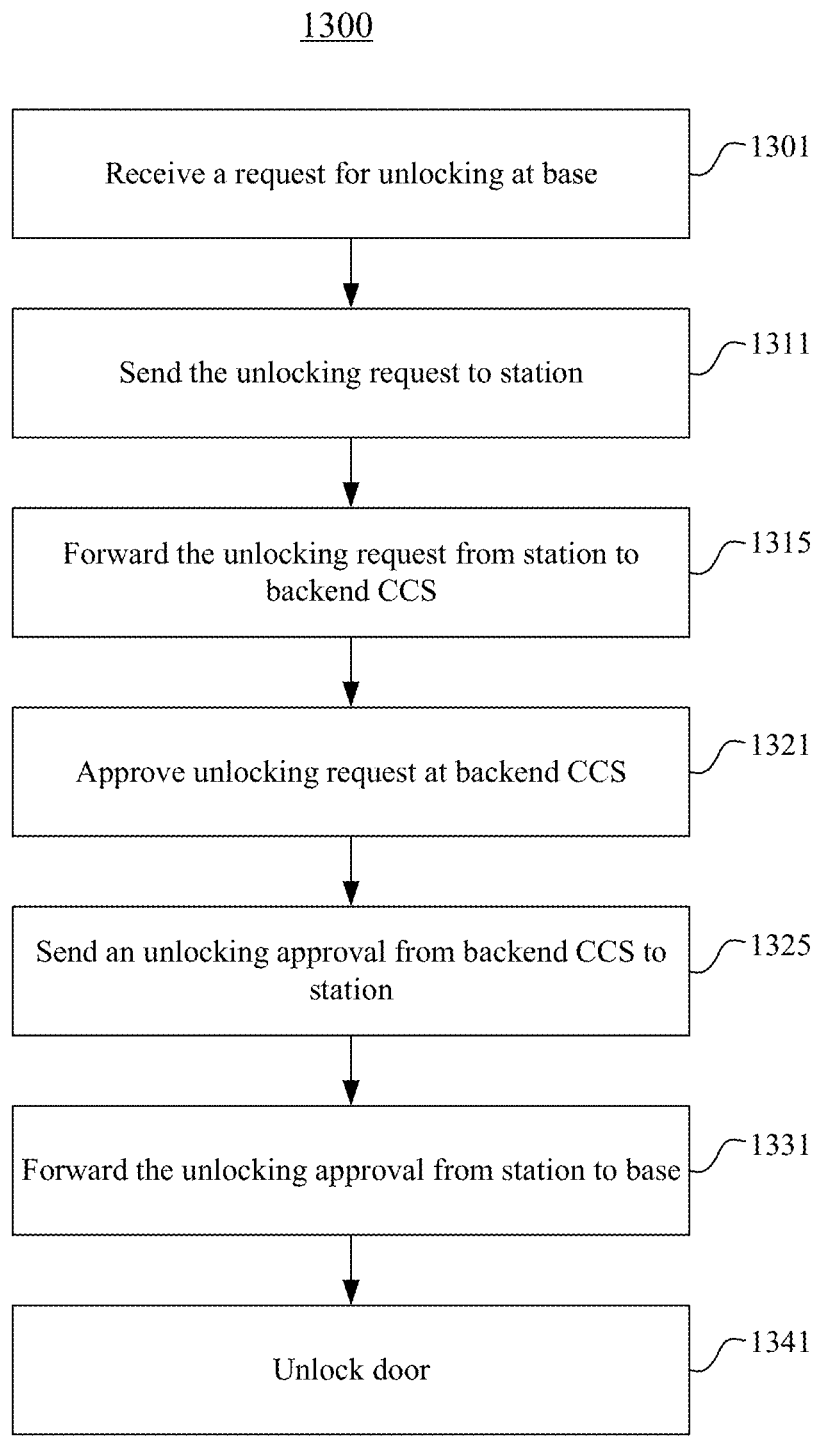
FIG. 13 shows an illustrative flow diagram for automatically unlocking a door using an intercom system, in accordance with one embodiment of the invention.

FIG. 13 shows an illustrative flow diagram 1300 for automatically unlocking a door using an intercom system, in accordance with one embodiment of the invention. Flow diagram 1300 begins at step 1301 by receiving a request for unlocking a door at a base. In some embodiments, this request is performed when a guest presses a button on a panel that corresponds to the apartment unit. In step 1311, the base sends the unlocking request to a station. In step 1315, the station forwards the unlocking request to a backend cloud-computing service (CCS). In step 1321, the backend cloud-computing service approves the unlocking of the door. In step 1325, the backend cloud-computing service sends an unlocking approval to the station. In step 1331, the station forwards the unlocking approval to the base. In step 1341, the base unlocks the door.

Figure 14:
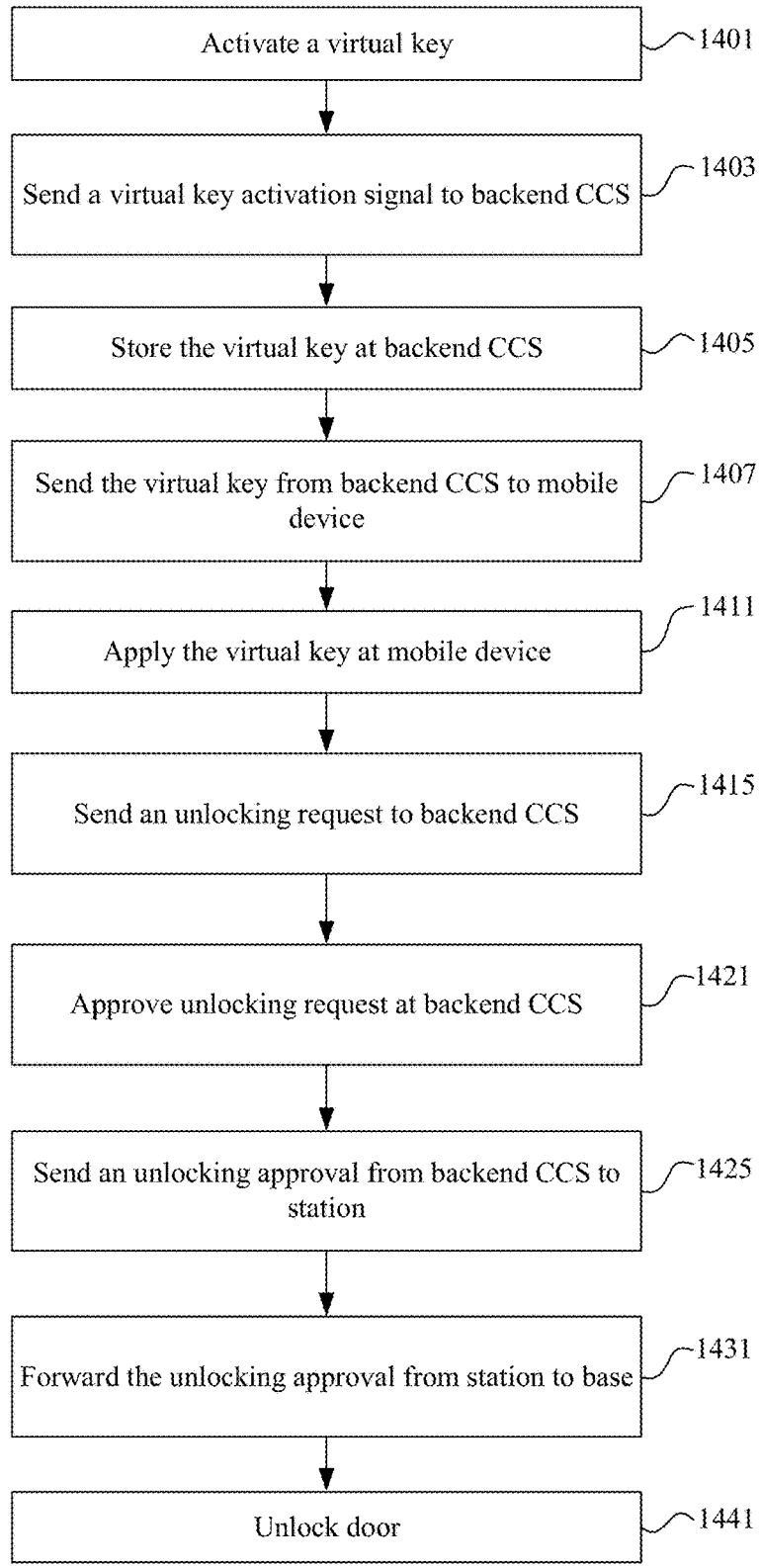
FIG. 14 shows an illustrative flow diagram for unlocking a door using an intercom system with a virtual key, in accordance with one embodiment of the invention.

FIG. 14 shows an illustrative flow diagram 1400 for unlocking a door using an intercom system with a virtual key, in accordance with one embodiment of the invention. Flow diagram 1400 begins at step 1401 by a host user activating a virtual key at the host user's mobile device. In some embodiments, this activation is performed when the host user enters in the mobile app on the host user's mobile device relevant information related to the virtual key, such as the name, e-mail address, and/or phone number of the intended guest; time periods when the virtual key is active; or the number of times the virtual key may be applied. When the user activates a virtual key, in step 1403, the mobile app sends a virtual key activation signal to the backend cloud-computing service (CCS). In step 1405, the virtual key is stored at the backend CCS. In step 1407, the backend CCS sends the virtual key to a guest's mobile device, where the virtual key becomes active for the guest's use. The virtual key may be sent to the guest's mobile device in various ways, such as via e-mail, text message, third-party messaging applications (e.g., WhatsApp), or third-party applications (e.g., the Airbnb message system). In step 1411, the guest applies the activated virtual key at the guest's mobile device. In some embodiments, this application is performed when the guest presses a virtual button on the guest's mobile device running a mobile app directed to a station. In other embodiments, this application is performed when the guest's mobile device running a mobile app directed to a station breaches a geofence. In other embodiments, this application is performed when the guest uses a telephone to call a service phone number and enter a unique PIN. In step 1415, the guest's mobile device sends an unlocking request to the backend cloud-computing service (CCS). In step 1421, the backend CCS approves the unlocking of the door. In step 1425, the backend CCS sends the unlocking approval to the station. In step 1431, the station forwards the unlocking approval to the base. In step 1441, the base unlocks the door.

Figure 15:
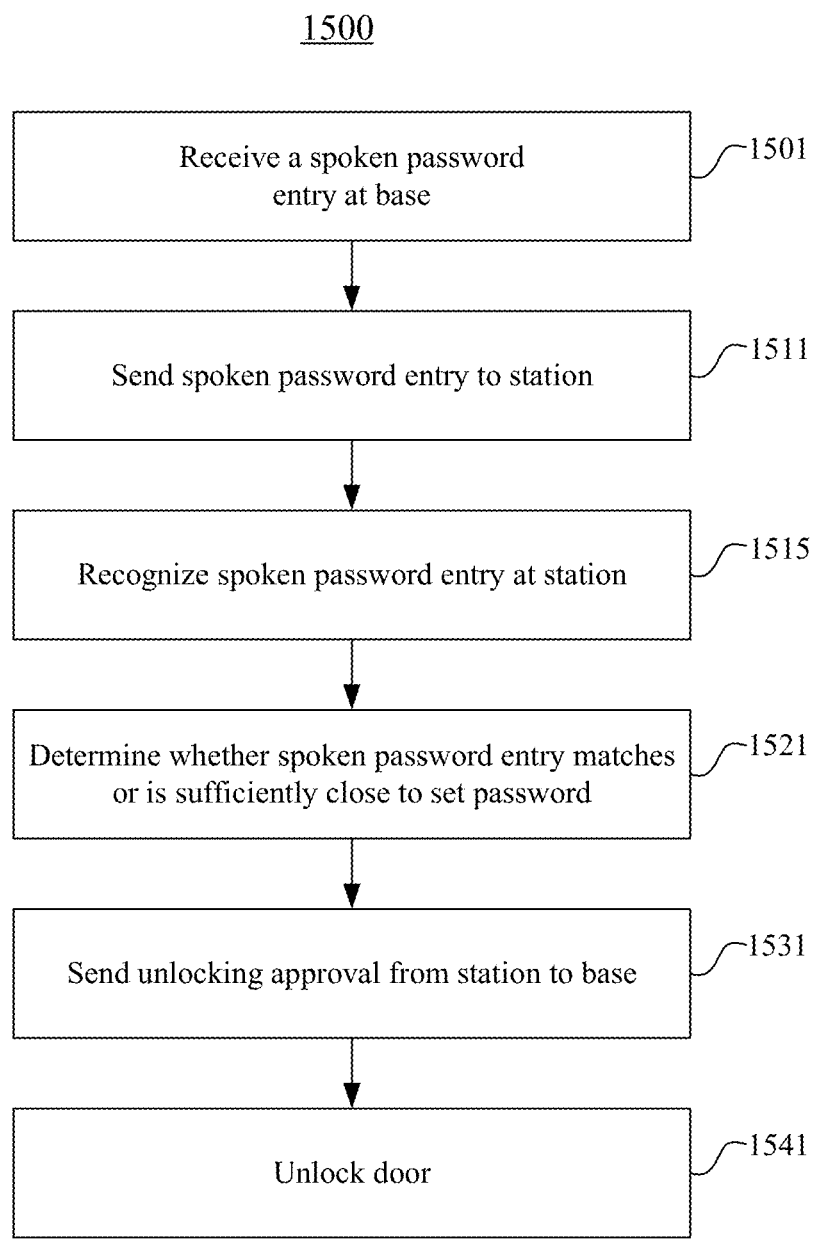
FIG. 15 shows an illustrative flow diagram for unlocking a door using an intercom system with a spoken password, in accordance with one embodiment of the invention.

FIG. 15 shows an illustrative flow diagram 1500 for unlocking a door using an intercom system with a spoken password, in accordance with one embodiment of the invention. Flow diagram 1500 begins at step 1501 by receiving a spoken password entry at a base. In some embodiments, this entry is performed when a guest presses a button on a panel that corresponds to the apartment unit and is prompted to speak a password into the microphone of the panel. In step 1511, the base sends the spoken password entry to a station. In step 1515, the station recognizes the spoken password entry. In some embodiments, this is performed by speech recognition technology. In step 1521, the station determines whether the spoken password entry matches or is sufficiently close to a set password. In step 1531, if the determination from step 1521 is yes, then the station sends an unlocking approval to the base. In step 1541, the base unlocks the door.

Exemplary System Architecture

An exemplary embodiment of the present disclosure may include one or more servers (management computing entities), one or more networks, and one or more clients (user computing entities). Each of these components, entities, devices, and systems (similar terms used herein interchangeably) may be in direct or indirect communication with, for example, one another over the same or different wired or wireless networks. Additionally, while FIGS. 16 and 17 illustrate the various system entities as separate, standalone entities, the various embodiments are not limited to this particular architecture.

Exemplary Management Computing Entity

Figure 16:
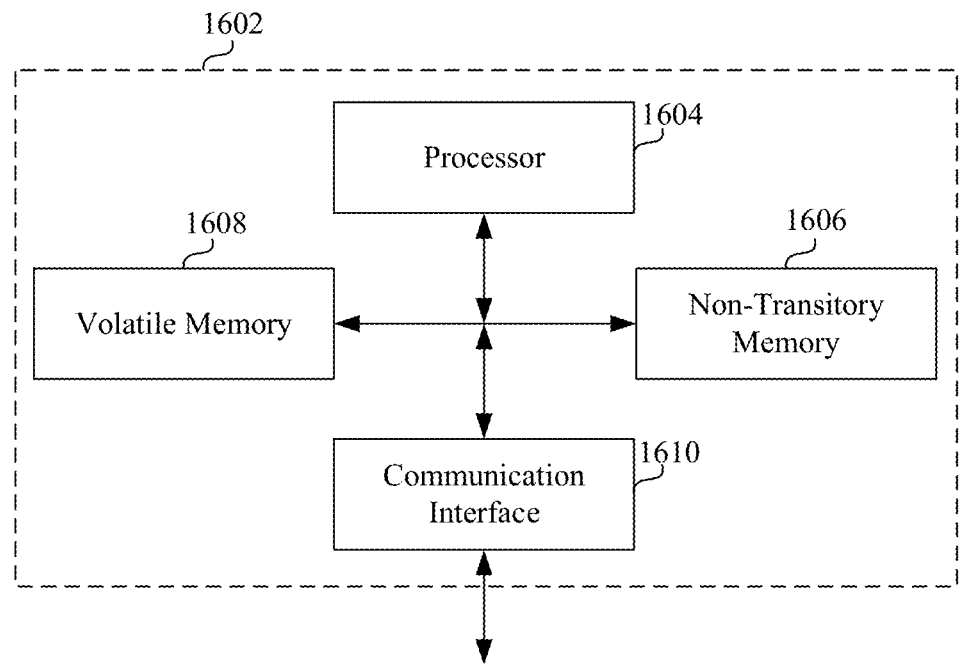
FIG. 16 provides a block diagram of a server (management computing entity) according to one embodiment of the present invention.
Figure 17:
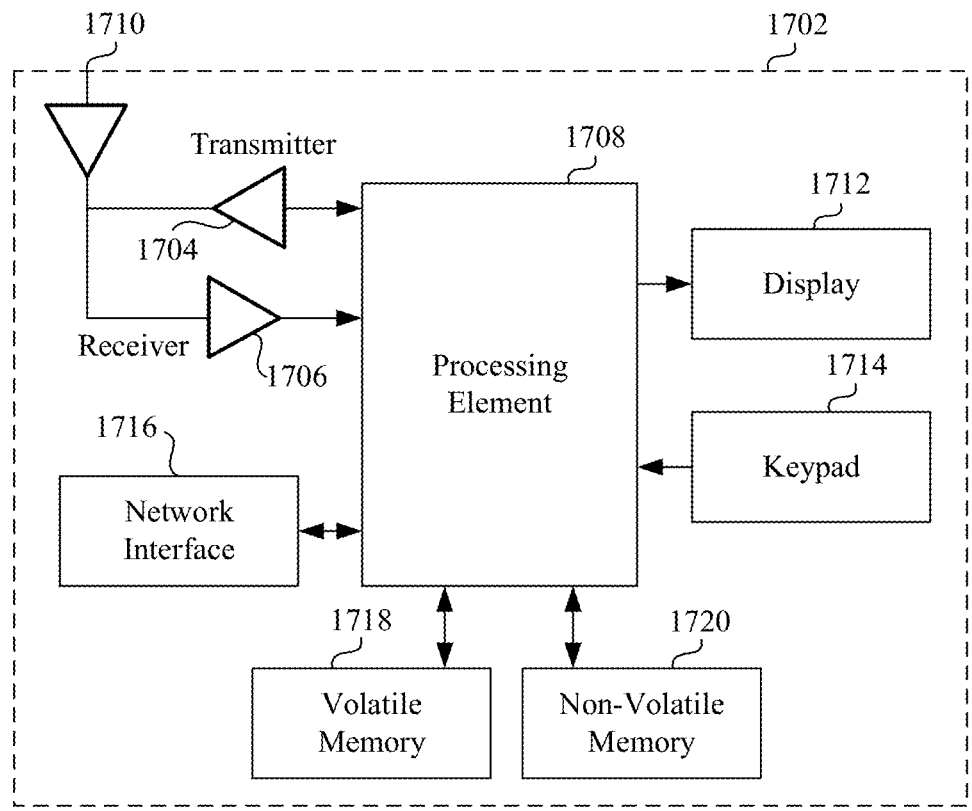
FIG. 17 provides an illustrative schematic representative of a client (user computing entity) that can be used in conjunction with embodiments of the present invention.

FIG. 16 provides a block diagram of a server (management computing entity) 1602 according to one embodiment of the present disclosure. In general, the terms computing entity, computer, entity, device, system, and/or similar words used herein interchangeably may refer to, for example, one or more computers, computing entities, desktop computers, mobile phones, tablets, phablets, notebooks, laptops, distributed systems, gaming consoles, watches, glasses, iBeacons, proximity beacons, key fobs, radio frequency identification (RFID) tags, earpieces, scanners, televisions, dongles, cameras, wristbands, wearable items/devices, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, and/or comparing (similar terms used herein interchangeably). In one embodiment, these functions, operations, and/or processes can be performed on data, content, and/or information (similar terms used herein interchangeably).

As indicated, in one embodiment, the management computing entity 1602 may also include one or more communications interfaces 1610 for communicating with various computing entities, such as by communicating data, content, and/or information (similar terms used herein interchangeably) that can be transmitted, received, operated on, processed, displayed, stored, and/or the like.

As shown in FIG. 16, in one embodiment, the management computing entity 1602 may include or be in communication with one or more processing elements 1604 (also referred to as processors and/or processing circuitry—similar terms used herein interchangeably) that communicate with other elements within the management computing entity 1602 via a bus, for example. As will be understood, the processing element 1604 may be embodied in a number of different ways. For example, the processing element 1604 may be embodied as one or more complex programmable logic devices (CPLDs), microprocessors, multi-core processors, coprocessing entities, application-specific instruction-set processors (ASIPs), microcontrollers, and/or controllers. Further, the processing element 1604 may be embodied as one or more other processing devices or circuitry. The term circuitry may refer to an entire hardware embodiment or a combination of hardware and computer program products. Thus, the processing element 1604 may be embodied as integrated circuits, application-specific integrated circuits (ASICs), field-programmable gate arrays (FPGAs), programmable logic arrays (PLAs), hardware accelerators, other circuitry, and/or the like. As will therefore be understood, the processing element 1604 may be configured for a particular use or configured to execute instructions stored in volatile or non-volatile media or otherwise accessible to the processing element 1604. As such, whether configured by hardware or computer program products, or by a combination thereof, the processing element 1604 may be capable of performing steps or operations according to embodiments of the present disclosure when configured accordingly.

In one embodiment, the management computing entity 1602 may further include or be in communication with non-volatile media (also referred to as non-volatile storage, memory, memory storage, and/or memory circuitry—similar terms used herein interchangeably). In one embodiment, the non-volatile storage or memory may include one or more non-volatile storage or memory media 1606, including but not limited to hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. As will be recognized, the non-volatile storage or memory media may store databases, database instances, database management systems, data, applications, programs, program modules, scripts, source code, object code, byte code, compiled code, interpreted code, machine code, executable instructions, and/or the like. The term database, database instance, and/or database management system (similar terms used herein interchangeably) may refer to a collection of records or data that is stored in a computer-readable storage medium using one or more database models, such as a hierarchical database model, network model, relational model, entity-relationship model, object model, document model, semantic model, graph model, and/or the like.

In one embodiment, the management computing entity 1602 may further include or be in communication with volatile media (also referred to as volatile storage, memory, memory storage, memory and/or circuitry—similar terms used herein interchangeably). In one embodiment, the volatile storage or memory may also include one or more volatile storage or memory media 1608, including but not limited to RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, the processing element 1604. Thus, the databases, database instances, database management systems, data, applications, programs, program modules, scripts, source code, object code, byte code, compiled code, interpreted code, machine code, executable instructions, and/or the like may be used to control certain aspects of the operation of the management computing entity 1602 with the assistance of the processing element 1604 and operating system.

As indicated, in one embodiment, the management computing entity 1602 may also include one or more communications interfaces 1610 for communicating with various computing entities, such as by communicating data, content, and/or information (similar terms used herein interchangeably) that can be transmitted, received, operated on, processed, displayed, stored, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the management computing entity (502) may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High-Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

Although not shown, the management computing entity 1602 may include or be in communication with one or more input elements, such as a keyboard input, a mouse input, a touch screen/display input, motion input, movement input, audio input, pointing device input, joystick input, keypad input, and/or the like. The management computing entity 1602 may also include or be in communication with one or more output elements (not shown), such as audio output, video output, screen/display output, motion output, movement output, and/or the like.

As will be appreciated, one or more of the components of the management computing entity 1602 may be located remotely from other management computing entity 1602 components, such as in a distributed system. Furthermore, one or more of the components may be combined and additional components performing functions described herein may be included in the management computing entity 1602. Thus, the management computing entity 1602 can be adapted to accommodate a variety of needs and circumstances. As will be recognized, these architectures and descriptions are provided for exemplary purposes only and are not limiting to the various embodiments.

Exemplary User Computing Entity

A user may be an individual, a company, an organization, an entity, a department within an organization, a representative of an organization and/or person, and/or the like. FIG. 17 provides an illustrative schematic representative of a client (user computing entity) 1702 that can be used in conjunction with embodiments of the present disclosure. In general, the terms device, system, computing entity, entity, and/or similar words used herein interchangeably may refer to, for example, one or more computers, computing entities, desktops, mobile phones, tablets, phablets, notebooks, laptops, distributed systems, gaming consoles, watches, glasses, key fobs, radio frequency identification (RFID) tags, earpieces, scanners, cameras, wristbands, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. User computing entities 1702 can be operated by various parties. As shown in FIG. 17, the user computing entity 1702 can include an antenna 1710, a transmitter 1704 (e.g., radio), a receiver 1706 (e.g., radio), and a processing element 1708 (e.g., CPLDs, microprocessors, multi-core processors, coprocessing entities, ASIPs, microcontrollers, and/or controllers) that provides signals to and receives signals from the transmitter 1704 and receiver 1706, respectively.

The signals provided to and received from the transmitter 1704 and the receiver 1706, respectively, may include signaling information in accordance with air interface standards of applicable wireless systems. In this regard, the user computing entity 1702 may be capable of operating with one or more air interface standards, communication protocols, modulation types, and access types. More particularly, the user computing entity 1702 may operate in accordance with any of a number of wireless communication standards and protocols, such as those described above with regard to the management computing entity 1602. In a particular embodiment, the user computing entity 1702 may operate in accordance with multiple wireless communication standards and protocols, such as UMTS, CDMA2000, 1×RTT, WCDMA, TD-SCDMA, LTE, E-UTRAN, EVDO, HSPA, HSDPA, Wi-Fi, Wi-Fi Direct, WiMAX, UWB, IR, NFC, Bluetooth, USB, and/or the like. Similarly, the user computing entity 1702 may operate in accordance with multiple wired communication standards and protocols, such as those described above with regard to the management computing entity 1602 via a network interface 1716.

Via these communication standards and protocols, the user computing entity 1702 can communicate with various other entities using concepts such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). The user computing entity 1702 can also download changes, add-ons, and updates, for instance, to its firmware, software (e.g., including executable instructions, applications, program modules), and operating system.

According to one embodiment, the user computing entity 1702 may include location determining aspects, devices, modules, functionalities, and/or similar words used herein interchangeably. For example, the user computing entity 1702 may include outdoor positioning aspects, such as a location module adapted to acquire, for example, latitude, longitude, altitude, geocode, course, direction, heading, speed, universal time (UTC), date, and/or various other information/data. In one embodiment, the location module can acquire data, sometimes known as ephemeris data, by identifying the number of satellites in view and the relative positions of those satellites. The satellites may be a variety of different satellites, including Low Earth Orbit (LEO) satellite systems, Department of Defense (DOD) satellite systems, the European Union Galileo positioning systems, the Chinese Compass navigation systems, Indian Regional Navigational satellite systems, and/or the like. Alternatively, the location information can be determined by triangulating the user computing entity's 1702 position in connection with a variety of other systems, including cellular towers, Wi-Fi access points, and/or the like. Similarly, the user computing entity 1702 may include indoor positioning aspects, such as a location module adapted to acquire, for example, latitude, longitude, altitude, geocode, course, direction, heading, speed, time, date, and/or various other information/data. Some of the indoor systems may use various position or location technologies including RFID tags, indoor beacons or transmitters, Wi-Fi access points, cellular towers, nearby computing devices (e.g., smartphones, laptops), and/or the like. For instance, such technologies may include the iBeacons, Gimbal proximity beacons, Bluetooth Low Energy (BLE) transmitters, NFC transmitters, and/or the like. These indoor positioning aspects can be used in a variety of settings to determine the location of someone or something to within inches or centimeters.

The user computing entity 1702 may also comprise a user interface (that can include a display 1712 coupled to a processing element 1708 and/or a user input interface (coupled to a processing element 1708. For example, the user interface may be a user application, browser, user interface, and/or similar words used herein interchangeably executing on and/or accessible via the user computing entity 1702 to interact with and/or cause display of information from the management computing entity 1602, as described herein. The user input interface can comprise any of a number of devices or interfaces allowing the user computing entity 1702 to receive data, such as a keypad 1714 (hard or soft), a touch display 1712, voice/speech or motion interfaces, or other input device. In embodiments including a keypad 1714, the keypad 1714) can include (or cause display of) the conventional numeric (0-9) and related keys (#, *), and other keys used for operating the user computing entity 1702) and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The user computing entity 1702 can also include volatile storage or memory 1718 and/or non-volatile storage or memory 1720, which can be embedded and/or may be removable. For example, the non-volatile memory may be ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The volatile and non-volatile storage or memory can store databases, database instances, database management systems, data, applications, programs, program modules, scripts, source code, object code, byte code, compiled code, interpreted code, machine code, executable instructions, and/or the like to implement the functions of the user computing entity 1702. As indicated, this may include a user application that is resident on the entity or accessible through a browser or other user interface for communicating with the management computing entity 1602 and/or various other computing entities.

In another embodiment, the user computing entity 1702 may include one or more components or functionality that are the same or similar to those of the management computing entity 1602, as described in greater detail above. As will be recognized, these architectures and descriptions are provided for exemplary purposes only and are not limiting to the various embodiments.

Figure 18:
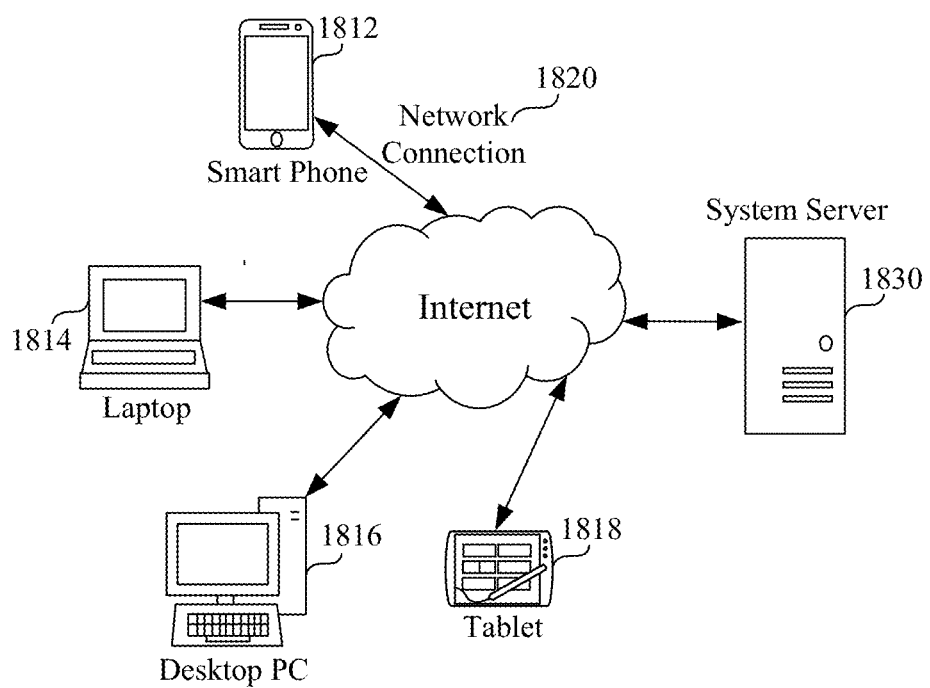
FIG. 18 shows an illustrative system architecture diagram for implementing one embodiment of the present invention in a client-server environment.

The present invention may be implemented in a client server environment. FIG. 18 shows an illustrative system architecture for implementing one embodiment of the present invention in a client server environment. User devices (i.e., image-capturing device) 1810 on the client side may include smart phones 1812, laptops 1814, desktop PCs 1816, tablets 1818, or other devices. Such user devices 1810 access the service of the system server 1830 through some network connection 1820, such as the Internet.

In some embodiments of the present invention, the entire system can be implemented and offered to the end-users and operators over the Internet, in a so-called cloud implementation. No local installation of software or hardware would be needed, and the end-users and operators would be allowed access to the systems of the present invention directly over the Internet, using either a web browser or similar software on a client, which client could be a desktop, laptop, mobile device, and so on. This eliminates any need for custom software installation on the client side and increases the flexibility of delivery of the service (software-as-a-service) and increases user satisfaction and ease of use. Various business models, revenue models, and delivery mechanisms for the present invention are envisioned, and are all to be considered within the scope of the present invention.

CONCLUSIONS

One of ordinary skill in the art knows that the use cases, structures, schematics, and flow diagrams may be performed in other orders or combinations, but the inventive concept of the present invention remains without departing from the broader scope of the invention. Every embodiment may be unique, and methods/steps may be either shortened or lengthened, overlapped with the other activities, postponed, delayed, and continued after a time gap to practice the methods of the present invention.

Although the present invention has been described with reference to specific exemplary embodiments, it will be evident that the various modifications and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention.

What is claimed is:

1. An intercom station apparatus for connection to a legacy intercom system, comprising:
   a station audio emission subsystem configured to emit a first audio signal;
   a station audio reception subsystem configured to receive a second audio signal;
   a talk feature configured to activate the station audio reception subsystem and a legacy base speaker;
   a listen feature configured to activate a legacy base microphone and the station audio emission subsystem;
   a wiring interface for the legacy intercom system;
   a processor configured to interact with and control the station audio emission subsystem and the station audio reception subsystem; and
   an audio input-output circuit configured to process audio signals, comprising:
       a line input buffer configured to process audio signals from the legacy base microphone through the wiring interface for the legacy intercom system to the processor, comprising:
           a first electrostatic discharge and transient protection subcircuit configured to receive a first input signal from the wiring interface for a legacy intercom system;

a first galvanic isolator and voltage scaler subcircuit; and a first voltage buffer coupled to the first galvanic isolator and voltage scaler subcircuit, wherein the first voltage buffer is configured to transmit a first output signal to the processor; and a line output driver configured to process audio signals from the processor to the legacy base speaker through the wiring interface for the legacy intercom system, comprising:

a second voltage buffer configured to receive a second input signal from the processor;

a high-pass filter coupled to the second voltage buffer;

a second galvanic isolator and voltage scaler subcircuit coupled to the high-pass filter; and a second electrostatic discharge and transient protection subcircuit coupled to the second galvanic isolator and voltage scaler subcircuit and configured to transmit a second output signal to the wiring interface for the legacy intercom system.

2. The intercom station apparatus of claim 1, wherein the station audio emission subsystem is a station speaker, wherein the first audio signal is sound, wherein the station audio reception subsystem is a station microphone, and wherein the second audio signal is sound.

3. The intercom station apparatus of claim 1, wherein the first voltage buffer is a first operational amplifier, and wherein the second voltage buffer is a second operational amplifier.

4. The intercom station apparatus of claim 1, wherein the first electrostatic discharge and transient protection subcircuit comprises a first electrostatic discharge resistor and a first transient-voltage-suppression diode, and wherein the second electrostatic discharge and transient protection subcircuit comprises a second electrostatic discharge resistor and a second transient-voltage-suppression diode.

5. The intercom station apparatus of claim 1, wherein the first galvanic isolator and voltage scaler subcircuit comprises a first transformer, and wherein the second galvanic isolator and voltage scaler subcircuit comprises a second transformer.

6. The intercom station apparatus of claim 5, wherein the first transformer is 1:1.

7. The intercom station apparatus of claim 5, wherein the second transformer is 1:1.

8. The intercom station apparatus of claim 5, wherein the first galvanic isolator and voltage scaler subcircuit further comprises a first voltage scaler coupled to the first transformer, and wherein the second galvanic isolator and voltage scaler subcircuit further comprises a second voltage scaler coupled to the second transformer.

9. The intercom station apparatus of claim 8, wherein the first voltage scaler comprises:

a first voltage divider coupled to the first transformer, and a second voltage divider coupled to the first voltage divider; and wherein the second voltage scaler comprises a third voltage divider.

10. The intercom station apparatus of claim 9, wherein the first voltage divider comprises a plurality of resistors, and wherein the first voltage divider generates a ratio of approximately 50%.

11. The intercom station apparatus of claim 9, wherein the second voltage divider comprises a plurality of resistors.

12. The intercom station apparatus of claim 9, wherein the second voltage divider biases a signal to around half of a supply voltage.

13. The intercom station apparatus of claim 9, wherein the third voltage divider comprises a plurality of resistors, and wherein the third voltage divider generates a ratio of approximately 4.5%.

14. The intercom station apparatus of claim 5, wherein the high-pass filter comprises a capacitor with a capacitance based on an impedance of the second transformer.

15. The intercom station apparatus of claim 5, wherein the second transformer comprises a plurality of windings, and wherein a DC resistance of each winding of the plurality of windings of the second transformer is greater than a resistance of a legacy station speaker.

16. The intercom station apparatus of claim 5, wherein the second transformer supports a signal range of 200 Hz to 4,000 Hz.

17. The intercom station apparatus of claim 1, wherein the line input buffer further comprises a voltage-limiting subcircuit coupled to the first voltage buffer, wherein the voltage-limiting subcircuit limits an input to the first voltage buffer to within a predefined threshold.

18. The intercom station apparatus of claim 17, wherein the voltage-limiting subcircuit comprises a Schottky barrier diode.

19. The intercom station apparatus of claim 1, wherein the intercom station apparatus is configured to interact with a base and a backend cloud-computing service (CCS).

20. An intercom station apparatus for connection to a legacy intercom system, comprising:

a station audio emission subsystem configured to emit a first audio signal;

a station audio reception subsystem configured to receive a second audio signal;

a talk feature configured to activate the station audio reception subsystem and a legacy base speaker;

a listen feature configured to activate a legacy base microphone and the audio emission subsystem;

a wiring interface for the legacy intercom system;

a processor configured to interact with and control the station audio emission subsystem and the station audio reception subsystem; and an audio input-output circuit configured to process audio signals, comprising:

a line input buffer configured to process audio signals from the legacy base microphone through the wiring interface for the legacy intercom system to the processor, comprising:

a first galvanic isolator and voltage scaler subcircuit configured to receive a first input signal from the wiring interface for a legacy intercom system; and a first voltage buffer coupled to the first galvanic isolator and voltage scaler subcircuit, wherein the first voltage buffer is configured to transmit a first output signal to the processor; and a line output driver configured to process audio signals from the processor to the legacy base speaker through the wiring interface for the legacy intercom system, comprising:

a second voltage buffer configured to receive a second input signal from the processor;
a high-pass filter coupled to the second voltage buffer; and
a second galvanic isolator and voltage scaler subcircuit coupled to the high-pass filter and configured to transmit a second output signal to the wiring interface for the legacy intercom system.

* * * * *